(12) United States Patent
Kimura

(10) Patent No.: US 8,717,261 B2
(45) Date of Patent: *May 6, 2014

(54) SEMICONDUCTOR DEVICE, DISPLAY DEVICE, AND ELECTRONIC DEVICE

(75) Inventor: Hajime Kimura, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/604,750

(22) Filed: Sep. 6, 2012

(65) Prior Publication Data

US 2012/0327142 A1 Dec. 27, 2012

Related U.S. Application Data

(60) Division of application No. 12/713,391, filed on Feb. 26, 2010, now Pat. No. 8,264,430, which is a continuation of application No. 11/563,880, filed on Nov. 28, 2006, now Pat. No. 7,671,826.

(30) Foreign Application Priority Data

Dec. 2, 2005 (JP) .................................. 2005-349780

(51) Int. Cl.
G09G 3/30 (2006.01)
(52) U.S. Cl.
USPC ........................... 345/76; 345/690; 315/169.3
(58) Field of Classification Search
USPC .................................................. 345/76–81
See application file for complete search history.

(56) References Cited

U.S. PATENT DOCUMENTS

| 5,684,365 | A | 11/1997 | Tang et al. |
| 5,956,011 | A | 9/1999 | Koyama et al. |
| 6,037,924 | A | 3/2000 | Koyama et al. |
| 6,310,598 | B1 | 10/2001 | Koyama et al. |
| 6,608,613 | B2 | 8/2003 | Koyama et al. |

(Continued)

FOREIGN PATENT DOCUMENTS

| CN | 1472721 A | 2/2004 |
| CN | 1542722 A | 11/2004 |

(Continued)

OTHER PUBLICATIONS

J.H. Jung et al.; "49.1: A 14.1 inch Full Color AMOLED Display with Top Emission Structure and a-Si TFT Backplane"; SID Digest '05: SID International Symposium Digest of Technical Papers; pp. 1538-1541; 2005.

(Continued)

Primary Examiner — Duc Dinh
(74) Attorney, Agent, or Firm — Fish & Richardson P.C.

(57) ABSTRACT

A display device includes a load, a transistor for controlling a current value supplied to the load, a capacitor, a first wiring, a second wiring, and first to fourth switches. Variations in the current value caused by variations in the threshold voltage of the transistor can be suppressed through the steps of: (1) holding the threshold voltage of the transistor in the storage capacitor, (2) inputting a potential in accordance with a video signal, and (3) holding a voltage that is the sum of the threshold voltage and the potential in accordance with the video signal, in the storage capacitor. Accordingly, a desired current can be supplied to the load such as a light emitting element.

41 Claims, 49 Drawing Sheets

(56) References Cited

U.S. PATENT DOCUMENTS

| | | |
|---|---|---|
| 6,611,107 B2 | 8/2003 | Mikami et al. |
| 6,737,813 B2 | 5/2004 | Kawasaki et al. |
| 6,791,129 B2 | 9/2004 | Inukai |
| 6,897,482 B2 | 5/2005 | Morita et al. |
| 6,995,520 B2 | 2/2006 | Inukai |
| 7,129,917 B2 | 10/2006 | Yamazaki et al. |
| 7,148,884 B2 | 12/2006 | Kasai |
| 7,173,590 B2 * | 2/2007 | Uchino et al. .................. 345/92 |
| 7,205,965 B2 | 4/2007 | Mikami et al. |
| 7,242,376 B2 | 7/2007 | Yamashita et al. |
| 7,274,345 B2 | 9/2007 | Imamura et al. |
| 7,319,443 B2 | 1/2008 | Kimura et al. |
| 7,327,357 B2 | 2/2008 | Jeong |
| 7,382,342 B2 | 6/2008 | Uchino et al. |
| 7,443,367 B2 | 10/2008 | Numao |
| 7,502,001 B2 | 3/2009 | Fish |
| 7,714,813 B2 | 5/2010 | Uchino et al. |
| 7,843,408 B2 | 11/2010 | Yamazaki |
| 8,077,266 B2 | 12/2011 | Nakamura et al. |
| 8,242,988 B2 | 8/2012 | Yamazaki |
| 8,570,256 B2 | 10/2013 | Yamazaki |
| 2003/0090481 A1 | 5/2003 | Kimura |
| 2003/0117352 A1 | 6/2003 | Kimura |
| 2003/0132931 A1 | 7/2003 | Kimura et al. |
| 2003/0137503 A1 | 7/2003 | Kimura et al. |
| 2004/0080474 A1 | 4/2004 | Kimura |
| 2004/0150351 A1 * | 8/2004 | Komiya et al. ............ 315/169.3 |
| 2004/0174349 A1 | 9/2004 | Libsch et al. |
| 2004/0174354 A1 | 9/2004 | Ono et al. |
| 2005/0007316 A1 | 1/2005 | Akimoto et al. |
| 2006/0170628 A1 | 8/2006 | Yamashita et al. |
| 2007/0279403 A1 | 12/2007 | Uchino et al. |
| 2007/0296652 A1 | 12/2007 | Imamura et al. |
| 2010/0073267 A1 | 3/2010 | Akimoto et al. |
| 2011/0063275 A1 | 3/2011 | Imamura et al. |

FOREIGN PATENT DOCUMENTS

| | | |
|---|---|---|
| CN | 1573886 A | 2/2005 |
| CN | 1679071 A | 10/2005 |
| EP | 0717446 A2 | 6/1996 |
| EP | 1 150 273 A2 | 10/2001 |
| EP | 1 326 281 A1 | 7/2003 |
| EP | 1 646 032 A1 | 4/2006 |
| EP | 2 372 684 A2 | 10/2011 |
| JP | 03-233431 A | 10/1991 |
| JP | 8234683 A | 9/1996 |
| JP | 2002-023697 A | 1/2002 |
| JP | 2002-190605 A | 7/2002 |
| JP | 2003-186438 A | 7/2003 |
| JP | 2004-280059 A | 10/2004 |
| JP | 2004-295131 A | 10/2004 |
| JP | 2004-361424 A | 12/2004 |
| JP | 2005-004173 A | 1/2005 |
| JP | 2005-084416 A | 3/2005 |
| JP | 2005-164894 A | 6/2005 |
| JP | 2005-189643 A | 7/2005 |
| JP | 2005-195756 A | 7/2005 |
| JP | 2005-345722 A | 12/2005 |
| JP | 2005-345723 A | 12/2005 |
| JP | 2006-113586 A | 4/2006 |
| JP | 2006-215213 A | 8/2006 |
| JP | 2006-215275 A | 8/2006 |
| JP | 2006-227237 A | 8/2006 |
| JP | 2006-227238 A | 8/2006 |
| JP | 2006-227239 A | 8/2006 |
| JP | 2006-243525 A | 9/2006 |
| JP | 2006-243526 A | 9/2006 |
| JP | 2006-251631 A | 9/2006 |
| KR | 2004-0098511 A | 11/2004 |
| KR | 2004-0100887 A | 12/2004 |
| KR | 2005-0107517 A | 11/2005 |
| WO | 2004/021326 A1 | 3/2004 |
| WO | WO2004-084168 A1 | 9/2004 |

OTHER PUBLICATIONS

PCT International Search Report (Application No. PCT/JP2006/323632) mailed Feb. 27, 2007, 2 pages.
PCT Written Opinion (Application No. PCT/JP2006/323632) mailed Feb. 27, 2007, 4 pages.
Chinese Office Action (Application No. 201110117493.3) Dated Feb. 29, 2012, with Full English Translation.
Office Action, Chinese Application No. 201110117413.4, dated Oct. 16, 2012, 7 pages, with full English translation.
Korean Office Action (KR Application No. 2008-7016133) dated May 22, 2013 with English translation, 7 pages.
Korean Office Action (KR Application No. 2011-7027681) dated May 22, 2013 with English translation, 6 pages.
Korean Office Action (KR Application No. 2011-7027682) dated May 22, 2013 with English translation, 7 pages.
Korean Office Action (KR Application No. 2011-7027683) dated May 22, 2013 with English translation, 7 pages.

* cited by examiner

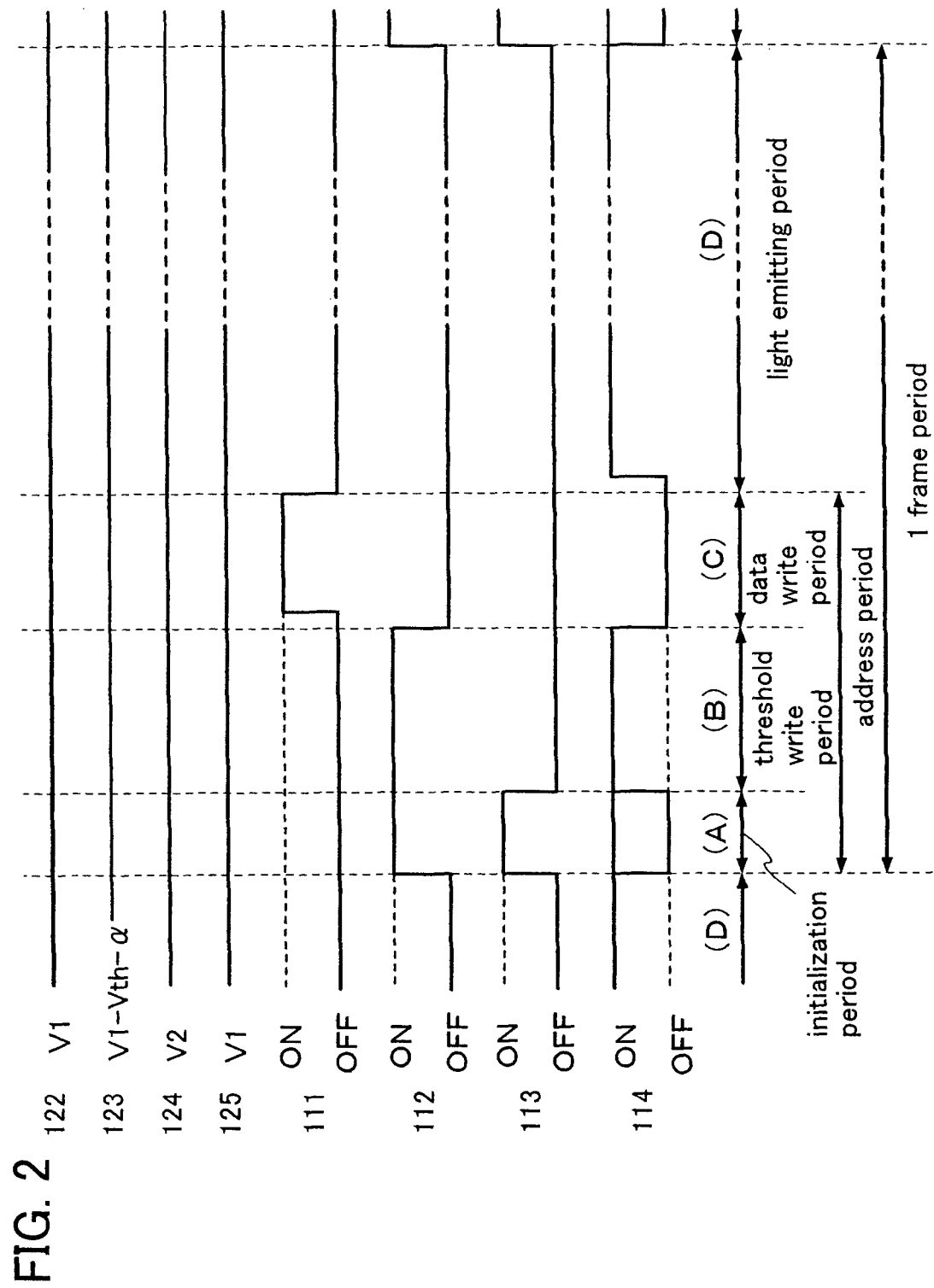

initialization period threshold write period data write period light emitting period FIG. 16A
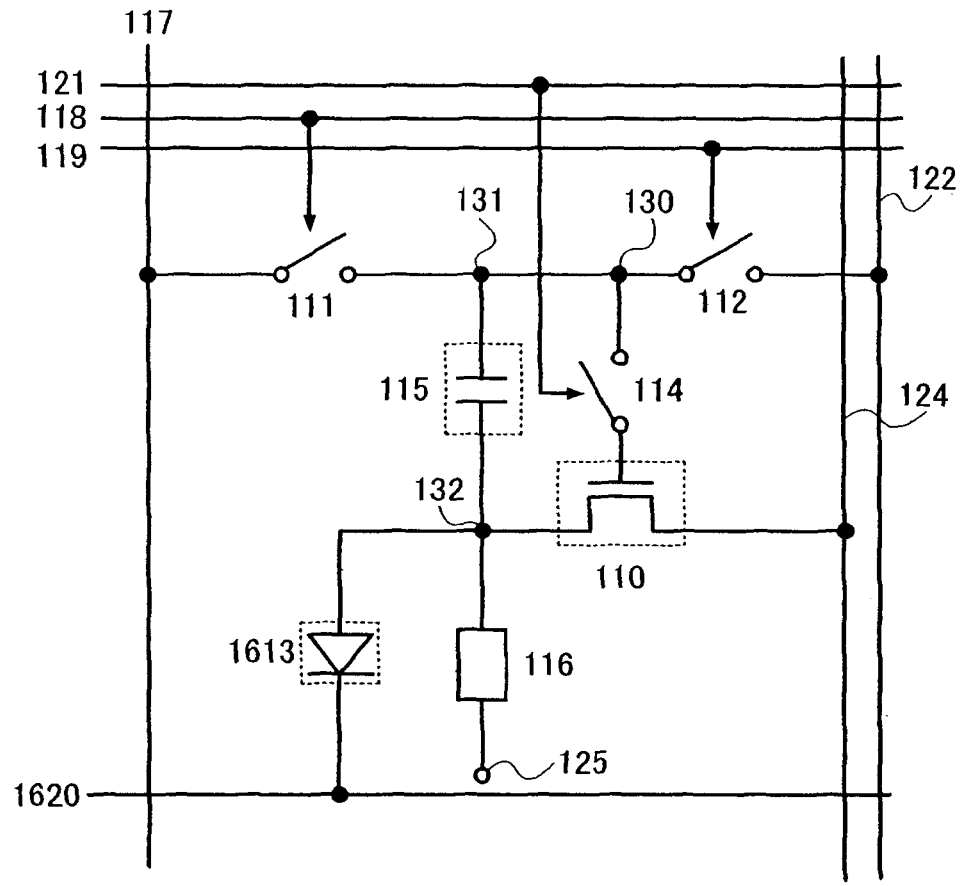
FIG. 16B
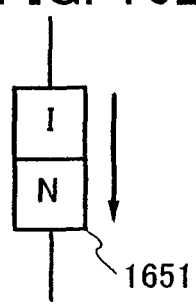
FIG. 16C
FIG. 16D
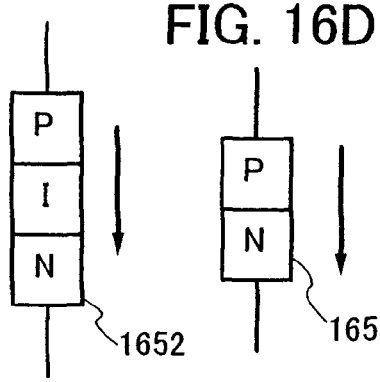
FIG. 16E
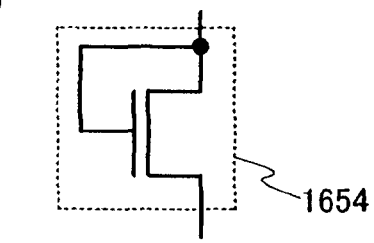
FIG. 16F
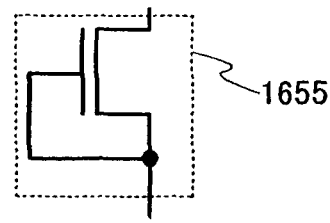

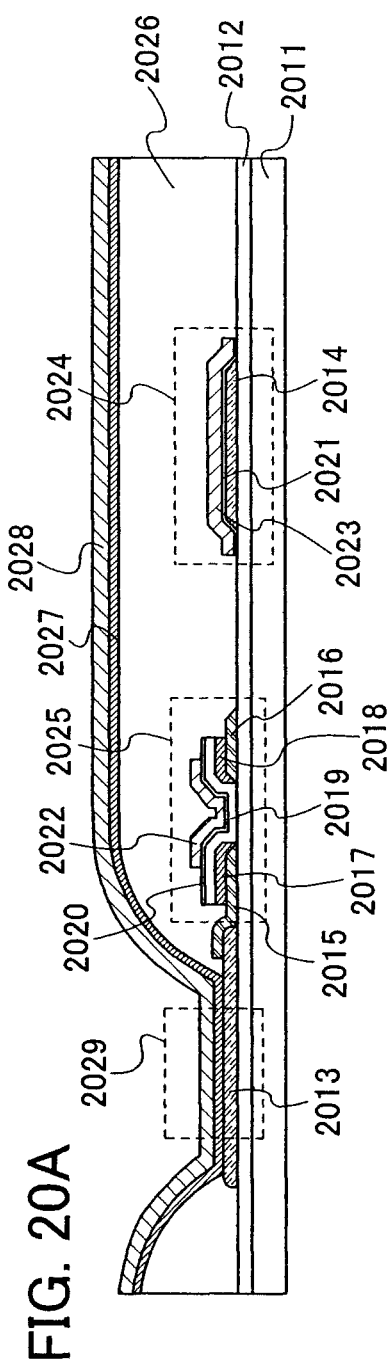
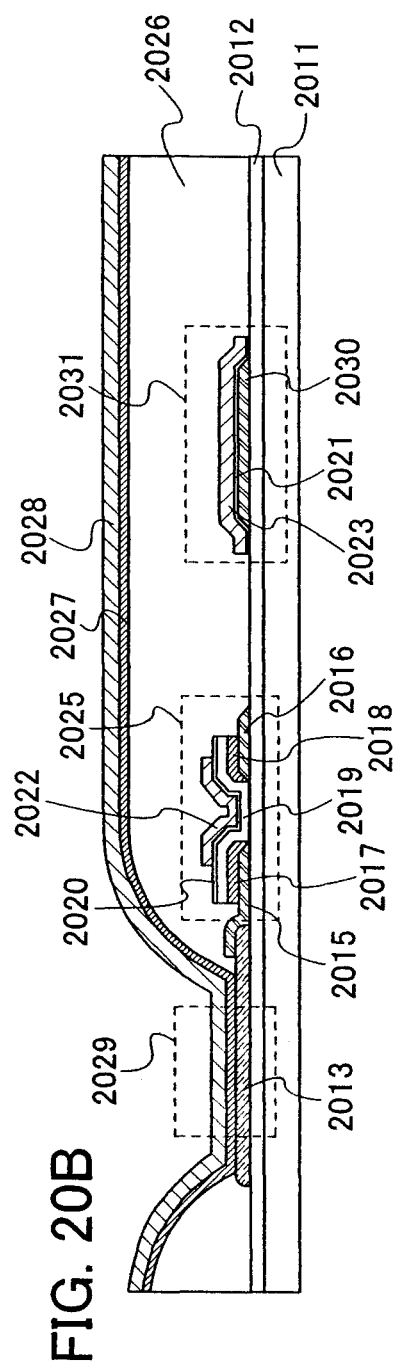

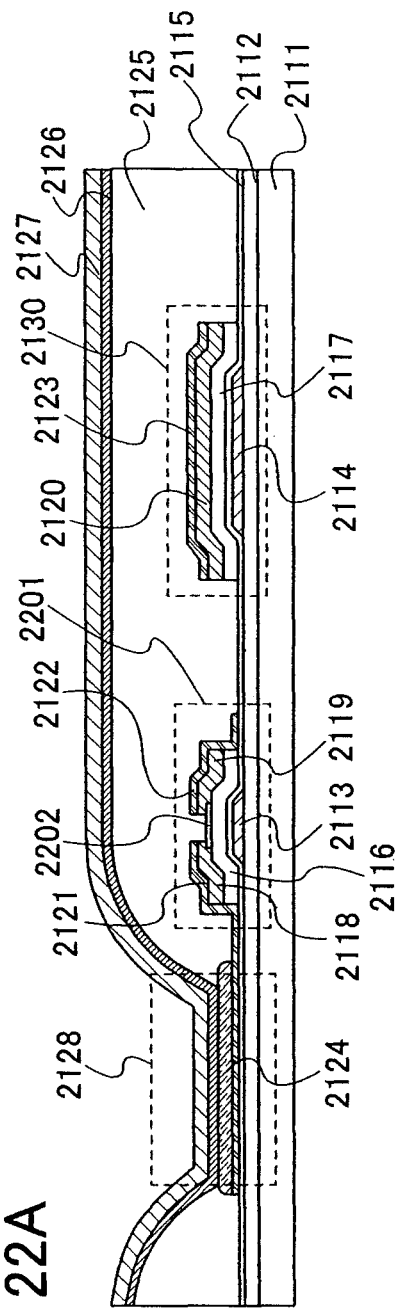
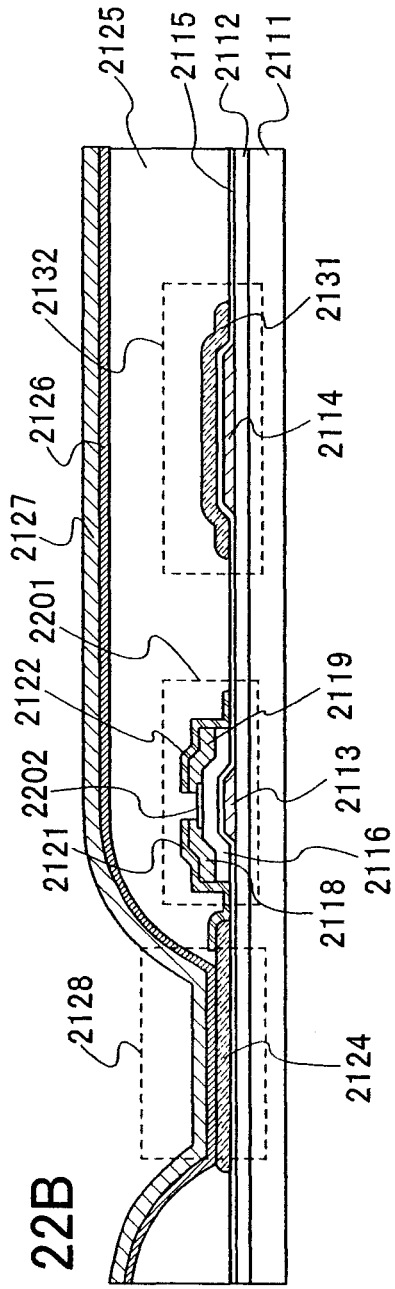
FIG. 22A
FIG. 22B

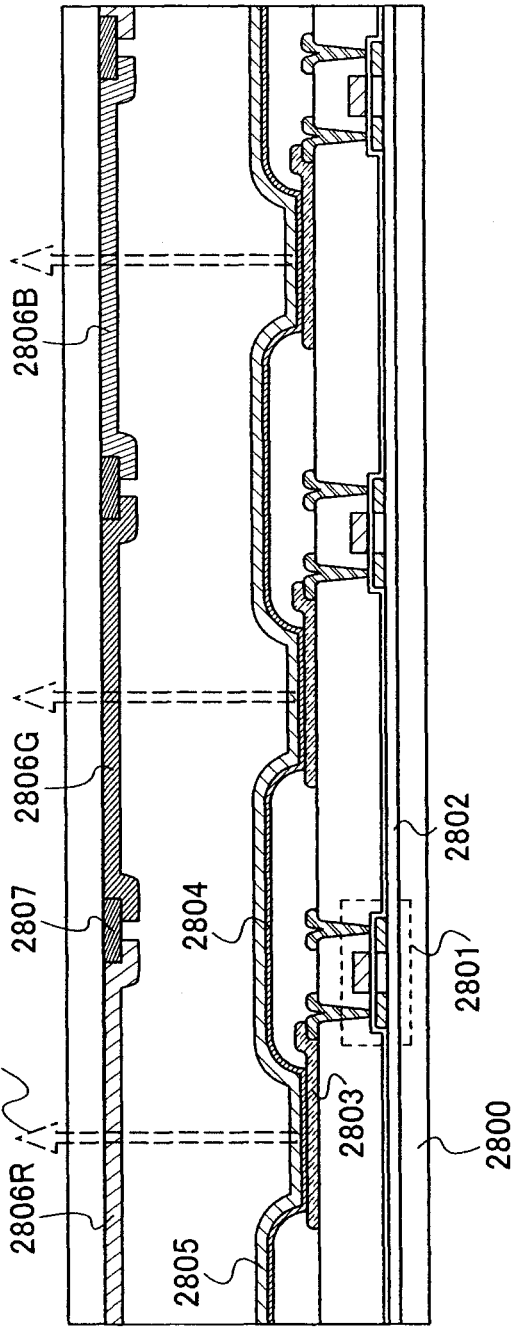

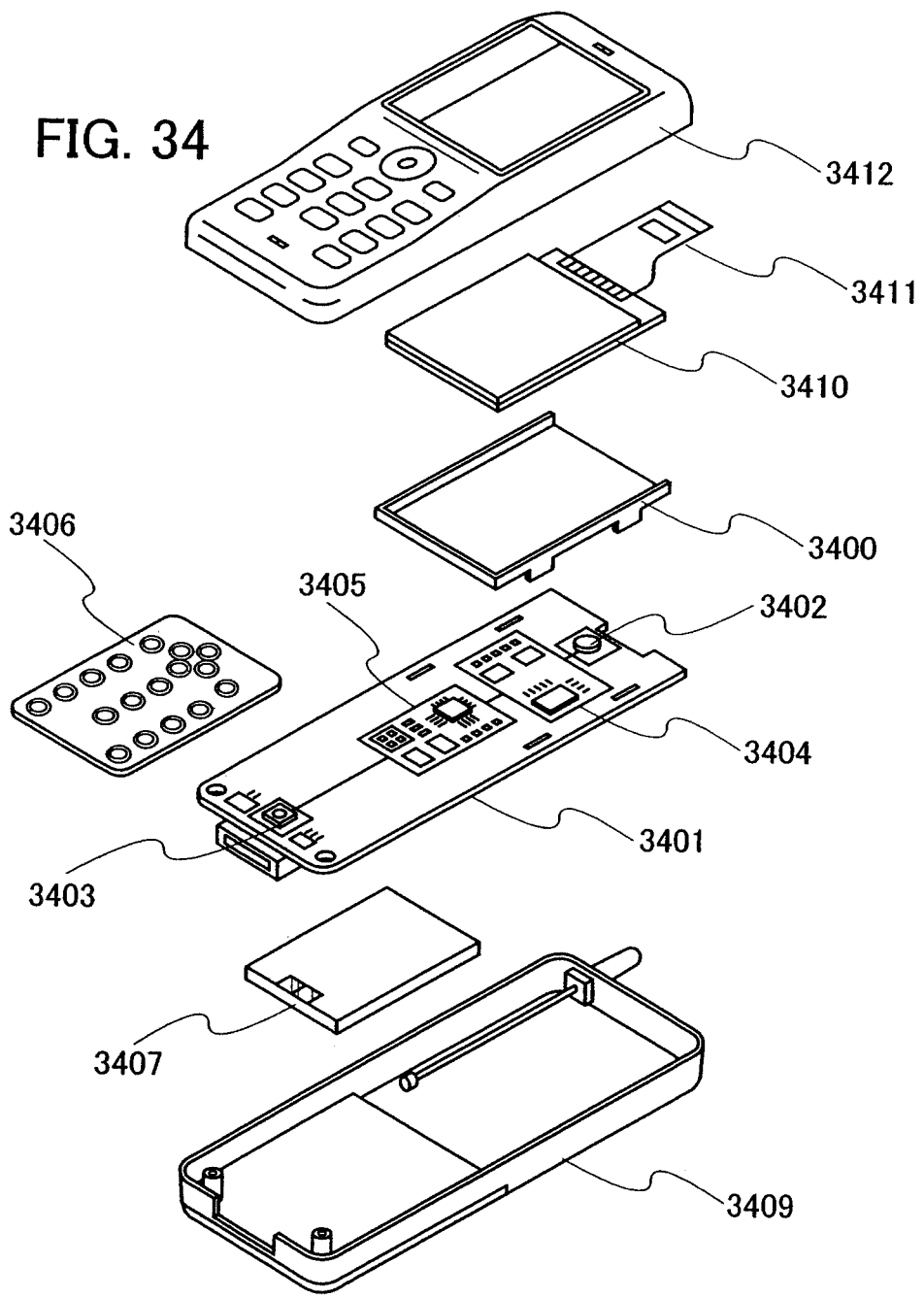

initialization period threshold write period data write period light emitting period

SEMICONDUCTOR DEVICE, DISPLAY DEVICE, AND ELECTRONIC DEVICE

CROSS-REFERENCE TO RELATED APPLICATIONS

This application is a divisional of U.S. application Ser. No. 12/713,391, filed Feb. 26, 2010, now allowed, which is a continuation of U.S. application Ser. No. 11/563,880, filed Nov. 28, 2006, now U.S. Pat. No. 7,671,826, which claims the benefit of a foreign priority application filed in Japan as Serial No. 2005-349780 on Dec. 2, 2005, all of which are incorporated by reference.

TECHNICAL FIELD

The present invention relates to a semiconductor device having a function of controlling a current supplied to a load with a transistor, and a display device which includes a pixel formed using a current-drive display element whose luminance changes in accordance with signals, and a signal line driver circuit and a scan line driver circuit which drive the pixel. The invention also relates to a driving method of such a semiconductor device and display device. Further, the invention relates to an electronic device having the display device in a display portion.

BACKGROUND ART

In recent years, a self-luminous display device having a pixel formed using a light emitting element such as an electroluminescent (EL) element, i.e., a light emitting device has attracted attention. As a light emitting element used for such a self-luminous display device, an organic light emitting diode (OLED) and an EL element have attracted attention, which have been used for an EL display or the like. Since these light emitting elements emit light by themselves, they have advantages over a liquid crystal display in higher pixel visibility, no backlight required, and higher response speed. Note that the luminance of most of light emitting elements is controlled by a current value flowing to the light emitting element.

In addition, development of an active matrix display device has been advanced, in which each pixel is provided with a transistor for controlling light emission of a light emitting element. The active matrix display device is expected to be put into practical use because not only can it achieve high-definition and large-screen display that is difficult for a passive matrix display device, but also it operates with less power consumption than a passive matrix display device.

A pixel configuration of a conventional active matrix display device is shown in FIG. 45 (Reference 1: Japanese Published Patent Application No. H8-234683). The pixel shown in FIG. 45 includes thin film transistors (TFTs) 11 and 12, a capacitor 13, and a light emitting element 14, and is connected to a signal line 15 and a scan line 16. Note that either a source electrode or a drain electrode of the TFT 12 and one electrode of the capacitor 13 are supplied with a power supply potential Vdd, and an opposite electrode of the light emitting element 14 is supplied with a ground potential.

When amorphous silicon is used for a semiconductor layer of the TFT 12 which controls a current value supplied to the light emitting element, that is, a drive TFT, fluctuations of the threshold voltage (Vth) occur due to deterioration or the like. In that case, although the same potential is applied to different pixels through the signal line 15, a current flowing to the light emitting element 14 differs from pixel to pixel and the resulting luminance becomes nonuniform among pixels. Note that in the case of using polysilicon for the semiconductor layer of the drive TFT, characteristics of the transistor deteriorate or vary likewise.

In order to overcome the above problem, an operating method using a pixel in FIG. 46 is proposed in Reference 2 (Reference 2: Japanese Published Patent Application No. 2004-295131). The pixel shown in FIG. 46 includes a transistor 21, a drive transistor 22 which controls a current value supplied to a light emitting element 24, a capacitor 23, and the light emitting element 24, and the pixel is connected to a signal line 25 and a scan line 26. Note that the drive transistor 22 is an NMOS transistor. Either a source electrode or a drain electrode of the drive transistor 22 is supplied with a ground potential, and an opposite electrode of the light emitting element 24 is supplied with Vca.

FIG. 47 shows a timing chart of the operation of this pixel. In FIG. 47, one frame period is divided into an initialization period 31, a threshold (Vth) write period 32, a data write period 33, and a light emitting period 34. Note that one frame period corresponds to a period for displaying an image for one screen, and the initialization period, the threshold (Vth) write period, and the data write period are collectively referred to as an address period.

First, in the threshold write period 32, the threshold voltage of the drive transistor 22 is written into the capacitor 23. After that, in the data write period 33, a data voltage (Vdata) indicative of the luminance of the pixel is written into the capacitor 23, and thus Vdata+Vth is accumulated in the capacitor 23. Then, in the light emitting period 34, the drive transistor 22 is turned on, so that the light emitting element 24 emits light at a luminance specified by the data voltage by changing Vca. Such operation can reduce luminance variations caused by fluctuations of the threshold voltage of the drive transistor.

Reference 3 also discloses that a gate-source voltage of a drive TFT is set at a voltage corresponding to the sum of a data potential and the threshold voltage of the drive TFT, and thus a current flowing to a light-emitting element does not change even when the threshold voltage of the TFT fluctuates (Reference 3: Japanese Published Patent Application No. 2004-280059).

In each of the operating methods disclosed in References 2 and 3, the initialization, the threshold voltage writing, and the light emission are performed by changing a potential of Vca several times in each frame period. In these pixels, one electrode of a light emitting element which is supplied with a potential Vca, that is, an opposite electrode is formed entirely over the pixel region. Therefore, the light emitting element cannot emit light if there is even a single pixel in which data writing operation is performed besides initialization and threshold voltage writing. Thus, the ratio of a light emitting period to one frame period (i.e., duty ratio) becomes low as shown in FIG. 48.

When the duty ratio is low, the amount of current supplied to a light-emitting element through a driving transistor has to be increased; therefore, a voltage applied to the light-emitting element becomes higher, which results in high power consumption. Further, since the light-emitting element and the driving transistor will easily degrade with a low duty ratio, even higher power is required for obtaining about the same level of luminance as that before degradation.

In addition, since the opposite electrode is connected to all of the pixels, the light-emitting element functions as an element with large capacitance. Accordingly, in order to change the potential of the opposite electrode, high power consumption is required.

DISCLOSURE OF INVENTION

In view of the foregoing problems, it is an object of the invention to provide a display device with low power consumption and a high duty ratio. It is another object of the invention to provide a pixel configuration, a semiconductor device, and a display device in which a luminance deviation from the level specified by a data potential is small.

Note that the invention is directed not only to a display device having a light-emitting element and, therefore, it is still another object of the invention to suppress variations in the current value which result from variations in the threshold voltage of a transistor. Accordingly, a destination of a current which is controlled with a driving transistor is not limited to the light-emitting element.

One aspect of the invention provides a semiconductor device having a pixel which includes a transistor, a first switch, a second switch, a first wiring, and a second wiring. One of a source electrode and a drain electrode of the transistor is electrically connected to a pixel electrode and the second switch; the other of the source electrode and the drain electrode of the transistor is electrically connected to the first wiring; and a gate electrode of the transistor is electrically connected to the second wiring through the first switch. A signal in accordance with a gray scale level of the pixel is input to the gate electrode of the transistor.

One aspect of the invention provides a semiconductor device including a transistor, a storage capacitor, a first switch, a second switch, and a third switch. One of a source electrode and a drain electrode of the transistor is electrically connected to a pixel electrode and also electrically connected to a third wiring through the third switch; the other of the source electrode and the drain electrode of the transistor is electrically connected to a first wiring; and a gate electrode of the transistor is electrically connected to a second wiring through the second switch and also electrically connected to a fourth wiring through the first switch. One of the source electrode and the drain electrode of the transistor is electrically connected to the gate electrode of the transistor through the storage capacitor.

The third wiring may be a wiring selected from three wirings which control the first to third switches respectively of a preceding row or a next row.

One aspect of the invention provides a semiconductor device including a transistor, a storage capacitor, a first switch, a second switch, a third switch, and a fourth switch. One of a source electrode and a drain electrode of the transistor is electrically connected to a pixel electrode and also electrically connected to a third wiring through the third switch; the other of the source electrode and the drain electrode of the transistor is electrically connected to a first wiring; and a gate electrode of the transistor is electrically connected to a second wiring through the fourth switch and the second switch and also electrically connected to a fourth wiring through the fourth switch and the first switch. One of the source electrode and the drain electrode of the transistor is electrically connected to the gate electrode of the transistor through the storage capacitor and the fourth switch.

One aspect of the invention provides a semiconductor device including a transistor, a storage capacitor, a first switch, a second switch, a third switch, and a fourth switch. One of a source electrode and a drain electrode of the transistor is electrically connected to a pixel electrode and also electrically connected to a third wiring through the third switch; the other of the source electrode and the drain electrode of the transistor is electrically connected to a first wiring; and a gate electrode of the transistor is electrically connected to a second wiring through the second switch and also electrically connected to a fourth wiring through the fourth switch and the first switch. One of the source electrode and the drain electrode of the transistor is electrically connected to the gate electrode of the transistor through the storage capacitor and the fourth switch.

One aspect of the invention provides a semiconductor device including a transistor, a storage capacitor, a first switch, a second switch, a third switch, and a fourth switch. One of a source electrode and a drain electrode of the transistor is electrically connected to a pixel electrode and also electrically connected to a third wiring through the third switch; the other of the source electrode and the drain electrode of the transistor is electrically connected to a first wiring through the fourth switch; and a gate electrode of the transistor is electrically connected to a second wiring through the second switch and also electrically connected to a fourth wiring through the first switch. One of the source electrode and the drain electrode of the transistor is electrically connected to the gate electrode of the transistor through the storage capacitor.

One aspect of the invention provides a semiconductor device including a transistor, a storage capacitor, a first switch, a second switch, a third switch, and a fourth switch. One of a source electrode and a drain electrode of the transistor is electrically connected to a pixel electrode through the fourth switch and also electrically connected to a third wiring through the fourth switch and the third switch; the other of the source electrode and the drain electrode of the transistor is electrically connected to a first wiring; and a gate electrode of the transistor is electrically connected to a second wiring through the second switch and also electrically connected to a fourth wiring through the first switch. One of the source electrode and the drain electrode of the transistor is electrically connected to the gate electrode of the transistor through the fourth switch and the storage capacitor.

The third wiring may be the same as a wiring which controls the third switch.

The third wiring may be a wiring selected from four wirings which control the first to fourth switches respectively of a preceding row or a next row.

The transistor may be an n-channel transistor. In addition, a semiconductor layer of the transistor may be formed of a non-crystalline semiconductor film. Further, the semiconductor layer of the transistor may be formed of amorphous silicon.

Alternatively, the semiconductor layer of the transistor may be formed of a crystalline semiconductor film.

In the aforementioned invention, a potential supplied to the second wiring may be higher than a potential supplied to the third wiring, and a difference between the two potentials may be larger than the threshold voltage of the transistor.

The transistor may also be a p-channel transistor. In that case, a potential supplied to the second wiring may be lower than a potential supplied to the third wiring, and a difference between the two potentials may be larger than the absolute value of the threshold voltage of the transistor.

One aspect of the invention provides a semiconductor device including a transistor, one of a source electrode and a drain electrode of which is electrically connected to a first wiring, the other of the source electrode and the drain electrode of which is electrically connected to a third wiring, and a gate electrode of which is electrically connected to a second wiring and a fourth wiring; a storage capacitor which holds a gate-source voltage of the transistor; a means for holding a first voltage in the storage capacitor by applying to the storage capacitor a first potential which is supplied to the second wiring and a second potential which is supplied to the third wiring; a means for discharging a voltage of the storage capacitor down to a second voltage; a means for holding a fifth voltage that is the sum of the second voltage and a fourth voltage in the storage capacitor by applying to the storage capacitor a potential that is the sum of the first potential and a third voltage; and a means for supplying a load with a current which is set for the transistor in accordance with the fifth voltage.

One aspect of the invention provides a semiconductor device including a transistor, one of a source electrode and a drain electrode of which is electrically connected to a first wiring, the other of the source electrode and the drain electrode of which is electrically connected to a third wiring, and a gate electrode of which is electrically connected to a second wiring and a fourth wiring; a storage capacitor which holds a gate-source voltage of the transistor; a means for holding a first voltage in the storage capacitor by applying to the storage capacitor a first potential which is supplied to the second wiring and a second potential which is supplied to the third wiring; a means for discharging a voltage of the storage capacitor down to the threshold voltage of the transistor; a means for holding a fourth voltage that is the sum of the threshold voltage of the transistor and a third voltage in the storage capacitor by applying to the storage capacitor a potential that is the sum of the first potential and a second voltage; and a means for supplying a load with a current which is set for the transistor in accordance with the fourth voltage.

The transistor may be an n-channel transistor. In addition, a semiconductor layer of the transistor may be formed of a non-crystalline semiconductor film. Further, the semiconductor layer of the transistor may be formed of amorphous silicon.

Alternatively, the semiconductor layer of the transistor may be formed of a crystalline semiconductor film.

In the aforementioned invention, the first potential may be higher than the second potential and a difference between the first potential and the second potential may be larger than the threshold voltage of the transistor.

The transistor may also be a p-channel transistor. In that case, the first potential may be lower than the second potential and a difference between the first potential and the second potential may be larger than the absolute value of the threshold voltage of the transistor.

One aspect of the invention provides a display device which includes the aforementioned semiconductor device, and also provides an electronic device which includes the display device as a display portion.

Note that the switch described in this specification is not particularly limited and may be either an electrical switch or a mechanical switch as long as it can control a current flow. The switch may be a transistor, a diode, or a logic circuit combining them. In the case of using a transistor as a switch, the transistor operates as a mere switch. Therefore, the polarity (conductivity type) of the transistor is not particularly limited. However, it is desirable to use a transistor having a characteristic of smaller off-current. As the transistor with small off-current, there are a transistor provided with an LDD region, a transistor having a multi-gate structure, and the like. In addition, it is desirable to use an n-channel transistor when a transistor to be operated as a switch operates in the state that a potential of a source electrode thereof is closer to a low-potential-side power source (e.g., Vss, GND, 0 V, or the like), whereas it is desirable to use a p-channel transistor when the transistor operates in the state that a potential of a source electrode thereof is closer to a high-potential-side power source (e.g., Vdd or the like). This is because the absolute value of a gate-source voltage can be increased, so that the transistor easily operates as a switch. Note that the switch may be a CMOS circuit which uses both an n-channel transistor and a p-channel transistor.

Note that the description "being connected" in the invention is synonymous with "being electrically connected". Thus, another element, switch, or the like may be interposed.

Note also that the load may be any element. For example, a display medium whose contrast varies by an electromagnetic action can be used, such as a light emitting element including an EL element (e.g., an organic EL element, an inorganic EL element, or an EL element containing an organic material and an inorganic material) and an electron emitting element as well as a liquid crystal element or electronic ink. Note that a display device using an electron emitting element includes a field emission display (FED), an SED flat-panel display (SED: Surface-conduction Electron-emitter Display), and the like. In addition, a display device using electronic ink includes electronic paper.

The transistor applicable to the invention is not particularly limited, and it may be a thin film transistor (TFT) using a non-single crystalline semiconductor film typified by an amorphous silicon film or a polycrystalline silicon film, a transistor formed using a semiconductor substrate or an SOI substrate, a MOS transistor, a junction transistor, a bipolar transistor, a transistor using an organic semiconductor or a carbon nanotube, or other transistors. In addition, the substrate over which the transistor is formed is not particularly limited, and the transistor can be formed over a single crystalline substrate, an SOI substrate, a glass substrate, a plastic substrate, or the like.

Note that as described above, the transistor in the invention may be of any type and may be formed over any type of substrate. Accordingly, all circuits may be formed over a glass substrate, a plastic substrate, a single crystalline substrate, an SOI substrate, or any other substrates. Alternatively, a part of the circuits may be formed over a substrate, and another part of the circuits may be formed over another substrate. That is, not all of the circuits are not required to be formed over the same substrate. For example, a part of the circuits may be formed over a glass substrate using TFT's and another part of the circuits may be formed on an IC chip using a single crystalline substrate, so that the IC chip is connected onto the glass substrate by COG (Chip On Glass). Alternatively, the IC chip may be connected to the glass substrate by TAB (Tape Automated Bonding) or using a printed circuit board.

In this specification, one pixel means one color element. Accordingly, in the case of a full-color display device including R (red), G (green), and B (blue) color elements, one pixel means any one of R, G, and B color elements.

Note that the description "pixels are arranged in matrix" in this specification includes not only the case where pixels are arranged in a grid pattern which is a combination of vertical stripes and horizontal stripes, but also the case where, when full-color display is performed with three color elements (e.g. RGB), pixels of three color elements which constitute the smallest unit of an image are arranged in a so-called delta pattern. In addition, the size of each pixel may be different from one another according to color elements.

Note that a "semiconductor device" in this specification means a device having a circuit which includes a semiconductor element (such as a transistor or a diode). In addition, a "display device" includes not only the main body of a display panel in which a plurality of pixels each including a load and a peripheral driver circuit for driving the pixels are formed over a substrate but also a display panel with a flexible printed circuit (FPC) or a printed wiring board (PWB) attached thereto.

According to the invention, variations in the current value caused by variations in the threshold voltage of transistors can be suppressed. Therefore, a desired current can be supplied to a load such as a light emitting element. In particular, when a light emitting element is used as a load, a display device with few luminance variations and a high duty ratio can be provided.

BRIEF DESCRIPTION OF DRAWINGS

In the accompanying drawings,

FIG. 2 is a timing chart illustrating the operation of the pixel shown in FIG. 1;

FIGS. 16A to 16F illustrate pixel configurations shown in Embodiment Mode 3;

FIGS. 20A and 20B are fragmentary sectional views of a pixel shown in Embodiment Mode 8;

FIGS. 22A and 22B are fragmentary sectional views of a pixel shown in Embodiment Mode 8;

FIG. 28 is a fragmentary sectional view of a pixel shown in Embodiment Mode 9;

FIG. 34 shows an exemplary configuration of a mobile phone;

BEST MODE FOR CARRYING OUT THE INVENTION

Figure 1:
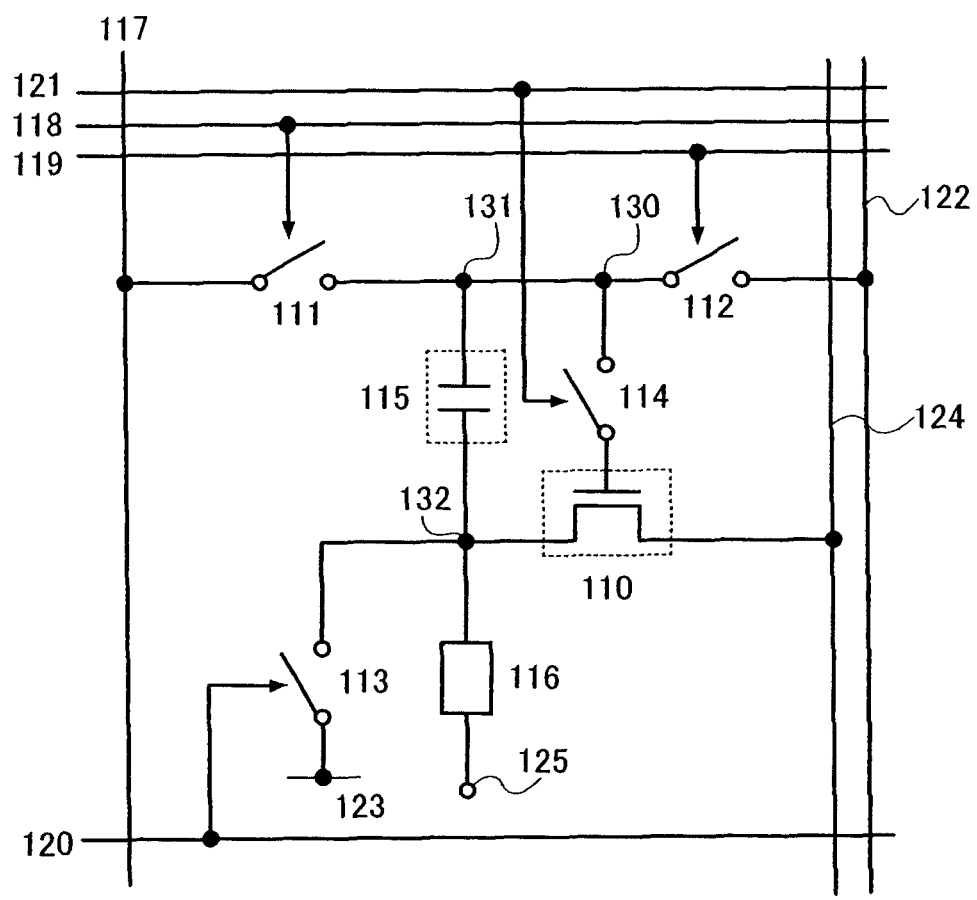
FIG. 1 shows a pixel configuration shown in Embodiment Mode 1.

Hereinafter, embodiment modes and embodiments of the invention will be described. Note that it is easily understood by a person skilled in the art that the invention can be embodied in many different modes and can be changed in various ways without departing from the spirit and the scope of the invention. Therefore, the invention should not be construed as being limited the following description. Note that like reference numerals are used to denote like elements throughout the drawings which illustrate the structures of the invention.

Embodiment Mode 1

A basic configuration of a pixel of the invention is described with reference to FIG. 1. The pixel shown in FIG. 1 includes a transistor 110, a first switch 111, a second switch 112, a third switch 113, a fourth switch 114, a capacitor 115, and a light emitting element 116. The pixel is connected to a signal line 117, a first scan line 118, a second scan line 119, a third scan line 120, a fourth scan line 121, a first potential supply line 122, a second potential supply line 123, and a power supply line 124. In this embodiment mode, the transistor 110 is an n-channel transistor which is turned on when a gate-source voltage (Vgs) thereof exceeds the threshold voltage (Vth). In addition, a pixel electrode of the light emitting element 116 is an anode and an opposite electrode 125 thereof is a cathode. Note that the gate-source voltage of the transistor is represented by Vgs; the drain-source voltage, Vds; the threshold voltage, Vth; and a voltage accumulated in the capacitor, Vcs. In addition, the power supply line 124, the first potential supply line 122, the second potential supply line 123, and the signal line 117 are also referred to as a first wiring, a second wiring, a third wiring, and a fourth wiring, respectively.

A first electrode (one of a source electrode and a drain electrode) of the transistor 110 is connected to the pixel electrode of the light emitting element 116; a second electrode (the other of the source electrode and the drain electrode) thereof, to the power supply line 124; and a gate electrode thereof, to the first potential supply line 122 through the fourth switch 114 and the second switch 112. Note that the fourth switch 114 is connected between the gate electrode of the transistor 110 and the second switch 112. When a connection point of the fourth switch 114 and the second switch 112 is denoted by a node 130, the node 130 is connected to the signal line 117 through the first switch 111. In addition, the first electrode of the transistor 110 is also connected to the second potential supply line 123 through the third switch 113.

Further, the capacitor 115 is connected between the node 130 and the first electrode of the transistor 110. That is, a first electrode of the capacitor 115 is connected to the gate electrode of the transistor 110 through the fourth switch 114, while a second electrode of the capacitor 115 is connected to the first electrode of the transistor 110. The capacitor 115 may be formed by sandwiching an insulating film between a wiring, a semiconductor layer, and an electrode or can be omitted by utilizing the gate capacitance of the transistor 110. Such a means for holding a voltage is called a storage capacitor. Note that a connection point of the node 130, the first switch 111, and the first electrode of the capacitor 115 is denoted by a node 131, and a connection point of the first electrode of the transistor 110, the second electrode of the capacitor 115, and the pixel electrode of the light emitting element 116 is denoted by a node 132.

Note that on/off of the first switch 111, the second switch 112, the third switch 113, and the fourth switch 114 is controlled by inputting signals to the first scan line 118, the second scan line 119, the third scan line 120, and the fourth scan line 121, respectively.

A signal in accordance with a gray scale level of the pixel which corresponds to a video signal, i.e., a potential in accordance with luminance data is input to the signal line 117.

Next, operation of the pixel shown in FIG. 1 is described with reference to a timing chart in FIG. 2 and FIGS. 3A to 3D. Note that one frame period which corresponds to a period for displaying an image for one screen is divided into an initialization period, a threshold write period, a data write period, and a light emitting period in FIG. 2. The initialization period, the threshold write period, and the data write period are collectively referred to as an address period. The length of one frame period is not particularly limited, but is preferably ⅙₀ second or less so that an image viewer does not perceive flickers.

A potential V1 is input to the opposite electrode 125 of the light emitting element 116 and the first potential supply line 122, while a potential V1−Vth−α (α: an arbitrary positive number) is input to the second potential supply line 123. In addition, a potential V2 is input to the power supply line 124.

Here, the potential of the opposite electrode 125 of the light emitting element 116 is set equal to the potential of the first potential supply line 122 for descriptive purposes. However, given that the minimum potential difference which is necessary for the light emitting element 116 to emit light is represented by $V_{EL}$, it is acceptable as long as the potential of the opposite electrode 125 is higher than a potential V1−Vth−α−$V_{EL}$. In addition, it is acceptable as long as the potential V2 of the power supply line 124 is higher than the sum of the potential of the opposite electrode 125 and the minimum potential difference ($V_{EL}$) which is necessary for the light emitting element 116 to emit light. However, since the potential of the opposite electrode 125 is set at V1 here for descriptive purposes, it is acceptable as long as V2 is higher than V1+$V_{EL}$.

Figure 3A:
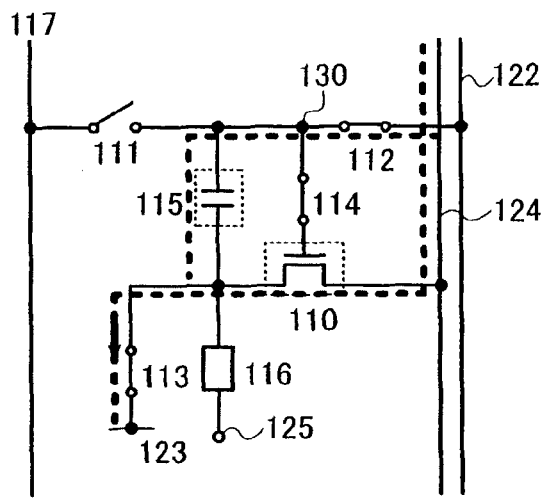
FIGS. 3A to 3D illustrate the operation of the pixel shown in FIG. 1.

First, the first switch 111 is turned off while the second switch 112, the third switch 113, and the fourth switch 114 are turned on in the initialization period as shown in (A) in FIG. 2 and FIG. 3A. At this time, the first electrode of the transistor 110 serves as a source electrode, and a potential thereof is equal to the potential of the second potential supply line 123 which is V1−Vth−α. On the other hand, a potential of the gate electrode of the transistor 110 is V1. Thus, the gate-source voltage Vgs of the transistor 110 is Vth+α and thus the transistor 110 is turned on. Then, Vth+α is held in the capacitor 115 which is provided between the gate electrode and the first electrode of the transistor 110. Although the fourth switch 114 shown herein is in an on state, it may be an off state.

Figure 3B:
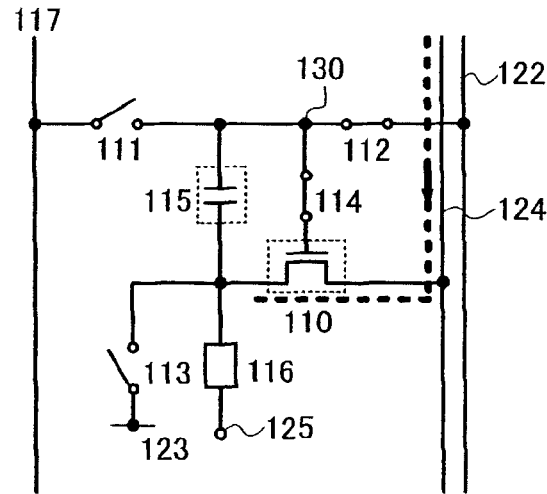

Next, the third switch 113 is turned off in the threshold write period shown in (B) in FIG. 2 and FIG. 3B. Therefore, the potential of the first electrode, i.e., the source electrode of the transistor 110 rises gradually and when it reaches V1−Vth, in other words, when the gate-source voltage Vgs of the transistor 110 reaches the threshold voltage (Vth), the transistor 110 is turned off. Thus, the voltage held in the capacitor 115 becomes Vth.

Figure 3C:
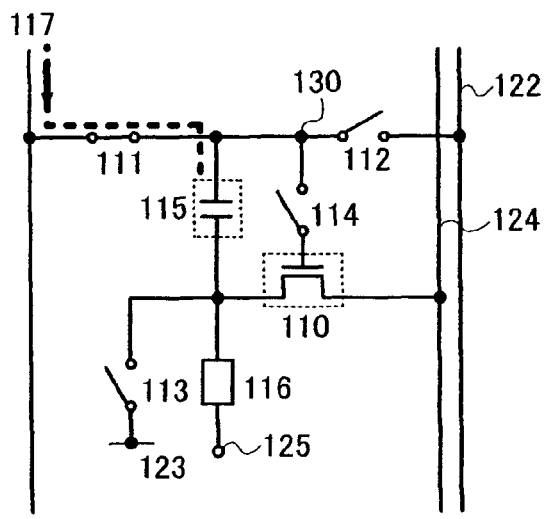

In the next data write period shown in (C) in FIG. 2 and FIG. 3C, the second switch 112 and the fourth switch 114 are turned off, and then the first switch 111 is turned on so that a potential (V1+Vdata) in accordance with luminance data is input from the signal line 117. Note that the transistor 110 can be kept in an off state by turning off the fourth switch 114. Therefore, potential fluctuations of the second electrode of the capacitor 115, which result from a current supplied from the power supply line 124 at data writing, can be suppressed. At this time, the voltage Vcs held in the capacitor 115 can be represented by Formula (1) where capacitances of the capacitor 115 and the light emitting element 116 are C1 and C2, respectively.

$$Vcs = Vth + Vdata \times \frac{C2}{C1+C2} \quad (1)$$

Note that C2>>C1 because the light emitting element 116 is thinner and has a larger electrode area than the capacitor 115. Thus, from C2/(C1+C2)≈1, the voltage Vcs held in the capacitor 115 is represented by Formula (2). Note that when the light emitting element 116 is controlled not to emit light in the next light-emitting period, a potential of Vdata≤0 is input.

$$Vcs = Vth + Vdata \quad (2)$$

Figure 3D:
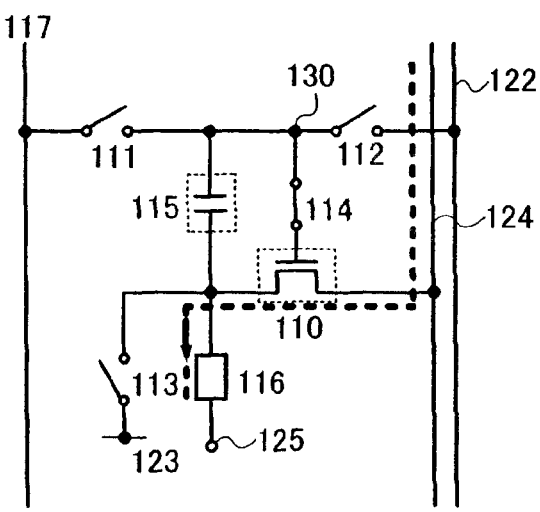

Next, in the light emitting period shown in (D) in FIG. 2 and FIG. 3D, the first switch 111 is turned off and the fourth switch 114 is turned on. At this time, the gate-source voltage Vgs of the transistor 110 is equal to Vth+Vdata, and thus the transistor 110 is turned on depending on the value of Vdata. Then, a current in accordance with luminance data flows to the transistor 110 and the light emitting element 116, so that the light emitting element 116 emits light.

Note that a current I flowing to the light emitting element is represented by Formula (3) when the transistor 110 is operated in the saturation region.

$$I = \frac{1}{2}\left(\frac{W}{L}\right)\mu C_{ox}(Vgs - Vth)^2$$
$$= \frac{1}{2}\left(\frac{W}{L}\right)\mu C_{ox}(Vth + Vdata - Vth)^2 \quad (3)$$
$$= \frac{1}{2}\left(\frac{W}{L}\right)\mu C_{ox}(Vdata)^2$$

In addition, a current I flowing to the light emitting element is represented by Formula (4) when the transistor 110 is operated in the linear region.

$$I = \left(\frac{W}{L}\right)\mu C_{ox}\left[(Vgs - Vth)Vds - \frac{1}{2}Vds^2\right]$$
$$= \left(\frac{W}{L}\right)\mu C_{ox}\left[(Vth + Vdata - Vth)Vds - \frac{1}{2}Vds^2\right] \quad (4)$$
$$= \left(\frac{W}{L}\right)\mu C_{ox}\left[(Vdata)Vds - \frac{1}{2}Vds^2\right]$$

In the formulas, W is the channel width of the transistor 110; L, the channel length; μ, mobility; and Cox, accumulated capacitance.

According to Formulas (3) and (4), the current flowing to the light emitting element 116 does not depend on the threshold voltage (Vth) of the transistor 110 regardless of the operation region of the transistor 110, i.e., the saturation region or the linear region. Therefore, variations in the current value caused by variations in the threshold voltage of the transistor 110 can be suppressed and a current value in accordance with luminance data can be supplied to the light emitting element 116.

Accordingly, variations in luminance caused by variations in the threshold voltage of the transistor 110 can be suppressed. In addition, power consumption can be reduced because the operation is performed with the opposite electrode fixed at a constant potential.

Furthermore, when the transistor 110 is operated in the saturation region, it is also possible to suppress variations in luminance caused by deterioration of the light emitting element 116. When the light emitting element 116 deteriorates, $V_{EL}$ of the light emitting element 116 increases and the potential of the first electrode, i.e., the source electrode of the transistor 110 rises accordingly. At this time, the source electrode of the transistor 110 is connected to the second electrode of the capacitor 115; the gate electrode of the transistor 110 is connected to the first electrode of the capacitor 115; and the gate electrode side is in a floating state. Therefore, in accordance with an increase in the source potential, the gate potential of the transistor 110 also increases by the same amount. Thus, Vgs of the transistor 110 does not change. Therefore, the current flowing to the transistor 110 and the light emitting element 116 is not affected even if the light emitting element deteriorates. Note that it can also be seen in Formula (3) that the current I flowing to the light emitting element does not depend on the source potential or the drain potential.

Therefore, when the transistor 110 is operated in the saturation region, it is possible to suppress variations in the current value flowing to the transistor 110 caused by variations in the threshold voltage of the transistor 110 and deterioration of the light emitting element 116.

Note that when the transistor 110 is operated in the saturation region, as the channel length L is shorter, a larger amount of current will easily flow through the transistor 110 by significantly increasing the drain voltage by avalanche breakdown.

Figure 4:
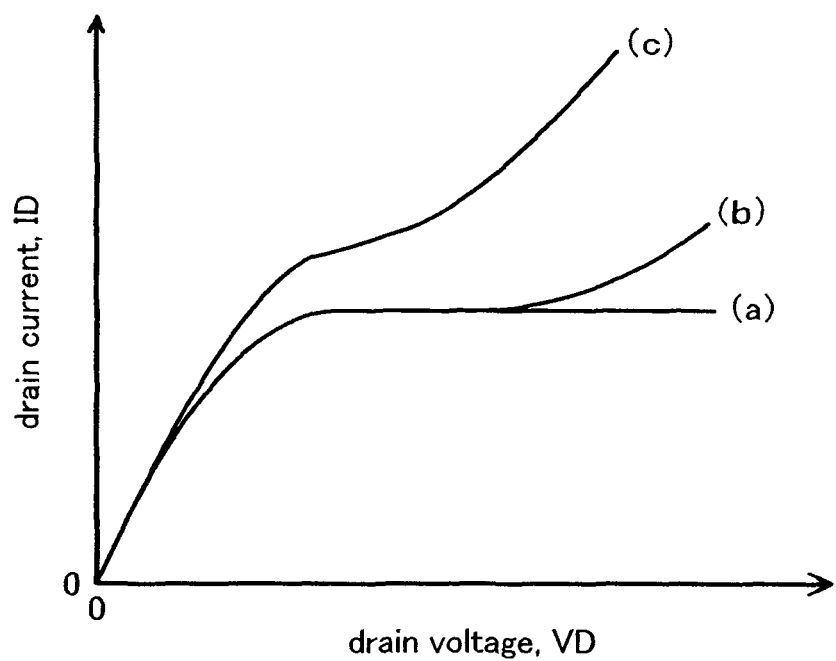
FIG. 4 is a model diagram of the voltage-current characteristics in accordance with the channel length modulation.

When the drain voltage is increased to exceed a pinch-off voltage, a pinch-off point moves to the source side and an effective channel length which substantially functions as a channel decreases. This increases a current value, and such a phenomenon is called a channel length modulation. Note that the pinch-off point is a boundary portion at which the channel disappears and the thickness of the channel below the gate in that portion is 0. In addition, the pinch-off voltage means a voltage when the pinch-off point is at the drain edge. This phenomenon will also occur more easily as the channel length L is shorter. For example, a model diagram of the voltage-current characteristics in accordance with the channel length modulation is shown in FIG. 4. Note that the channel lengths L of transistors (a), (b), and (c) satisfy (a)>(b)>(c) in FIG. 4.

Accordingly, in the case of operating the transistor 110 in the saturation region, the current I with respect to the drain-source voltage Vds is preferably as constant as possible. Thus, the channel length L of the transistor 110 is preferably longer. For example, the channel length L of the transistor is preferably larger than the channel width W thereof. In addition, the channel length L is preferably in the range of 10 to 50 μm inclusive, and more preferably in the range of 15 to 40 μm inclusive. However, the channel length L and the channel width W are not limited to such range.

In addition, since a reverse bias voltage is applied to the light emitting element 116 in the initialization period, a shorted portion of the light emitting element can be insulated and deterioration of the light emitting element can be suppressed. Thus, the lifetime of the light emitting element can be extended.

Note that since variations in the current value caused by variations in the threshold voltage of the transistor can be suppressed, a supply destination of the current controlled by the transistor is not particularly limited. Therefore, an EL element (an organic EL element, an inorganic EL element, or an EL element containing an organic material and an inorganic material), an electron emitting element, a liquid crystal element, electronic ink, or the like can be used as the light emitting element 116 shown in FIG. 1.

In addition, it is acceptable as long as the transistor 110 has a function of controlling a current value supplied to the light emitting element 116, and the kind of the transistor is not particularly limited. Therefore, a thin film transistor (TFT) using a crystalline semiconductor film, a thin film transistor using a non-single crystalline semiconductor film typified by an amorphous silicon film or a polycrystalline silicon film, a transistor formed using a semiconductor substrate or an SOI substrate, a MOS transistor, a junction transistor, a bipolar transistor, a transistor using an organic semiconductor or a carbon nanotube, or other transistors can be used.

The first switch 111 is selected in the timing of inputting a signal in accordance with a gray scale level of the pixel to the capacitor and controls a signal supplied to the gate electrode of the transistor 110. The second switch 112 is selected in the timing of applying a predetermined potential to the gate electrode of the transistor 110 and controls whether or not to supply the predetermined potential to the gate electrode of the transistor 110. The third switch 113 is selected in the timing of applying a predetermined potential for initializing a potential written in the capacitor 115 and decreases the potential of the first electrode of the transistor 110. The fourth switch 114 controls the connection between the gate electrode of the transistor 110 and the capacitor 115. Therefore, the first switch 111, the second switch 112, the third switch 113, and the fourth switch 114 are not particularly limited as long as they have the above functions. For example, each of the switches may be a transistor, a diode, or a logic circuit combining them. Note that the first to third switches are not particularly necessary if the signal or potential can be applied to the pixel at the above timing. In addition, Embodiment Mode 2 describes the case where the fourth switch can be omitted.

Figure 5:
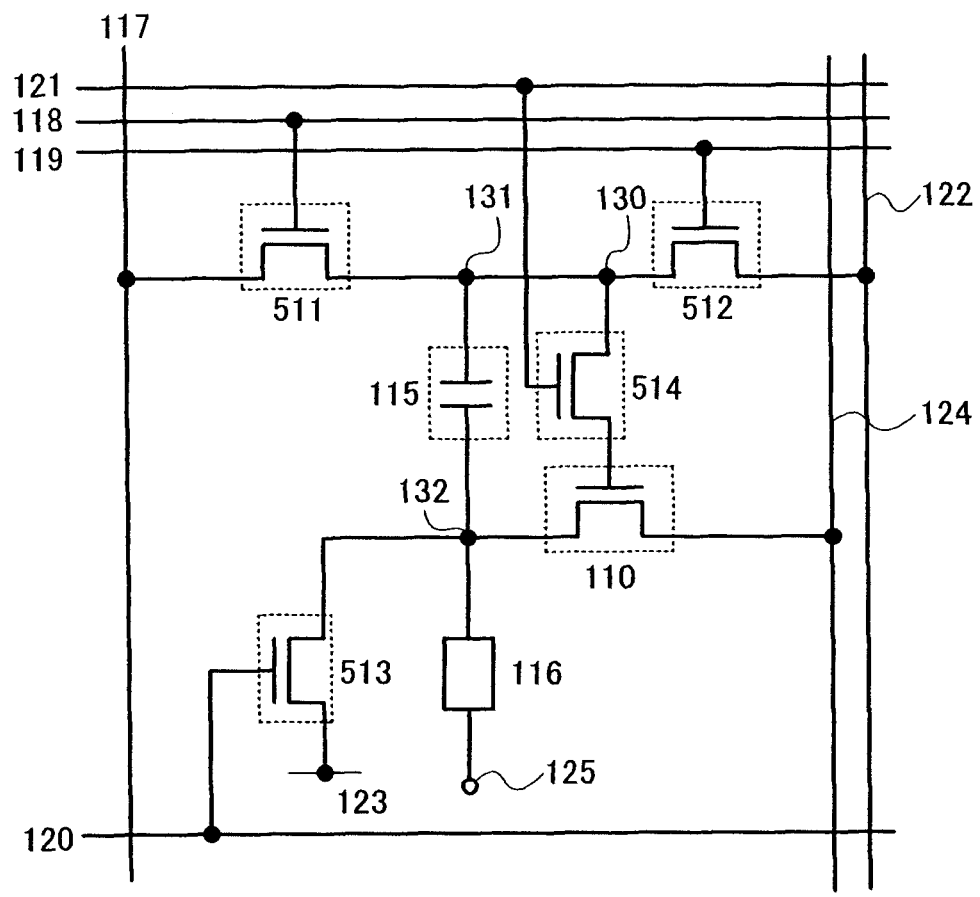
FIG. 5 illustrates a pixel configuration shown in Embodiment Mode 1.

FIG. 5 shows the case of employing n-channel transistors for the first switch 111, the second switch 112, the third switch 113, and the fourth switch 114. Note that portions common to FIGS. 1 and 5 are denoted by common reference numerals, and thus description thereof is omitted.

A first switching transistor 511 corresponds to the first switch 111; a second switching transistor 512, the second switch 112; a third switching transistor 513, the third switch 113; and a fourth switching transistor 514, the fourth switch 114. Note that the channel length of the transistor 110 is preferably larger than that of any of the first switching transistor 511, the second switching transistor 512, the third switching transistor 513, and the fourth transistor 514.

A gate electrode of the first switching transistor 511 is connected to a first scan line 118; a first electrode thereof, to a signal line 117; and a second electrode thereof, to a node 131.

In addition, a gate electrode of the second switching transistor 512 is connected to a second scan line 119; a first electrode thereof, to a first potential supply line 122; and a second electrode thereof, to a node 130.

A gate electrode of the third switching transistor 513 is connected to a third scan line 120; a first electrode thereof, to a node 132; and a second electrode thereof, to a second potential supply line 123.

A gate electrode of the fourth switching transistor 514 is connected to a fourth scan line 121; a first electrode thereof, to the gate electrode of the transistor 110; and a second electrode thereof, to the node 130.

Each switching transistor is turned on when a signal input to each scan line has an H level and turned off when the signal input has an L level.

The pixel configuration in FIG. 5 can also suppress variations in the current value caused by variations in the threshold voltage of the transistor 110 by using an operating method similar to FIG. 1. Thus, a current in accordance with luminance data can be supplied to the light emitting element 116, and variations in luminance can be suppressed. When the transistor 110 is operated in the saturation region, it is also possible to suppress variations in luminance caused by deterioration of the light emitting element 116.

Further, a manufacturing process can be simplified because the pixel can be formed using only n-channel transistors. In addition, a non-crystalline semiconductor such as an amorphous semiconductor or a semi-amorphous semiconductor (also referred to as a microcrystalline semiconductor) can be used for a semiconductor layer of each transistor included in the pixel. For example, amorphous silicon (a-Si:H) can be used as the amorphous semiconductor. By using such a non-crystalline semiconductor, the manufacturing process can further be simplified. Accordingly, a reduction in manufacturing cost and an improvement in yield can be achieved.

Note that the first switching transistor 511, the second switching transistor 512, the third switching transistor 513, and the fourth switching transistor 514 are operated as mere switches. Therefore, the polarity (conductivity type) of the transistors is not particularly limited. However, it is desirable to use a transistor having a characteristic of smaller off-current. As examples of a transistor with small off-current, there are a transistor provided with an LDD region, a transistor having a multi-gate structure, and the like. Alternatively, the switch may be a CMOS circuit which uses both an n-channel transistor and a p-channel transistor.

Figure 6:
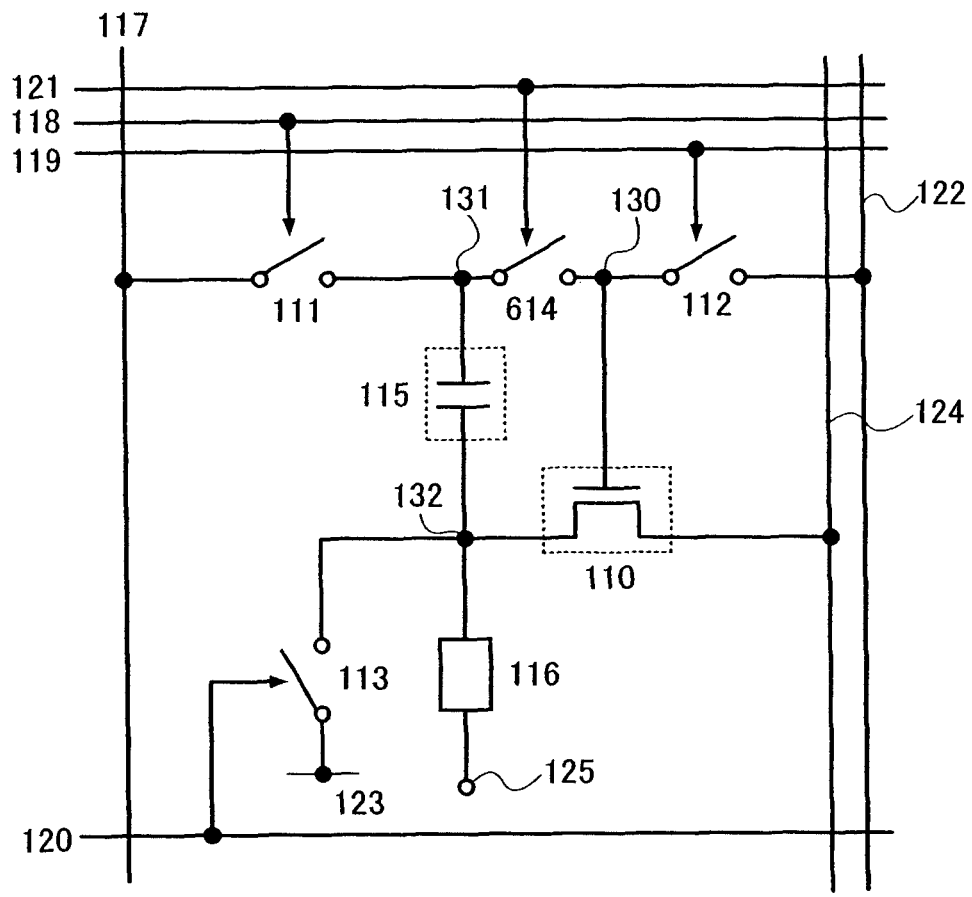
FIG. 6 illustrates a pixel configuration shown in Embodiment Mode 1.

The fourth switch 114 shown in FIG. 1 may be connected between the node 130 and the node 131. Such a configuration is shown in FIG. 6. The fourth switch 114 in FIG. 1 corresponds to a fourth switch 614, and portions common to FIGS. 1 and 6 are denoted by common reference numerals, and thus description thereof is omitted.

The pixel configuration in FIG. 6 can also suppress variations in the current value caused by variations in the threshold voltage of the transistor 110 by using an operating method similar to FIG. 1. Thus, a current in accordance with luminance data can be supplied to the light emitting element 116, and variations in luminance can be suppressed. When the transistor 110 is operated in the saturation region, it is also possible to suppress variations in luminance caused by deterioration of the light emitting element 116.

The fourth switch 114 shown in FIG. 1 may be provided on the path between the node 132 and the connection point of the second electrode of the transistor 110 and the power supply line 124.

Figure 7:
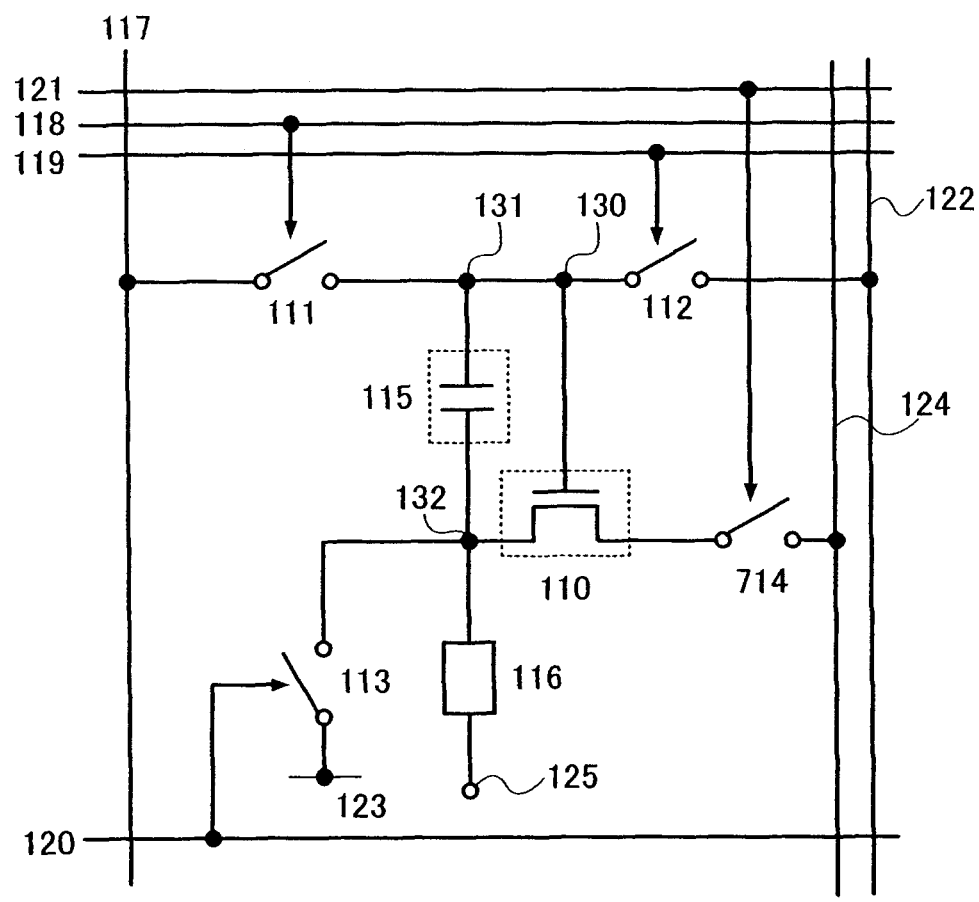
FIG. 7 illustrates a pixel configuration shown in Embodiment Mode 1.

One example of such a configuration is illustrated in FIG. 7. In the configuration of FIG. 7, the fourth switch 114 in FIG. 1 corresponds to a fourth switch 714, and it is connected between the second electrode of the transistor 110 and the power supply line 124. Note that portions common to FIGS. 1 and 7 are denoted by common reference numerals, and thus description thereof is omitted.

The current supply to the transistor 110 can be stopped by turning off the fourth switch 714 even when the transistor 110 is turned on by the fourth switch 714 in the data write period. Therefore, potential fluctuations of the second electrode of the capacitor 115 in the data write period can be suppressed.

Thus, the pixel configuration in FIG. 7 can also suppress variations in the current value caused by variations in the threshold voltage of the transistor 110 by using an operating method similar to FIG. 1. Thus, a current in accordance with luminance data can be supplied to the light emitting element 116, and variations in luminance can be suppressed. When the transistor 110 is operated in the saturation region, it is also possible to suppress variations in luminance caused by deterioration of the light emitting element 116. In addition, when the fourth switch 714 is turned off in the initialization period, power consumption can be reduced.

Figure 8:
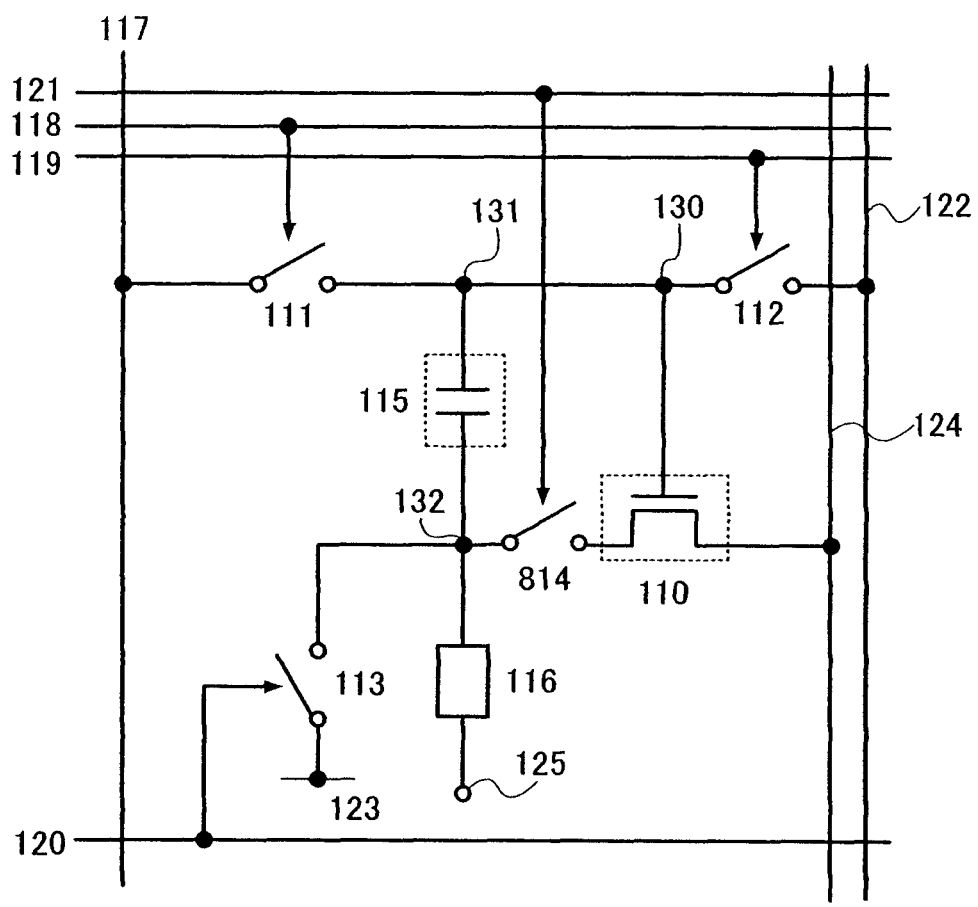
FIG. 8 illustrates a pixel configuration shown in Embodiment Mode 1.

Another example of the pixel configuration is shown in FIG. 8. In FIG. 8, the fourth switch 114 in FIG. 1 corresponds to a fourth switch 814, which is connected between the first electrode of the transistor 110 and the node 132. Note that portions common to FIGS. 1 and 8 are denoted by common reference numerals, and thus description thereof is omitted.

The current supply to the node 132 can be stopped by turning off the fourth switch 814 even when the transistor 110 is turned on by the fourth switch 814 in the data write period. Therefore, potential fluctuations of the second electrode of the capacitor 115 in the data write period can be suppressed.

Thus, the pixel configuration in FIG. 8 can also suppress variations in the current value caused by variations in the threshold voltage of the transistor 110 by using an operating method similar to FIG. 1. Thus, a current in accordance with luminance data can be supplied to the light emitting element 116, and variations in luminance can be suppressed. When the transistor 110 is operated in the saturation region, it is also possible to suppress variations in luminance caused by deterioration of the light emitting element 116. In addition, when the fourth switch 814 is turned off in the initialization period, power consumption can be reduced.

Note that each of the fourth switch 614, the fourth switch 714, and the fourth switch 814 may be a transistor, a diode, or a logic circuit combining them, similarly to the first to third switches.

In the case of providing the fourth switch on the path between the node 132 and the connection point of the second electrode of the transistor 110 and the power supply line 124, as shown in FIGS. 7 and 8, a non-light emission state can be forcibly produced by turning off the fourth switch in the light emitting period. Such operation makes it possible to freely set the light emitting period. In addition, by inserting black display, afterimages can be made less easily perceived and moving image characteristics can be increased.

Next, a display device including the pixel of the invention is described with reference to FIG. 9.

The display device includes a signal line driver circuit 911, a scan line driver circuit 912, and a pixel portion 913. The pixel portion 913 includes a plurality of signal lines S1 to Sm, first potential supply lines P1_1 to Pm_1, and power supply lines P1_3 to Pm_3 which extend from the signal line driver circuit 911 in a column direction; a plurality of first scan lines G1_1 to Gn_1, second scan lines G1_2 to Gn_2, third scan lines G1_3 to Gn_3, and fourth scan lines G1_4 to Gn_4 which extend from the scan line driver circuit 912 in a row direction; and a plurality of pixels 914 which are arranged in matrix corresponding to the signal lines Si to Sm. Further, a plurality of second potential supply lines P1_2 to Pn_2 are provided in parallel with the first scan lines G1_1 to Gn_1. Each pixel 914 is connected to a signal line Sj (one of the signal lines S1 to Sm), a first potential supply line Pj_1, a power supply line Pj_3, a first scan line Gi_1 (one of the scan lines G1_1 to Gn_1), a second scan line Gi_2, a third scan line Gi_3, a fourth scan line Gi_4, and a second potential supply line Pi_2.

Note that the signal line Sj, the first potential supply line Pj_1, the power supply line Pj_3, the first scan line Gi_1, the second scan line Gi_2, the third scan line Gi_3, the fourth scan line Gi_4, and the second potential supply line Pi_2 correspond to the signal line 117, the first potential supply line 122, the power supply line 124, the first scan line 118, the second scan line 119, the third scan line 120, the fourth scan line 121, and the second potential supply line 123, respectively.

In response to signals output from the scan line driver circuit 912, a row of pixels to be operated is selected, and the operation shown in FIG. 2 is performed in each of the pixels in the row. Note that in the data write period of FIG. 2, a video signal output from the signal line driver circuit 911 is written into each pixel of the selected row. At this time, a potential in accordance with luminance data of each pixel is input to each of the signal lines S1 to Sm.

Figure 10:
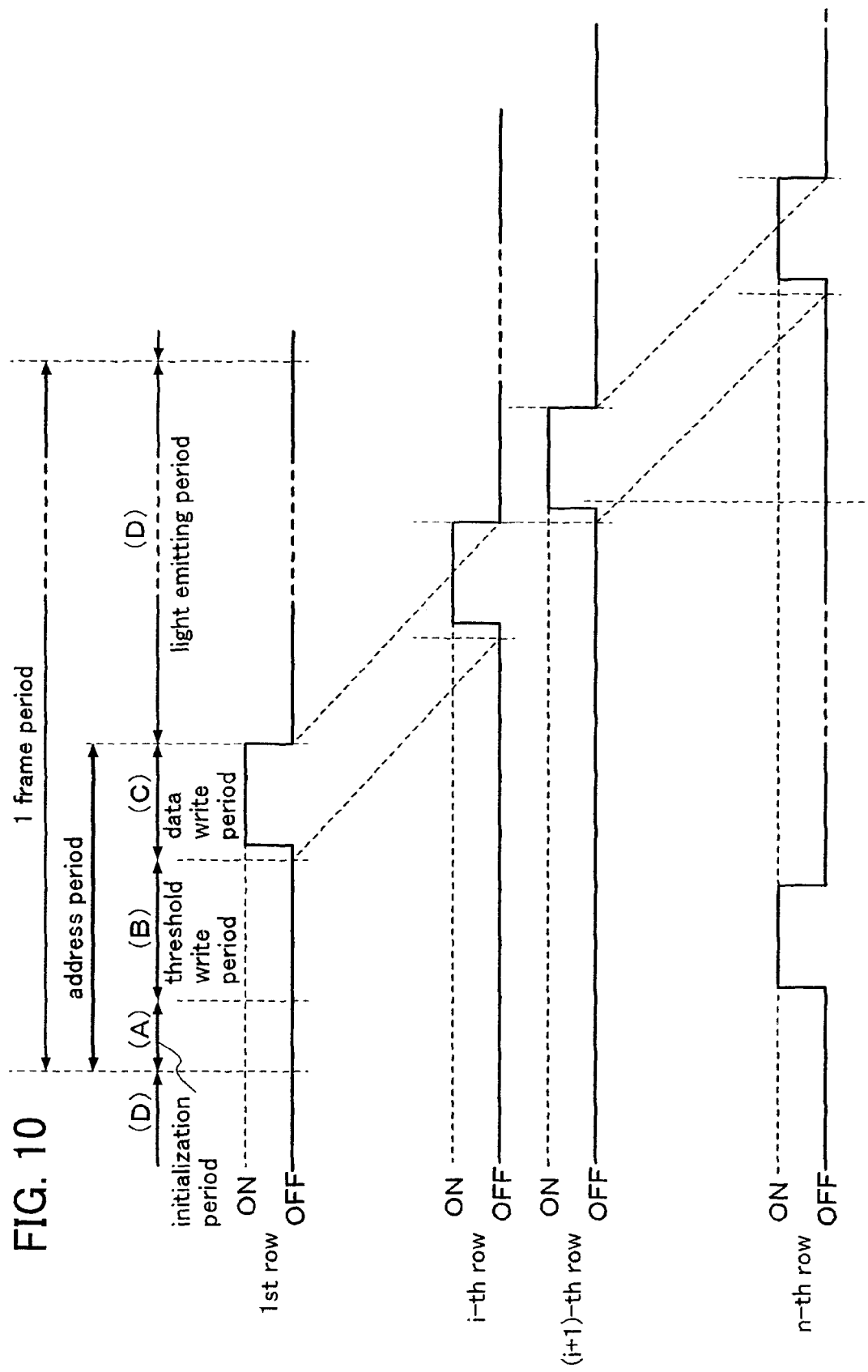
FIG. 10 is a chart illustrating the write operation of a display device shown in Embodiment Mode 1.

As shown in FIG. 10, upon terminating a data write period of the i-th row, for example, signal writing to pixels in the (i+1)-th row starts. Note that in order to show the data write period of each row, FIG. 10 shows only the operation of the first switch 111 of FIG. 2. In addition, a pixel that has terminated the data write period in the i-th row proceeds to a light emitting period and emits light in accordance with the signal written into the pixel.

Thus, start timing of the initialization period can be freely set in respective rows unless data write periods overlap in the respective rows. In addition, since each pixel can emit light except in its address period, the ratio of a light emitting period to one frame period (i.e., duty ratio) can be significantly increased and can be approximately 100%. Therefore, a display device with few luminance variations and a high duty ratio can be provided.

In addition, since a threshold write period can be set long, the threshold voltage of the transistor can be written into the capacitor more accurately. Therefore, reliability as a display device is improved.

Figure 9:
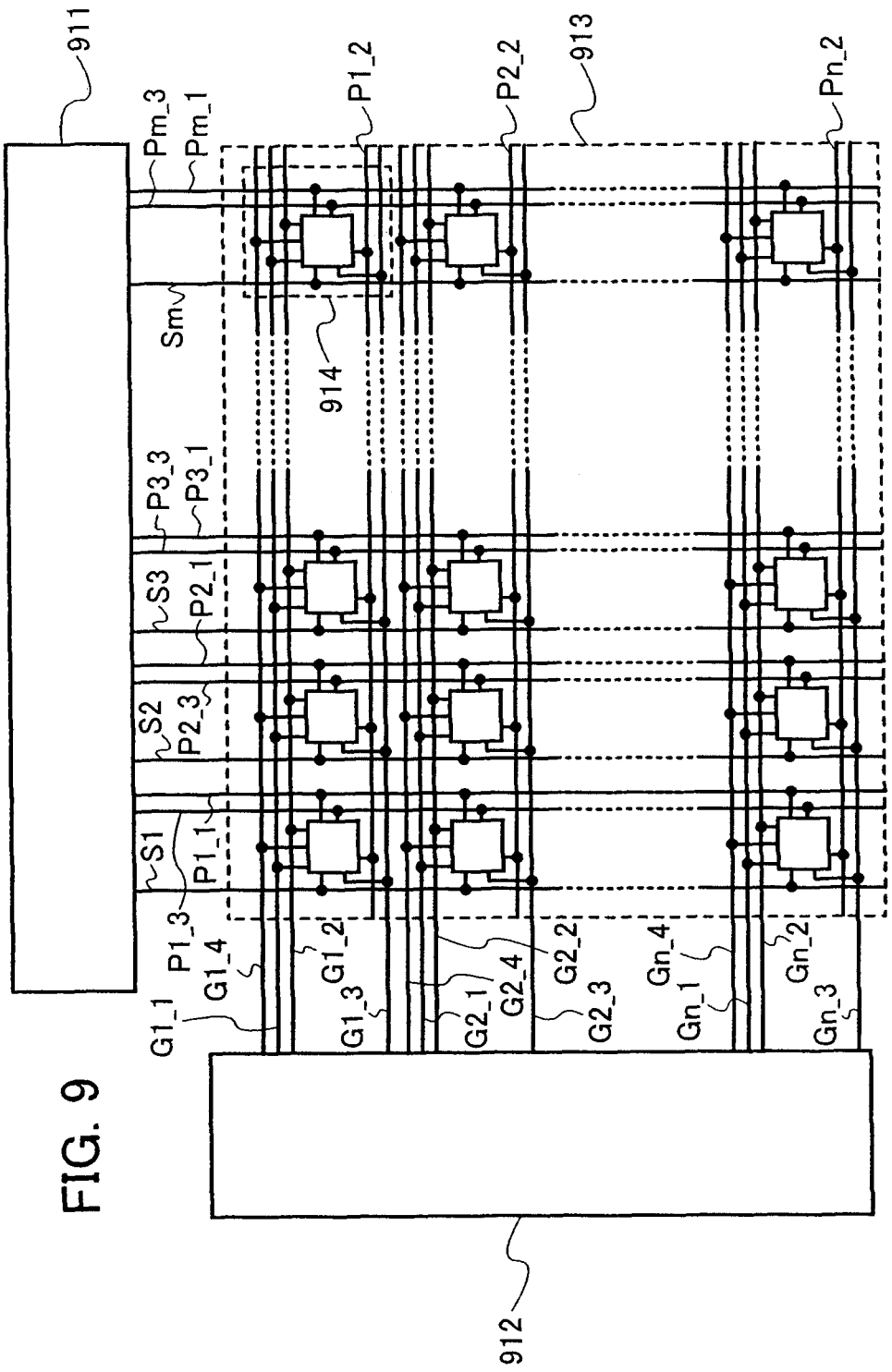
FIG. 9 illustrates a display device shown in Embodiment Mode 1.

Note that the configuration of the display device shown in FIG. 9 is only exemplary, and the invention is not limited to this. For example, the first potential supply lines P1_1 to Pm_1 do not have to be in parallel with the signal lines S1 to Sm, and may be in parallel with the first scan lines G1_1 to Gn_1.

Meanwhile, as a driving method of a display device for expressing gray scales, there are an analog gray scale method and a digital gray scale method. The analog gray scale method includes a method of controlling the emission intensity of a light emitting element in an analog manner and a method of controlling the emission time of a light emitting element in an analog manner. Between the two, the method of controlling the emission intensity of a light emitting element in an analog manner is often used. On the other hand, in the digital gray scale method, on/off of a light emitting element is controlled in a digital manner to express gray scales. The digital gray scale method has the advantage of high noise resistance because data processing can be performed using digital signals. However, since there are only two states of a light emitting state and a non-light emitting state, only two gray scale levels can be expressed. Therefore, multiple level gray scale display is attempted by using another method in combination. As a technique for multiple level gray scale display, there are an area gray scale method in which light emitting areas of pixels are weighted and selected to perform gray scale display, and a time gray scale method in which light emitting time is weighted and selected to perform gray scale display.

Figure 49:
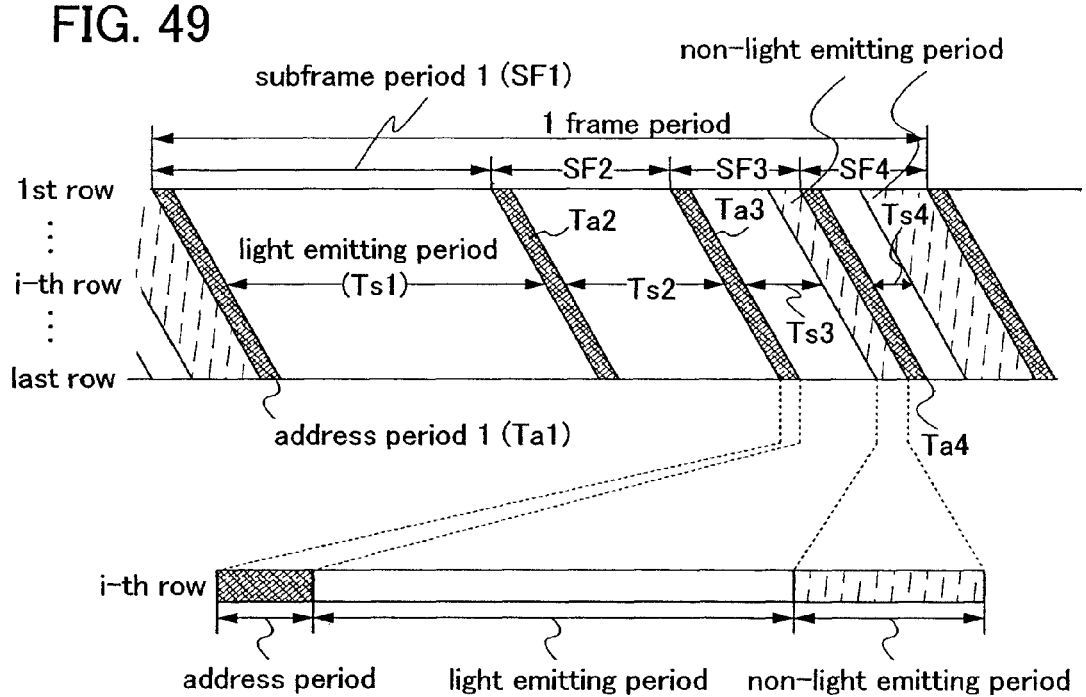
FIG. 49 illustrates a driving scheme which combines a digital gray scale method and a time gray scale method.

In the case of combining the digital gray scale method and the time gray scale method, one frame period is divided into a plurality of subframe periods (SFn) as shown in FIG. 49. Each subframe period includes an address period (Ta) including an initialization period, a threshold write period, and a data write period and a light emitting period (Ts). Note that subframe periods, the number of which corresponds to the number of display bits n, are provided in one frame period. In addition, the ratio of lengths of light emitting periods in respective subframe periods is set to satisfy $2^{(n-1)}:2^{(n-2)}: \ldots :2:1$, and light emission or non-light emission of light emitting elements is selected in each light emitting period, so that gray scales are expressed by utilizing the difference in total light emitting time within one frame period. When the total light emitting time in one frame period is long, luminance is high, and when short, luminance is low. Note that FIG. 49 shows an example of a 4-bit gray scale, in which one frame period is divided into four subframe periods and $2^4=16$ gray scale levels can be expressed by a combination of light emitting periods. Note that it is also possible to express gray scales by setting the ratio of lengths of light emitting periods on the basis other than the power-of-two ratio. Further, each subframe period may further be divided.

Note that in the case of attempting multiple level gray scale display by using the time gray scale method as described above, the length of a light emitting period of a lower-order bit is short. Therefore, when data write operation is started immediately upon termination of a light emitting period of a preceding subframe period, it overlaps with the data write operation of the preceding subframe period. In that case, normal operation cannot be performed. Therefore, by providing the fourth switch between the node 132 and the connection point of the second electrode of the transistor 110 and the power supply line 124 as shown in FIGS. 7 and 8, and turning off the fourth switch in the light emitting period to forcibly produce a non-light emitting state, it becomes possible to express light emission which has even a shorter length than the data write periods required for all rows. Thus, the provision of the fourth switch is effective not only in the analog gray scale method but also in the method which combines a digital gray scale method and a time gray scale method as described above.

Note that variations in the threshold voltage include not only a difference between the threshold voltage of each transistor in pixels, but also include a fluctuation in the threshold voltage of each transistor over time. Further, the difference in the threshold voltage of each transistor includes the difference in characteristics that are produced in the manufacture of the transistor. Note also that the transistor here means a transistor having a function of supplying a current to a load such as a light emitting element.

Embodiment Mode 2

In this embodiment mode, a pixel with a different configuration from Embodiment Mode 1 is described with reference to FIG. 11. Note that portions common to this embodiment mode and the preceding embodiment mode are denoted by common reference numerals, and thus detailed description of the same portion or a portion having a similar function is omitted.

Figure 11:
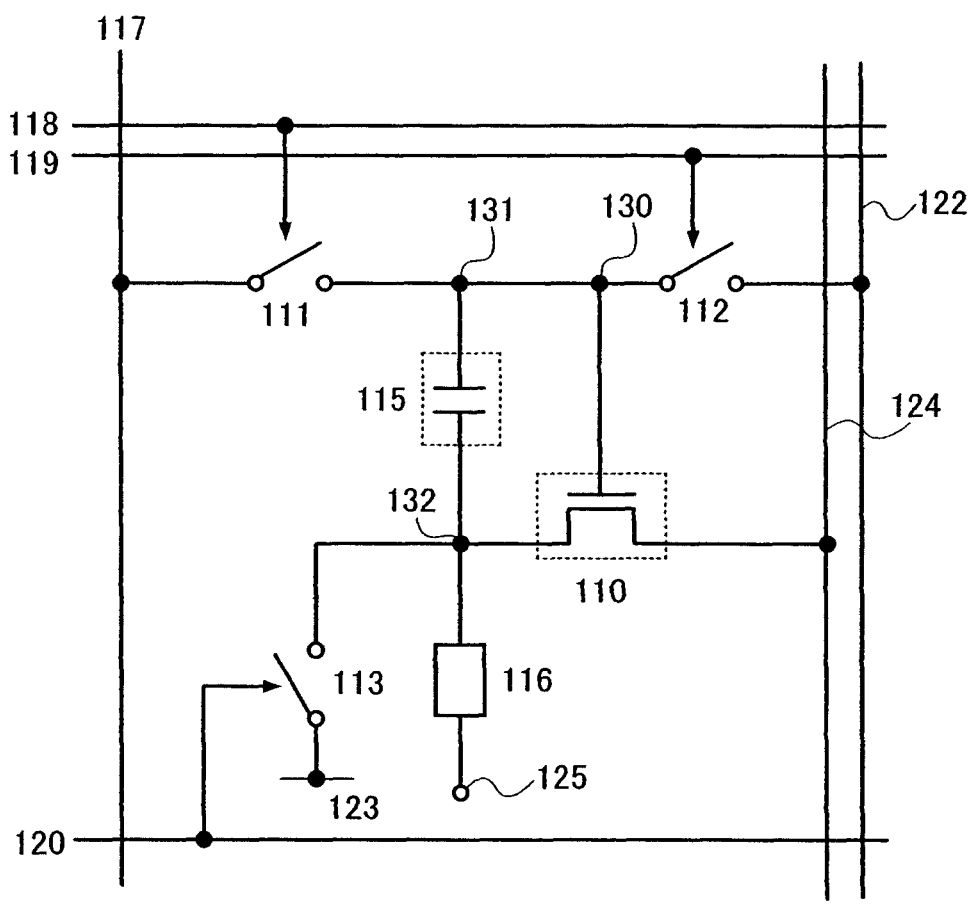
FIG. 11 illustrates a pixel configuration shown in Embodiment Mode 2.

The pixel shown in FIG. 11 includes a transistor 110, a first switch 111, a second switch 112, a third switch 113, a capacitor 115, and a light emitting element 116. The pixel is connected to a signal line 117, a first scan line 118, a second scan line 119, a third scan line 120, a first potential supply line 122, a second potential supply line 123, and a power supply line 124.

A first electrode (one of a source electrode and a drain electrode) of the transistor 110 is connected to a pixel electrode of the light-emitting element 116; a second electrode (the other of the source electrode and the drain electrode) thereof, to the power supply line 124; and a gate electrode thereof, to the first potential supply line 122 through the second switch 112. In addition, the gate electrode of the transistor 110 is also connected to the signal line 117 through the first switch 111, and the first electrode thereof is also connected to the second potential supply line 123 through the third switch 113.

Further, the capacitor 115 is connected between the gate electrode and the first electrode of the transistor 110. That is, a first electrode of the capacitor 115 is connected to the gate electrode of the transistor 110, while a second electrode of the capacitor 115 is connected to the first electrode of the transistor 110. The capacitor 115 may be formed by sandwiching an insulating film between a wiring, a semiconductor layer, and an electrode or can be omitted by utilizing the gate capacitance of the transistor 110.

That is, the pixel shown in FIG. 11 corresponds to the pixel shown in FIG. 1 which has no fourth switch 114. The pixel shown in FIG. 11 is also operated in accordance with the timing chart in FIG. 2.

Unlike the pixel in FIG. 1, the transistor 110 is turned on upon input of a potential (V1+Vdata) in accordance with luminance data from the signal line 117 in the data write period shown in (C) in FIG. 2. Thus, a potential of the second electrode of the capacitor 115 increases. Therefore, a voltage Vcs which is held in the capacitor 115 becomes lower than Vth+Vdata. In such a case, a potential in which the potential fluctuation of the second electrode of the capacitor 115 (V1+V' data) is taken into account may be input from the signal line 117.

However, the potential input from the signal line is not necessarily required to be V1+V' data depending on the difference between the capacitances of the capacitor 115 and the light emitting element 116. For example, the potential input from the signal line may be V1+Vdata similarly to Embodiment Mode 1 if the potential fluctuation of the second electrode of the capacitor 115 does not greatly affect the voltage to be held in the capacitor 115.

Figure 42:
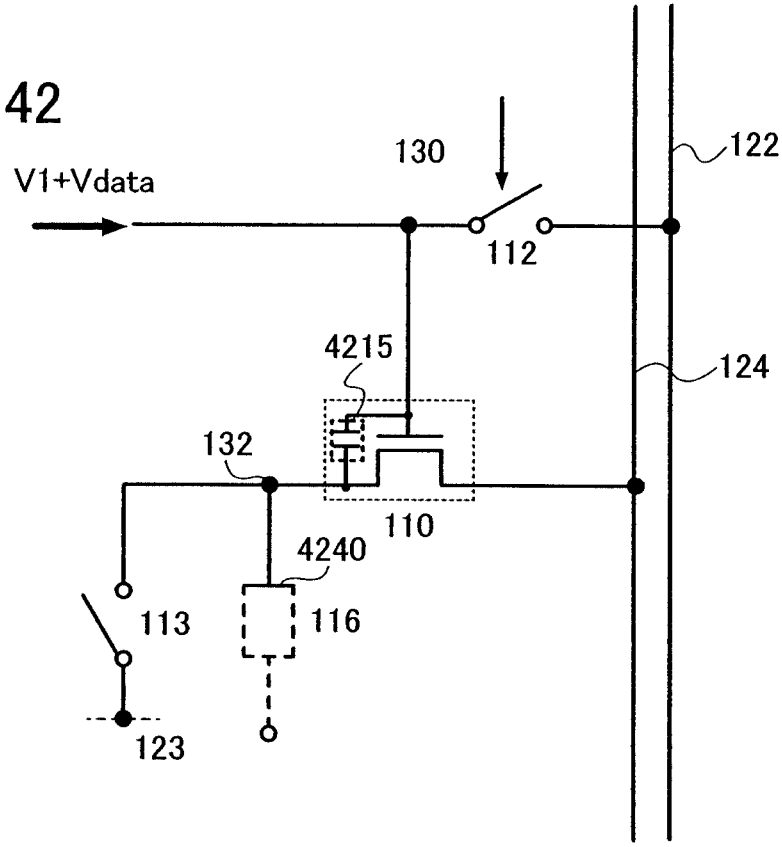
FIG. 42 illustrates a pixel configuration shown in Embodiment Mode 2.

As shown in Embodiment Mode 1, the first switch 111 is selected in the timing of inputting a signal in accordance with a gray scale level of the pixel to the capacitor and controls a signal supplied to the gate electrode of the transistor 110. The second switch 112 is selected in the timing of applying a predetermined potential to the gate electrode of the transistor 110 and controls whether or not to supply the predetermined potential to the gate electrode of the transistor 110. The third switch 113 is selected in the timing of applying a predetermined potential for initializing a potential written in the capacitor 115 and decreases the potential of the first electrode of the transistor 110. Therefore, the first switch 111, the second switch 112, and the third switch 113 are not particularly limited as long as they have the above functions. For example, each of the switches may be a transistor, a diode, or a logic circuit combining them. Note that the first to third switches are not particularly necessary if the signal or potential can be applied to the pixel at the above timing. For example, when a signal in accordance with a gray scale level of the pixel can be input to the gate electrode of the transistor 110, the first switch 111 is not required to be provided as shown in FIG. 42. The pixel shown in FIG. 42 includes a transistor 110, a second switch 112, a third switch 113, and a pixel electrode 4240. A first electrode (one of a source electrode and a drain electrode) of the transistor 110 is connected to the pixel electrode 4240 and the third switch 113, and a gate electrode thereof is connected to the first potential supply line 122 through the second switch 112. Note that since a gate capacitance 4215 of the transistor 110 is utilized as a storage capacitor, the capacitor 115 in FIG. 11 is not particularly required. Such a pixel can also suppress variations in the current value caused by variations in the threshold voltage of the transistor 110 by operating each switch and supplying a desired potential to each electrode in a similar manner to FIG. 11. Thus, a desired current can be supplied to the pixel electrode 4240.

The first potential supply line 122 may be provided in parallel with the first scan line 118 and the like. One mode of FIG. 11 with such a configuration is shown in the top view of FIG. 43. Note that in FIG. 43, each switch is shown as a switching transistor. The first switch 111, the second switch 112, and the third switch 113 in FIG. 11 correspond to a first switching transistor 4301, a second switching transistor 4302, and a third switching transistor 4303, respectively.

A conductive layer 4310 includes a portion functioning as the first scan line 118 and a portion functioning as a gate electrode of the switching transistor 4301. A conductive layer 4311 includes a portion functioning as the signal line 117 and a portion functioning as a first electrode of the first switching transistor 4301. A conductive layer 4312 includes a portion functioning as a second electrode of the first switching transistor 4301, a portion functioning as the first electrode of the capacitor 115, and a portion functioning as a first electrode of the second switching transistor 4302. A conductive layer 4313 includes a portion functioning as a gate electrode of the second switching transistor 4302, and is connected to the second scan line 119 through a wiring 4314. A conductive layer 4315 includes a portion functioning as the first potential supply line 122 and a second electrode of the second switching transistor 4302. A conductive layer 4316 includes a portion functioning as the gate electrode of the transistor 110, and is connected to the conductive layer 4312 through a wiring 4317. A conductive layer 4318 includes a portion functioning as the power supply line 124 and a portion functioning as the second electrode of the transistor 110. A conductive layer 4319 includes a portion functioning as the first electrode of the transistor 110, and is connected to a pixel electrode 4344 of a light-emitting element. A conductive layer 4320 includes a portion functioning as a first electrode of the third switching transistor 4303, and is connected to the pixel electrode 4344. A conductive layer 4321 includes a portion functioning as a second electrode of the third switching transistor 4303, and is connected to the second potential supply line 123. A conductive layer 4322 includes a portion functioning as the third scan line 120 and a portion functioning as a gate electrode of the third switching transistor 4303.

Note that among the respective conductive layers, the portions functioning as the gate electrode, the first electrode, and the second electrode of the first switching transistor 4301 are formed to overlap with a semiconductor layer 4333; the portions functioning as the gate electrode, the first electrode, and the second electrode of the second switching transistor 4302 are formed to overlap with a semiconductor layer 4334; and the portions functioning as the gate electrode, the first electrode, and the second electrode of the third switching transistor 4303 are formed to overlap with a semiconductor layer 4335. In addition, the portions functioning as the gate electrode, the first electrode, and the second electrode of the transistor 110 are the portion of conductive layers which are formed to overlap with a semiconductor layer 4336. The capacitor 115 is formed in a portion where the conductive layer 4312 and the pixel electrode 4334 overlap one another.

The conductive layer 4310, the conductive layer 4313, the conductive layer 4316, the conductive layer 4322, the second scan line 119, and the second potential supply line 123 can be formed from the same material and in the same layer. In addition, the semiconductor layer 4333, the semiconductor layer 4334, the semiconductor layer 4335, and the semiconductor layer 4336 can be formed from the same material and in the same layer. Similarly, the conductive layer 4331, the conductive layer 4312, the conductive layer 4315, the conductive layer 4318, the conductive layer 4319, the conductive layer 4320, and the conductive layer 4321 can be formed from the same material and in the same layer. Further, the wirings 4314, 4317, 4323, and 4324 can be formed from the same material and in the same layer as the pixel electrode 4344. Note that the first potential supply line 122 is connected to a first potential supply line of an adjacent pixel with the wiring 4324.

Figure 43:
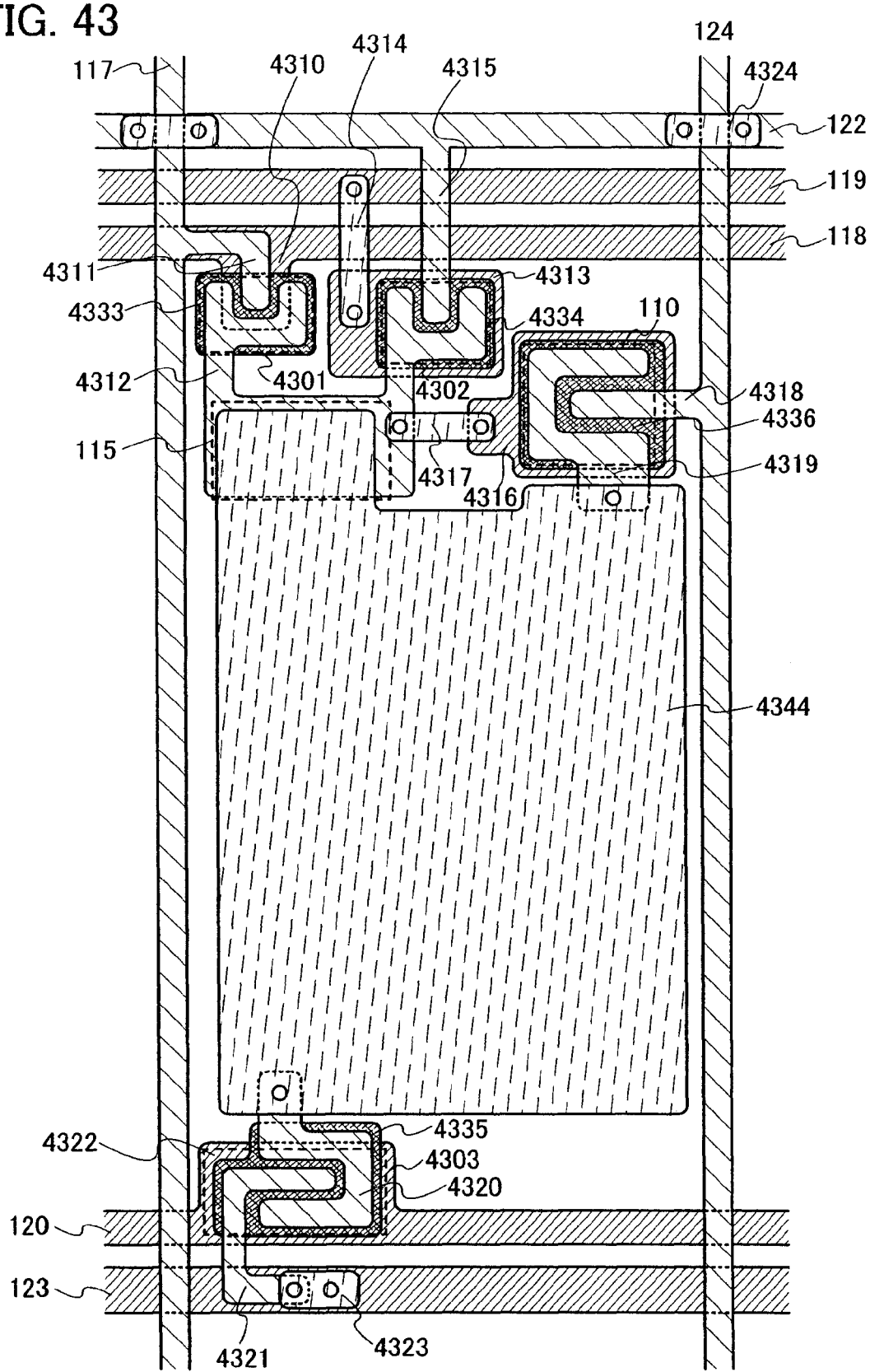
FIG. 43 is a top view of the pixel shown in FIG. 11.
Figure 44:
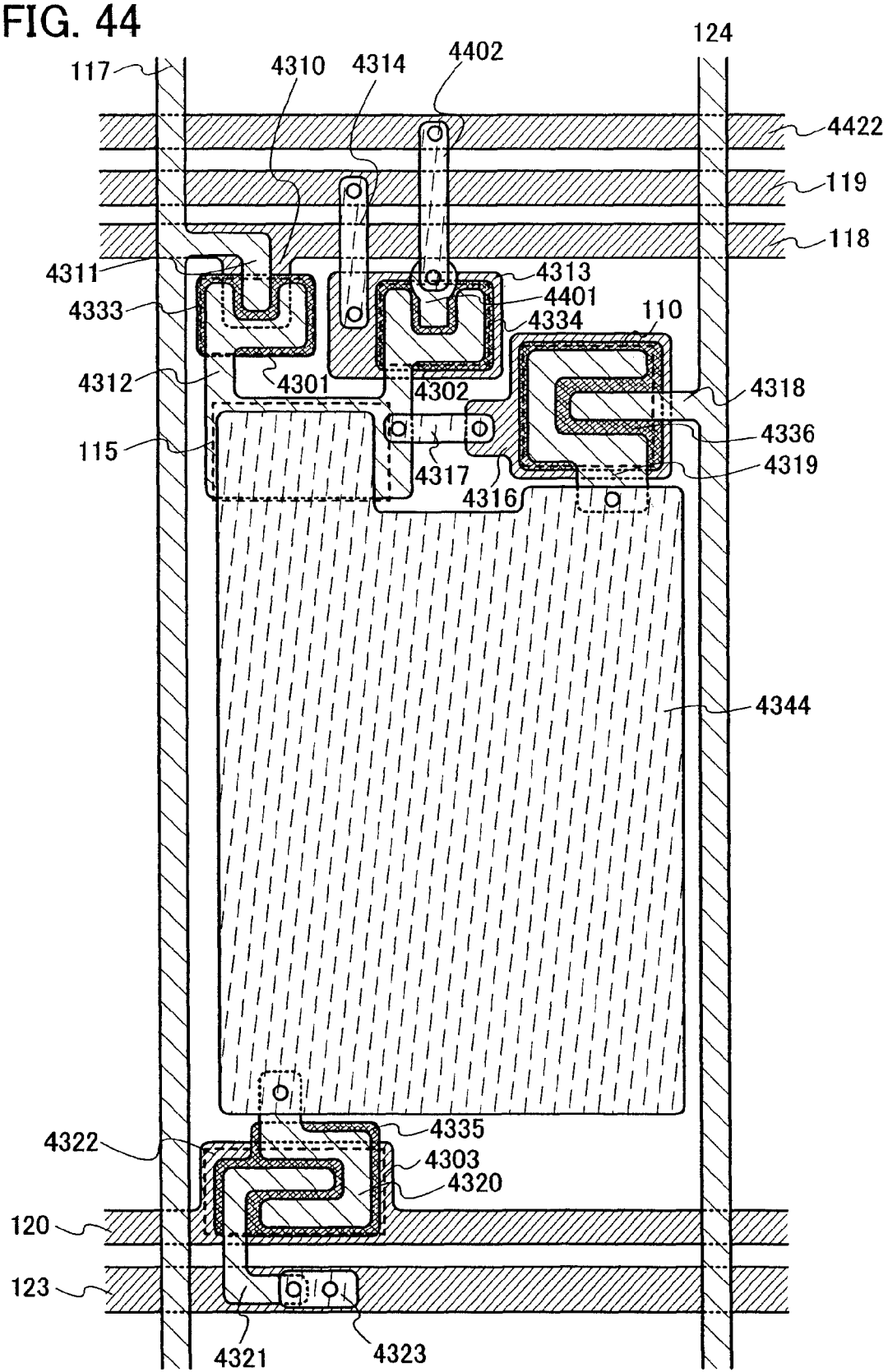
FIG. 44 is a top view of the pixel shown in FIG. 11.
Figure 45:
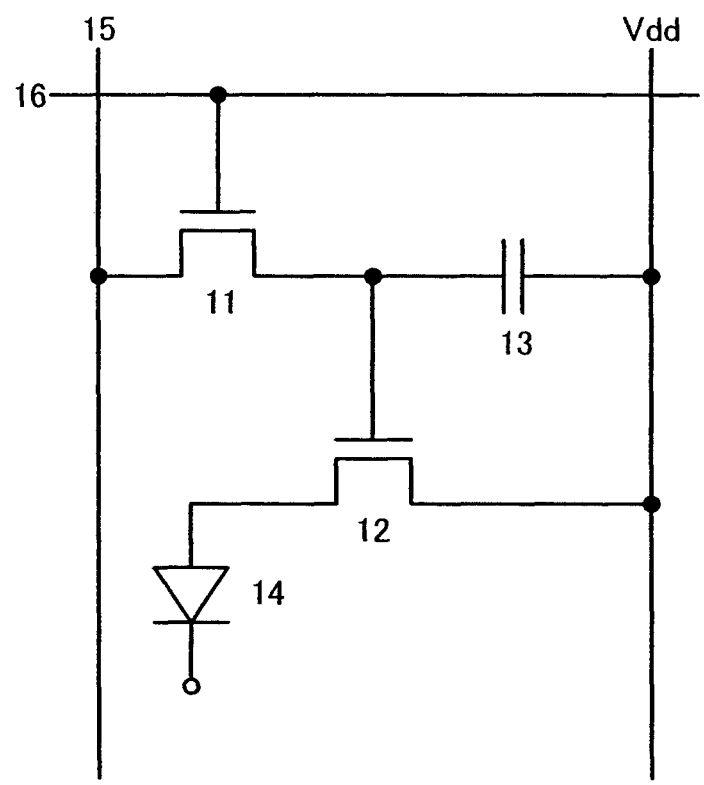
FIG. 45 illustrates a pixel configuration using a conventional technique.
Figure 46:
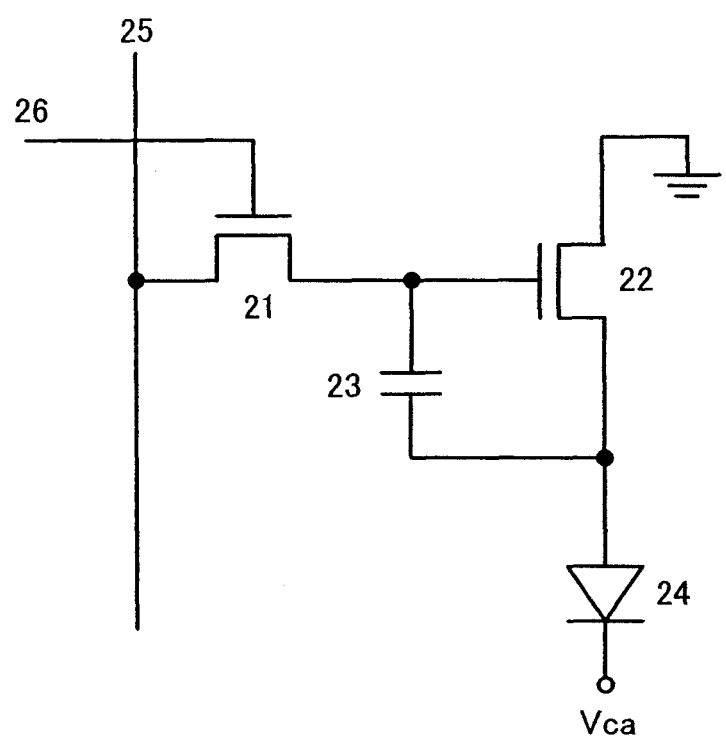
FIG. 46 illustrates a pixel configuration using a conventional technique.
Figure 47:
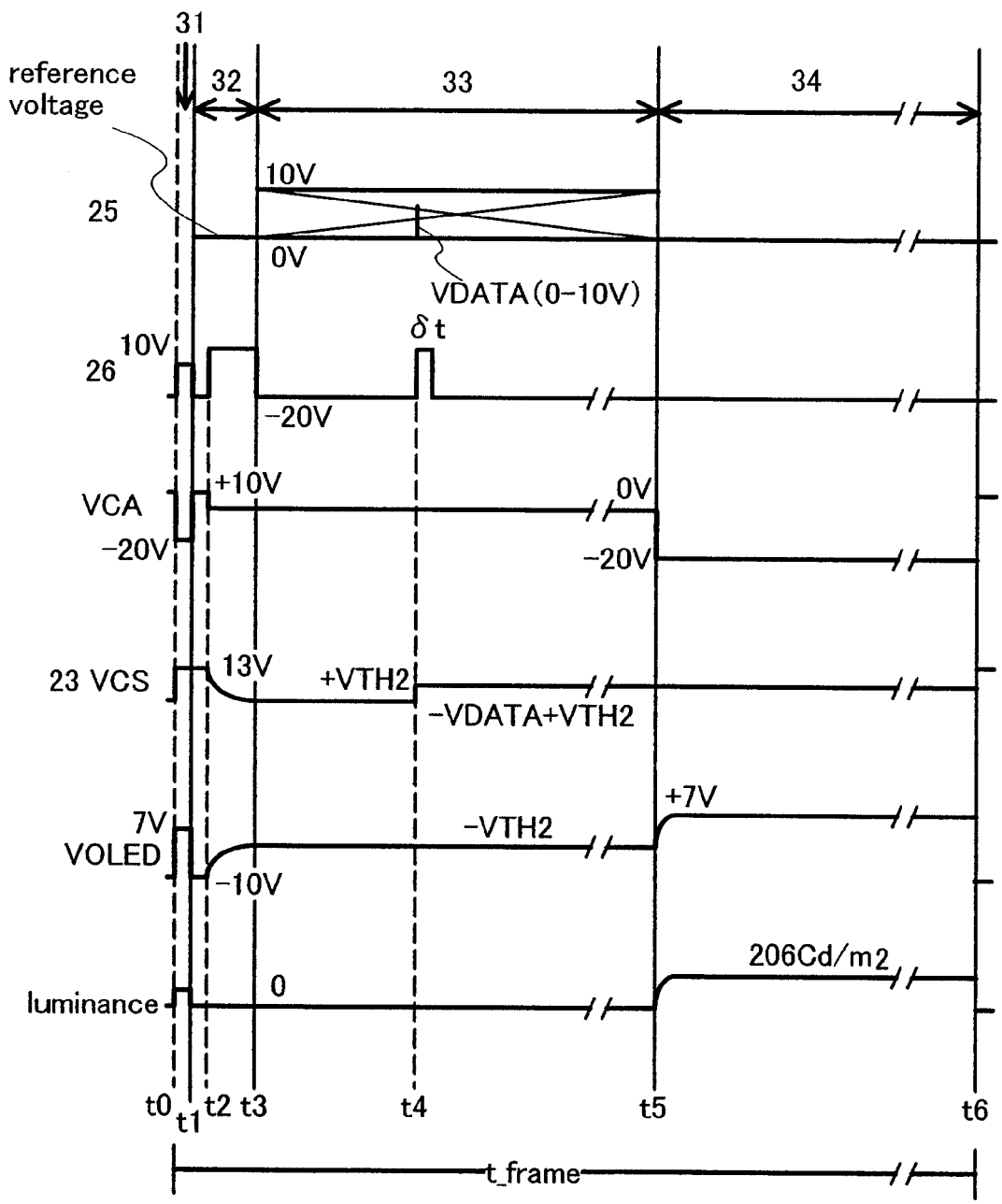
FIG. 47 is a timing chart for operating the pixel using a conventional technique.
Figure 48:
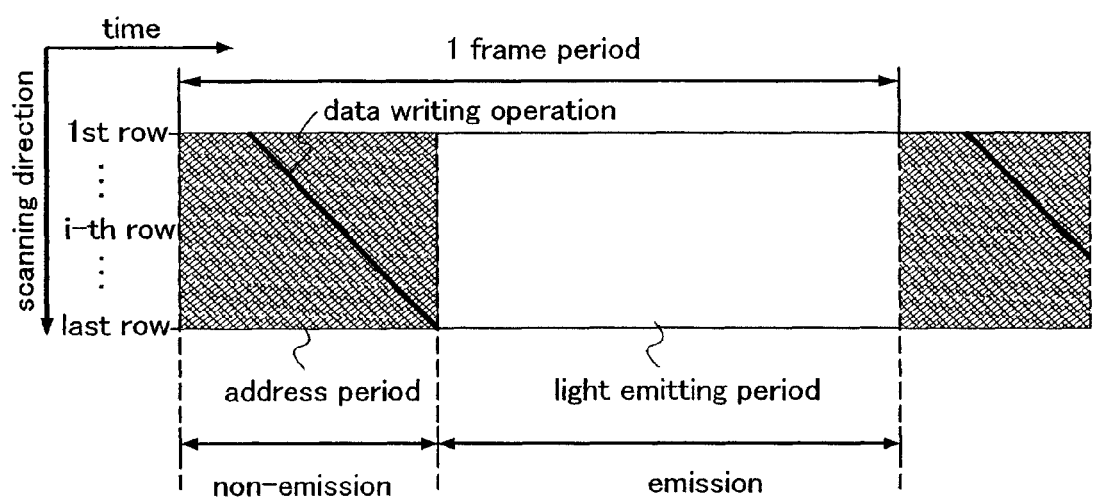
FIG. 48 illustrates the ratio of a light-emitting period to one frame period in the case of using the conventional technique.

Next, FIG. 44 shows a top view of a pixel where the first potential supply line 122 is formed in the different layer from that in FIG. 43. Note that portions common to FIGS. 43 and 44 are denoted by common reference numerals.

A first potential supply line 4222 is formed from the same material and in the same layer as the second scan line 119 and the like. In addition, a portion 4401 functioning as a second electrode of the second switching transistor 4302 is formed from the same material and in the same layer as the conductive layer 4312 and the like, and is connected to a first potential supply line 4422 through a wiring 4402 which is formed from the same material and in the same layer as the pixel electrode 4344. Thus, the top views of the pixel are not limited to those shown in FIGS. 43 and 44.

Furthermore, the pixel shown in this embodiment mode can be applied to the display device of FIG. 9. In that case, start timing of the initialization period can be freely set in respective rows unless data write periods in the respective rows overlap, similarly to Embodiment Mode 1. In addition, since each pixel can emit light except in its address period, the ratio of a light emitting period to one frame period (i.e., duty ratio) can be significantly increased and can be approximately 100%. Therefore, a display device with few luminance variations and a high duty ratio can be provided.

In addition, since a threshold write period can be set long, the threshold voltage of the transistor which controls a current value flowing to the light emitting element can be written into the capacitor more accurately. Therefore, reliability as a display device is improved.

This embodiment mode can be freely combined with the pixel configurations shown in the other embodiment modes besides FIG. 1 described above. That is, the fourth switch can also be omitted in the pixels shown in the other embodiment modes.

Embodiment Mode 3

In this embodiment mode, a pixel having a different configuration from that in Embodiment Mode 1 is described with reference to FIGS. 16A to 16F. Note that portions common to FIGS. 1 and 16A through 16F are denoted by common reference numerals, and thus detailed description of the same portion or a portion having a similar function is omitted.

The pixel shown in FIG. 16A includes a transistor 110, a first switch 111, a second switch 112, a fourth switch 114, a capacitor 115, a light emitting element 116, and a rectifier element 1613. The pixel is connected to a signal line 117, a first scan line 118, a second scan line 119, a fourth scan line 121, a first potential supply line 122, a third scan line 1620, and a power supply line 124.

In the pixel shown in FIG. 16A, the rectifier element 1613 is used as the third switch 113 in FIG. 1, and a second electrode of the capacitor 115, a first electrode of a transistor 110, and a pixel electrode of the light emitting element 116 are connected to the third scan line 1620 through the rectifier element 1613. That is, the rectifier element 1613 is connected so that a current flows from the first electrode of the transistor 110 to the third scan line 1620. Needless to say, the first switch 111, the second switch 112, and the fourth switch 114 may be transistors or the like, as shown in the embodiment mode 1. In addition, the rectifier element 1613 may be a Schottky-barrier diode 1651 shown in FIG. 16B, a PIN diode 1652 shown in FIG. 16C, a PN diode 1653 shown in FIG. 16D, a diode-connected transistor shown in FIG. 16E or 16F, or the like. Note that in the case of using the transistor 1654 or the transistor 1655, the polarity thereof has to be selected as appropriate according to the direction of a current flow.

A current does not flow through the rectifier element 1613 when an H-level signal is input to the third scan line 1620, while a current flows through the rectifier element 1613 when an L-level signal is input. Therefore, when the pixel in FIG. 16A is operated in a similar manner to the pixel in FIG. 1, an L-level signal is input to the third scan line 1620 in the initialization period, and an H-level signal is input to the third scan line 1620 in the periods other than the initialization period. Note that since it is necessary for the h-level signal not only to flow through the rectifier element 1613 but also to lower the potential of the second electrode of the capacitor 115 down to V1−Vth−α (α is an arbitrary positive number), the potential of the L-level signal is set at V1−Vth−α−β (α is an arbitrary positive number). Note that β refers to the threshold voltage of the rectifier element 1613 in the forward bias direction.

In view of the foregoing circumstances, the pixel configuration shown in FIG. 16 can also suppress variations in the current value caused by variations in the threshold voltage of the transistor 110 by operating the pixel in a similar manner to the pixel in FIG. 1. Thus, a current in accordance with luminance data can be supplied to the light emitting element 116, thus variations in luminance can be suppressed. In addition, when the transistor 110 is operated in the saturation region, it is also possible to suppress variations in luminance caused by deterioration of the light emitting element 116. Further, the use of the rectifier element 1613 can reduce the number of wirings, which results in an increase in aperture ratio.

Furthermore, the pixel shown in this embodiment mode can be applied to the display device of FIG. 9. In that case, start timing of the initialization period can be freely set in respective rows unless data write periods in the respective rows overlap, similarly to Embodiment Mode 1. In addition, since each pixel can emit light except in its address period, the ratio of a light emitting period to one frame period (i.e., duty ratio) can be significantly increased and can be approximately 100%. Therefore, a display device with few luminance variations and a high duty ratio can be provided.

In addition, since a threshold write period can be set long, the threshold voltage of the transistor which controls a current value flowing to the light emitting element can be written into the capacitor more accurately. Therefore, reliability as a display device is improved.

This embodiment mode can be freely combined with the pixel configurations shown in the other embodiment modes besides FIG. 1 described above. For example, the fourth switch 114 may be connected between the node 130 and the node 131, or between the first electrode of the transistor 110 and the node 132. Further, the second electrode of the transistor 110 may be connected to the power supply line 124 through the fourth switch 114. That is, the rectifier element 1613 can be applied to the pixels in the other embodiment modes.

Embodiment Mode 4

In this embodiment mode, a pixel having a different configuration from that in Embodiment Mode 1 is described with reference to FIGS. 12 to 15. Note that portions common to Embodiment Mode 1 and this embodiment mode are denoted by common reference numerals, and thus detailed description of the same portion or a portion having a similar function is omitted.

Figure 12:
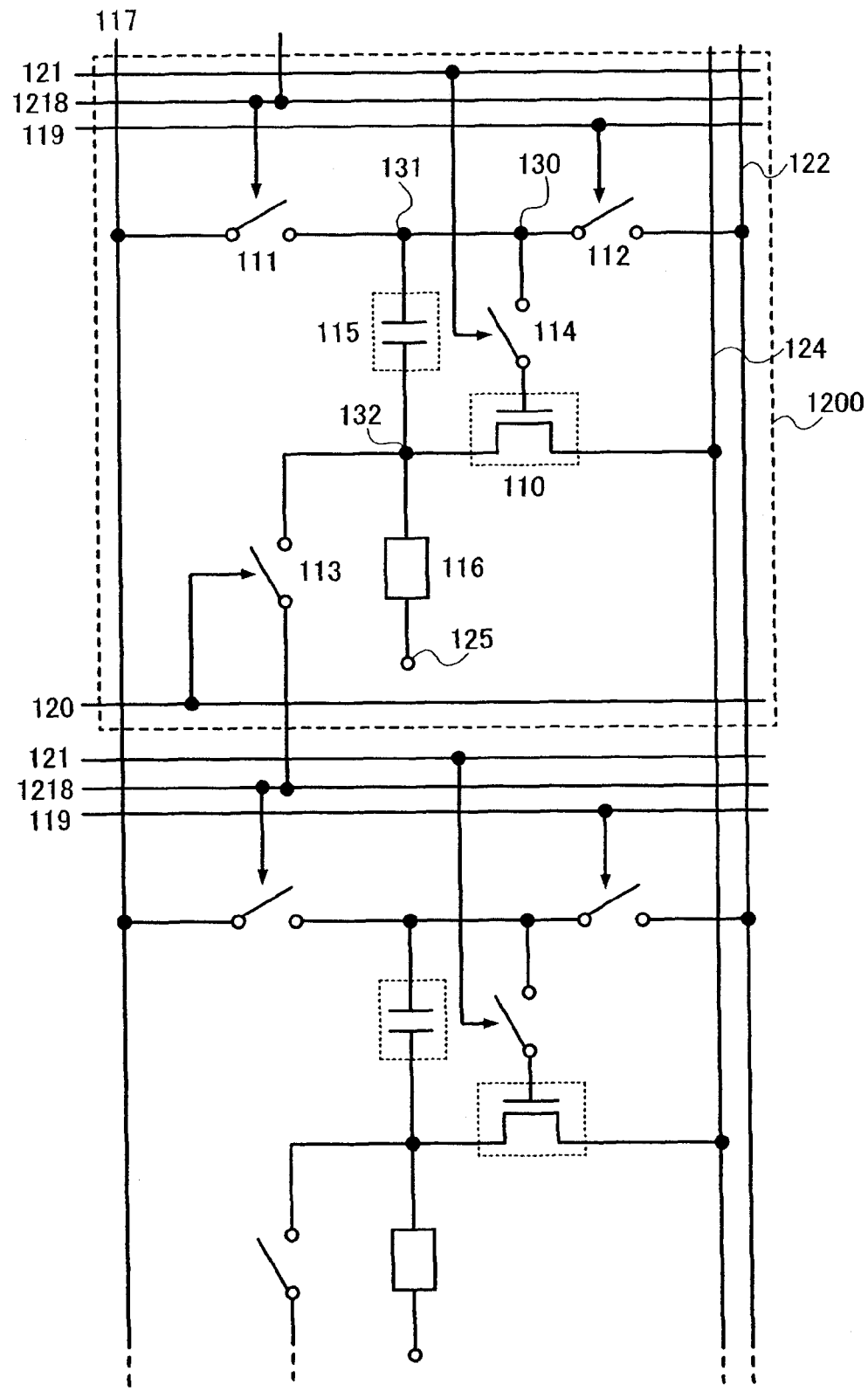
FIG. 12 illustrates a pixel configuration shown in Embodiment Mode 4.

A pixel 1200 shown in FIG. 12 includes a transistor 110, a first switch 111, a second switch 112, a third switch 113, a fourth switch 114, a capacitor 115, and a light emitting element 116. The pixel is connected to a signal line 117, a first scan line 1218, a second scan line 119, a third scan line 120, a fourth scan line 121, a first potential supply line 122, a power supply line 124, and a first scan line 1218 of a next row.

Although the first electrode of the transistor 110 in FIG. 1 is connected to the second potential supply line 123 through the third switch 113 in Embodiment Mode 1, the first electrode of the transistor 110 can be connected to the first scan line 1218 of a next row as shown in FIG. 12. This is because, it is only necessary that a predetermined potential be supplied to the first electrode of the transistor 110 in the initialization period even without using the second potential supply line 123. Therefore, as long as a predetermined potential can be supplied to the first electrode of the transistor 110 from a certain wiring in the initialization period, the wiring for supplying the potential is not required to have a constant potential level at all times. Thus, the first scan line 1218 of the next row can be used instead of the second potential supply line. In this manner, when a wiring of the next row is also used as a wiring for a different purpose, the number of wirings can be reduced and thus the aperture ratio can be improved.

The pixel configuration shown in FIG. 12 can also suppress variations in the current value caused by variations in the threshold voltage of the transistor 110 by operating the pixel in a similar manner to the pixel in FIG. 1. Thus, a current in accordance with luminance data can be supplied to the light emitting element 116, and variations in luminance can be suppressed. Further, power consumption can be reduced since the pixel is operated with the opposite electrode fixed at a constant potential. In addition, although the operation region of the transistor 110 is not particularly limited, the advantageous effect of the invention can be more readily obtained when the transistor 110 is operated in the saturation region. Further, when the transistor 110 is operated in the saturation region, it is also possible to suppress variations in the current value flowing to the transistor 110 caused by deterioration of the light emitting element 116.

Note that a signal from the first scan line 1218 which turns off the first switch 111 has a potential of V1−Vth−α (α is an arbitrary positive number). Therefore, the first switch 111 has to be a switch which is turned off by a potential of V1−Vth−α (α is an arbitrary positive number). In addition, the row of the pixel 1200 has to be operated so that its initialization period does not overlap with the data write period of the pixel row which shares a wiring with the pixel 1200.

Note that when an n-channel transistor is used as the third switch 113, a potential from the third scan line 120 for turning off the third switch 113 may be set lower than V1−Vth−α which is a signal from the first scan line 1218 for turning off the first switch 111. In that case, the gate-source voltage of the transistor in an off state can have a negative value. Thus, current leakage when the third switch 113 is off can be reduced.

Figure 13:
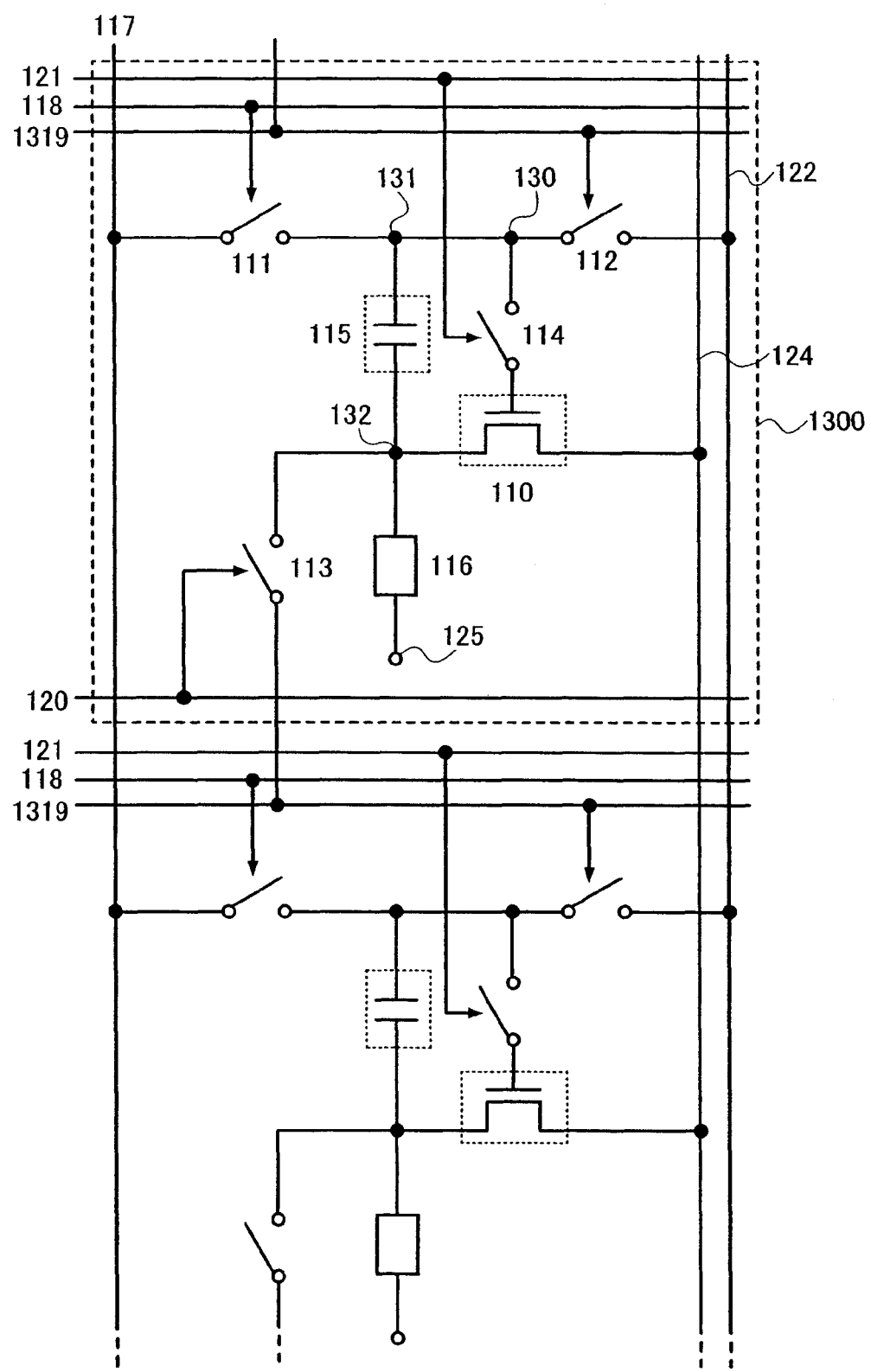
FIG. 13 illustrates a pixel configuration shown in Embodiment Mode 4.

Alternatively, as shown in a pixel 1300 in FIG. 13, a second scan line 1319 of a next row can also be used as the second potential supply line 123 in FIG. 1. The pixel 1300 can also be operated in a similar manner to the pixel in Embodiment Mode 1. Note that a signal from the second scan line 1319 which turns off the second switch 112 has a potential of V1−Vth−α (α is an arbitrary positive number). Therefore, the second switch 112 has to be a switch which is turned off by a potential of V1−Vth−α (α is an arbitrary positive number). In addition, the row of the pixel 1300 has to be operated so that its initialization period does not overlap with the data write period of the pixel row which shares a wiring with the pixel 1300.

Note that when an n-channel transistor is used as the third switch 113, a potential from the third scan line 120 for turning off the third switch 113 may be set lower than V1−Vth−α which is a signal from the second scan line 1319 for turning off the second switch 112. In that case, current leakage when the third switch 113 is off can be reduced.

Figure 14:
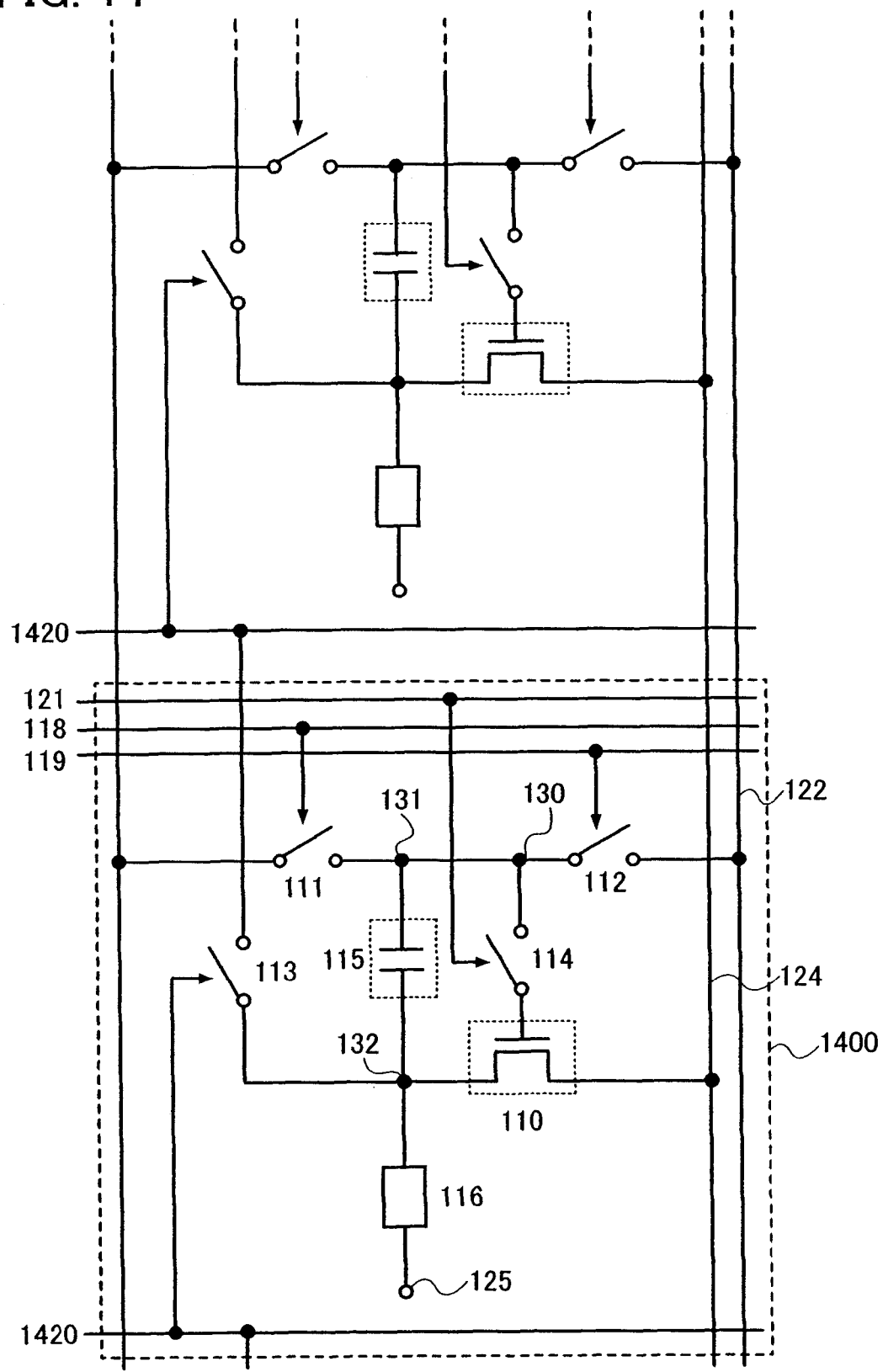
FIG. 14 illustrates a pixel configuration shown in Embodiment Mode 4.

Further, as shown in a pixel 1400 in FIG. 14, a third scan line 1420 of a preceding row can also be used as the second potential supply line 123 in FIG. 1. The pixel 1400 can also be operated in a similar manner to the pixel in Embodiment Mode 1. Note that a signal from the third scan line 1420 which turns off the third switch 113 has a potential of V1−Vth−α (α is an arbitrary positive number). Therefore, the third switch 113 has to be a switch which is turned off by a potential of V1−Vth−α (α is an arbitrary positive number). In addition, the row of the pixel 1400 has to be operated so that its initialization period does not overlap with the initialization period of the pixel row which shares a wiring with the pixel 1400; however, when the initialization period is set shorter than the data write period, it is not a big concern.

In addition, when the pixels in FIGS. 12 to 14 are operated in a similar manner to Embodiment Mode 2, the fourth switch is not particularly required.

Figure 15:
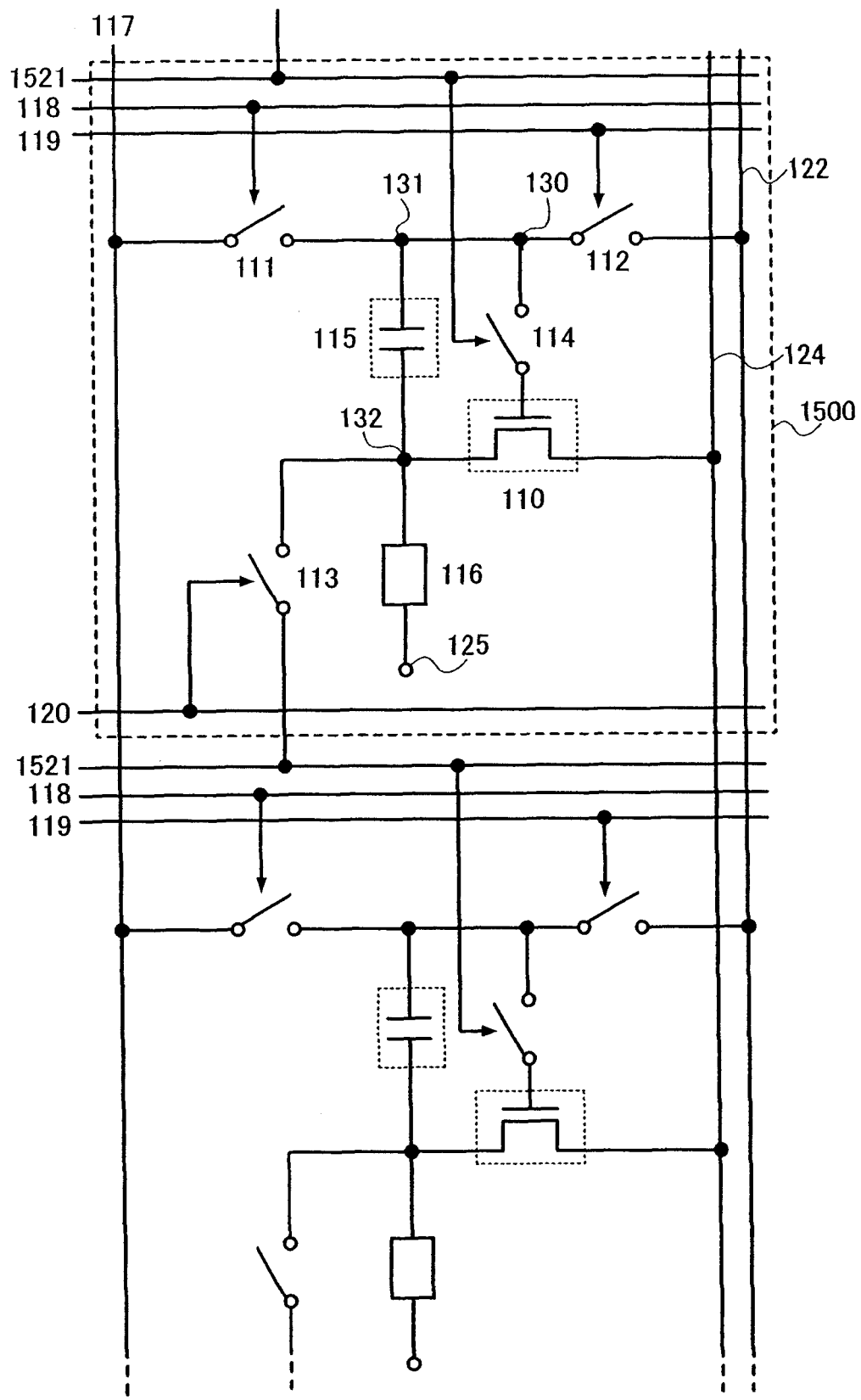
FIG. 15 illustrates a pixel configuration shown in Embodiment Mode 4.

Further, as shown in a pixel 1500 in FIG. 15, a fourth scan line 1521 of a next row can also be used as the second potential supply line 123 in FIG. 1. The pixel 1500 can also be operated in a similar manner to the pixel in Embodiment Mode 1. Note that it is preferable to use the fourth switch 114 which is turned on when a potential of V1−Vth−α (α is an arbitrary positive number) is input to the fourth scan line 1521. In this case, the row of the pixel 1500 has to be operated so that its initialization period does not overlap with the data write period of the pixel row which shares a wiring with the pixel 1500. Further, when the fourth switch 114 is turned off in the initialization period, the pixel 1500 should be operated so that its initialization period does not overlap with the initialization period of the pixel row which shares a wiring with the pixel 1500.

Note that although this embodiment mode describes the case where the scan line of the next row or the preceding row is also used as the second potential supply line 123 in FIG. 1, any other wirings which can supply a potential of V1−Vth−α (α is an arbitrary positive number) in the initialization period can be used instead of the second potential supply line 123.

Furthermore, the pixel shown in this embodiment mode can be applied to the display device of FIG. 9. In the display device, start timing of the initialization period can be freely set in respective rows within the range that the operation of the pixels shown in FIGS. 12 to 15 can be ensured and the data write periods in the respective rows do not overlap. In addition, since each pixel can emit light except in its address period, the ratio of a light emitting period to one frame period (i.e., duty ratio) can be significantly increased and can be approximately 100%. Therefore, a display device with few luminance variations and a high duty ratio can be provided.

In addition, since a threshold write period can be set long, the threshold voltage of the transistor which controls a current value flowing to the light emitting element can be written into the capacitor more accurately. Therefore, reliability as a display device is improved.

Note that the fourth switch 114 is not necessarily required to be connected between the node 130 and the gate electrode of the transistor 110. It may be connected between the node 130 and the node 131 or between the first electrode of the transistor 110 and the node 132. Further, the second electrode of the transistor 110 may be connected to the power supply line 124 through the fourth switch 114.

This embodiment mode can be freely combined with the pixel configurations shown in the other embodiment modes.

Embodiment Mode 5

In this embodiment mode, a pixel having a different configuration from that in Embodiment Mode 1 is described with reference to FIG. 29. Note that portions common to Embodiment Mode 1 and this embodiment mode are denoted by common reference numerals, and thus detailed description of the same portion or a portion having a similar function is omitted.

Figure 29:
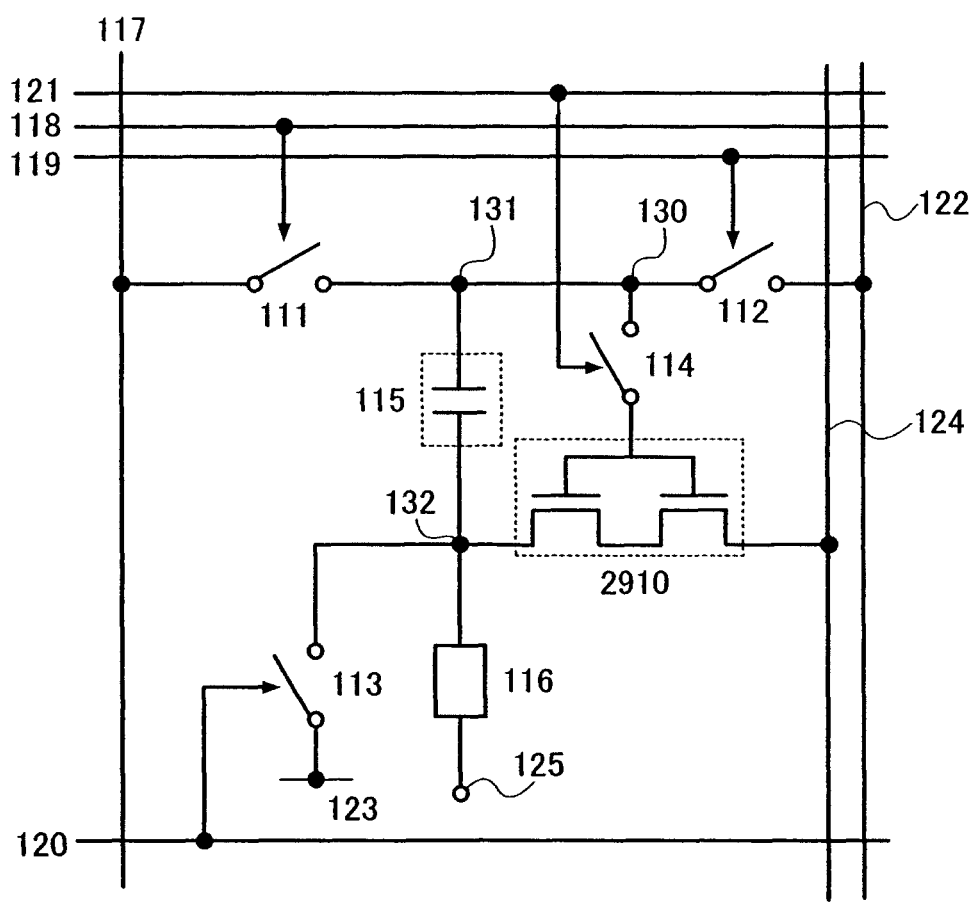
FIG. 29 illustrates a pixel configuration shown in Embodiment Mode 5.

A pixel shown in FIG. 29 includes a transistor 2910, a first switch 111, a second switch 112, a third switch 113, a fourth switch 114, a capacitor 115, and a light emitting element 116. The pixel is connected to a signal line 117, a first scan line 118, a second scan line 119, a third scan line 120, a fourth scan line 121, a first potential supply line 122, a second potential supply line 123, and a power supply line 124.

The transistor 2910 in this embodiment mode is a multi-gate transistor where two transistors are connected in series, and is provided in the same position as the transistor 110 in Embodiment Mode 1. Note that the number of transistors connected in series is not particularly limited.

By operating the pixel shown in FIG. 29 in a similar manner to the pixel in FIG. 1, variations in the current value caused by variations in the threshold voltage of the transistor 2910 can be suppressed. Thus, a current in accordance with luminance data can be supplied to the light emitting element 116, and variations in luminance can be suppressed. In addition, power consumption can be reduced because operation is performed with an opposite electrode fixed at a constant potential. Note that although the operation region of the transistor 2910 is not particularly limited, the advantageous effect of the invention can be more readily obtained when the transistor 2910 is operated in the saturation region.

Further, when the transistor 2910 is operated in the saturation region, it is also possible to suppress variations in the current value flowing to the transistor 2910 caused by deterioration of the light emitting element 116.

When channel widths of the two transistors connected in series are equal to each other, a channel length L of the transistor 2910 in this embodiment mode is equal to the sum of the channel lengths of the two transistors. Thus, a current value which is closer to a constant value can be easily obtained in the saturation region regardless of a drain-source voltage Vds. In particular, the transistor 2910 is effective when it is difficult to manufacture a transistor having a long channel length L. Note that a connection portion of the two transistors functions as a resistor.

Note that it is acceptable as long as the transistor 2910 has a function of controlling a current value supplied to the light emitting element 116, and the kind of the transistor is not particularly limited. Therefore, a thin film transistor (TFT) using a crystalline semiconductor film, a thin film transistor using a non-single crystalline semiconductor film typified by an amorphous silicon film or a polycrystalline silicon film, a transistor formed using a semiconductor substrate or an SOI substrate, a MOS transistor, a junction transistor, a bipolar transistor, a transistor using an organic semiconductor or a carbon nanotube, or other transistors can be used.

In the pixel shown in FIG. 29, transistors can be used as the first switch 111, the second switch 112, and the third switch 113, and the fourth switch 114, similarly to the pixel shown in FIG. 1.

Note that the fourth switch 114 is not necessarily required to be connected between the node 130 and the gate electrode of the transistor 110. It may be connected between the node 130 and the node 131 or between the first electrode of the transistor 110 and the node 132. Further, the second electrode of the transistor 110 may be connected to the power supply line 124 through the fourth switch 114.

Further, the fourth switch 114 is not particularly required when the pixel is operated in a manner to Embodiment Mode 2.

Furthermore, the pixel shown in this embodiment mode can be applied to the display device of FIG. 9. In that case, start timing of the initialization period can be freely set in respective rows unless data write periods in the respective rows overlap, similarly to Embodiment Mode 1. In addition, since each pixel can emit light except in its address period, the ratio of a light emitting period to one frame period (i.e., duty ratio) can be significantly increased and can be approximately 100%. Therefore, a display device with few luminance variations and a high duty ratio can be provided.

In addition, since a threshold write period can be set long, the threshold voltage of the transistor which controls a current value flowing to the light emitting element can be written into the capacitor more accurately. Therefore, reliability as a display device is improved.

Figure 30:
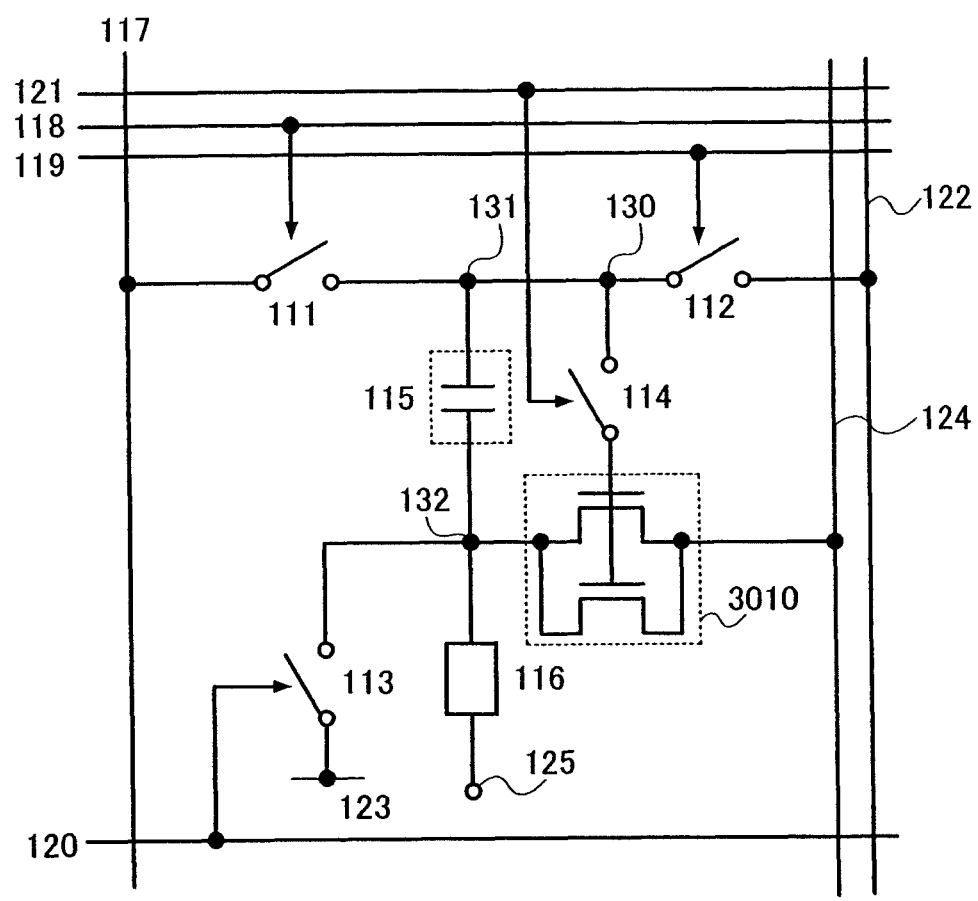
FIG. 30 illustrates a pixel configuration shown in Embodiment Mode 5.

Note that the transistor 2910 is not limited to transistors connected in series, and a configuration shown in FIG. 30 where transistors are connected in parallel may be employed. Such a transistor 3010 can supply a larger current to the light emitting element 116. In addition, since transistor characteristics are averaged by using two transistors connected in parallel, original characteristic variations of the transistors included in the transistor 3010 can be reduced. With the reduced variations, it becomes easier to suppress variations in the current value caused by variations in the threshold voltage of the transistor.

This embodiment mode is not limited to the aforementioned description, and can also be applied to any of the pixel configurations shown in the other embodiment modes. That is, the transistor 2910 or the transistor 3010 can be applied to the pixel configurations shown in the other embodiment modes.

Embodiment Mode 6

In this embodiment mode, a pixel configuration which averages deterioration of transistors over time by periodically switching the transistors which control a current value supplied to a light emitting element in the pixel of the invention is described with reference to FIG. 31.

Figure 31:
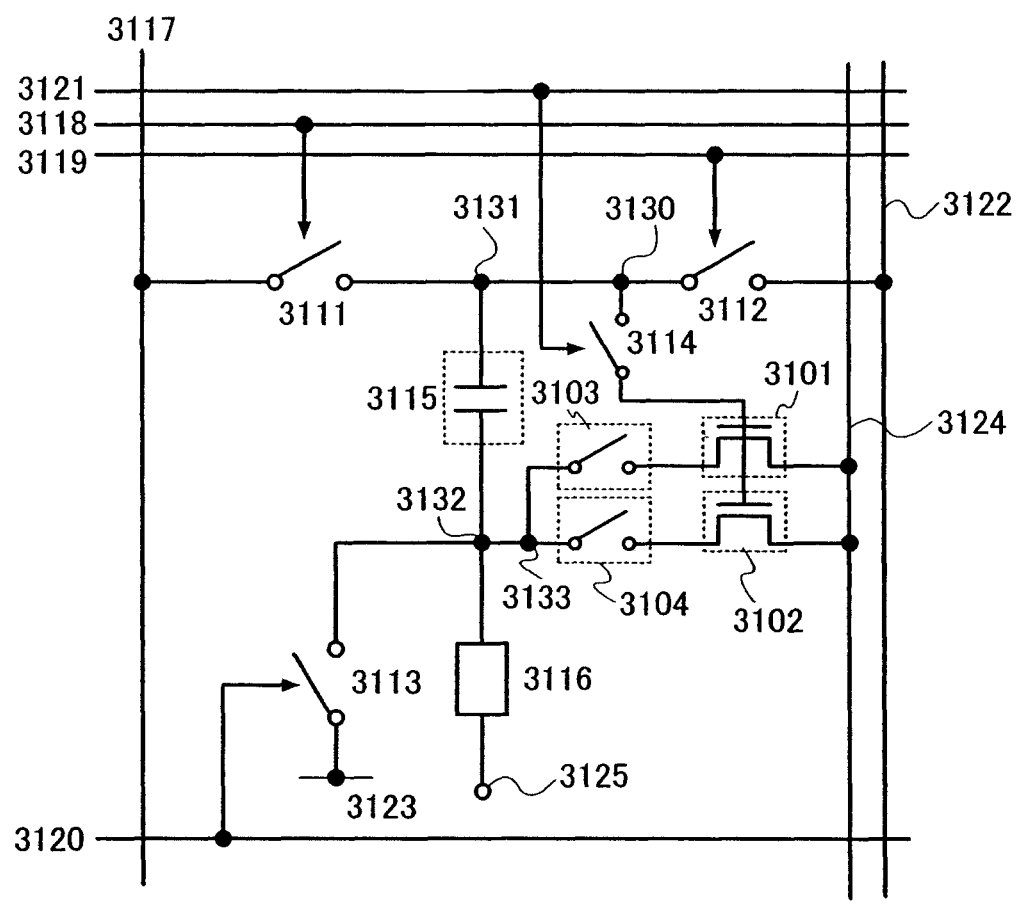
FIG. 31 illustrates a pixel configuration shown in Embodiment Mode 6.

A pixel shown in FIG. 31 includes a first transistor 3101, a second transistor 3102, a first switch 3111, a second switch 3112, a third switch 3113, a fourth switch 3114, a fifth switch 3103, a sixth switch 3104, a capacitor 3115, and a light emitting element 3116. The pixel is connected to a signal line 3117, a first scan line 3118, a second scan line 3119, a third scan line 3120, a fourth scan line 3121, a first potential supply line 3122, a second potential supply line 3123, and a power supply line 3124. In addition, although not shown in FIG. 31, the pixel is also connected to fifth and sixth scan lines which control on/off of the fifth switch 3103 and the sixth switch 3104, respectively. In this embodiment mode, the first transistor 3101 and the second transistor 3102 are n-channel transistors, and each transistor is turned on when a gate-source voltage (Vgs) thereof exceeds the threshold voltage. In addition, a pixel electrode of the light emitting element 3116 is an anode, and an opposite electrode 3125 thereof is a cathode. Note that a gate-source voltage of the transistor is represented by Vgs and a voltage accumulated in the capacitor is represented by Vcs. In addition, the threshold voltage of the first transistor 3101 is represented by Vth1 and the threshold voltage of the second transistor 3102 is denoted by Vth2. The power supply line 3124, the first potential supply line 3122, the second potential supply line 3123, and the signal line 3117 are referred to as a first wiring, a second wiring, a third wiring, and a fourth wiring, respectively.

A first electrode (one of a source electrode and a drain electrode) of the first transistor 3101 is connected to the pixel electrode of the light emitting element 3116 through the fifth switch 3103; a second electrode (the other of the source electrode and the drain electrode) thereof, to the power supply line 3124; and a gate electrode thereof, to the first potential supply line 3122 through the fourth switch 3114 and the second switch 3112. Note that the fourth switch 3114 is connected between the gate electrode of the first transistor 3101 and the second switch 3112. In addition, when a connection point of the fourth switch 3114 and the second switch 3112 is denoted by a node 3130, the node 3130 is connected to the signal line 3117 through the first switch 3111. In addition, the first electrode of the first transistor 3101 is also connected to the second potential supply line 3123 through the fifth switch 3103 and the third switch 3113.

A first electrode (one of a source electrode and a drain electrode) of the second transistor 3102 is connected to the pixel electrode of the light emitting element 3116 through the sixth switch 3104; a second electrode (the other of the source electrode and the sprain electrode) thereof, to the power supply line 3124; and a gate electrode thereof, to the node 3130 through the fourth switch 3114. In addition, the first electrode of the second transistor 3102 is also connected to the second potential supply line 3123 through the sixth switch 3104 and the third switch 3113. Note that the gate electrode of the first transistor 3101 and the gate electrode of the second transistor 3102 are connected to each other. In addition, the first electrode of the first transistor 3101 and the first electrode of the second transistor 3102 are connected to each other through the fifth switch 3103 and the sixth switch 3104. A connection point of the fifth switch 3103 and the sixth switch 3104 is denoted by a node 3133.

Further, the capacitor 3115 is connected between the node 3133 and the node 3130. That is, a first electrode of the capacitor 3115 is connected to the gate electrodes of the first transistor 3101 and the second transistor 3102 through the fourth switch 3114, while a second electrode of the capacitor 3115 is connected to the first electrode of the first transistor 3101 through the fifth switch 3103 and to the first electrode of the second transistor 3102 through the sixth switch 3104. The capacitor 3115 may be formed by sandwiching an insulating film between a wiring, a semiconductor layer, and an electrode or can be omitted by utilizing the gate capacitance of the first transistor 3101 and the second transistor 3102. Note that a connection point of the first electrode of the capacitor 3115, the first switch 3111, and the node 3130 is denoted by a node 3131, and a connection point of the node 3133, a wiring connected to the second electrode of the capacitor 3115, and the pixel electrode of the light emitting element 3116 is denoted by a node 3132.

On/off of the first switch 3111, the second switch 3112, the third switch 3113, and the fourth switch 3114 is controlled by inputting signals to the first scan line 3118, the second scan line 3119, the third scan line 3120, and the fourth scan line 3121, respectively. In FIG. 31, scan lines which control on/off of the fifth switch 3103 and the sixth switch 3104 are omitted.

A signal in accordance with a gray scale level of the pixel which corresponds to a video signal, i.e., a potential in accordance with luminance data is input to the signal line 3117.

Next, the operation of the pixel shown in FIG. 31 is described with reference to a timing chart of FIG. 32. Note that one frame period which corresponds to a period for displaying an image for one screen in FIG. 32 is divided into an initialization period, a threshold write period, a data write period, and a light emitting period.

A potential V1 is input to the opposite electrode 3125 of the light emitting element 3116 and the first potential supply line 3122, while a potential V1−Vth−α (α: an arbitrary positive number) is input to the second potential supply line 3123. Vth corresponds to a higher potential between Vth1 and Vth2. In addition, a potential V2 is input to the power supply line 3124. Here, the potential of the opposite electrode 3125 of the light emitting element 3116 is set equal to the potential of the first potential supply line 3122 for descriptive purposes. However, given that the minimum potential difference which is necessary for the light emitting element 3116 to emit light is represented by $V_{EL}$, it is acceptable as long as the potential of the opposite electrode 3125 is higher than a potential V1−Vth−α−$V_{EL}$. In addition, it is acceptable as long as the potential V2 of the power supply line 3124 is higher than the sum of the potential of the opposite electrode 3125 and the minimum potential difference ($V_{EL}$) which is necessary for the light emitting element 3116 to emit light. However, since the potential of the opposite electrode 3125 is set at V1 here for descriptive purposes, it is acceptable as long as V2 is higher than V1+$V_{EL}$.

Figure 32:
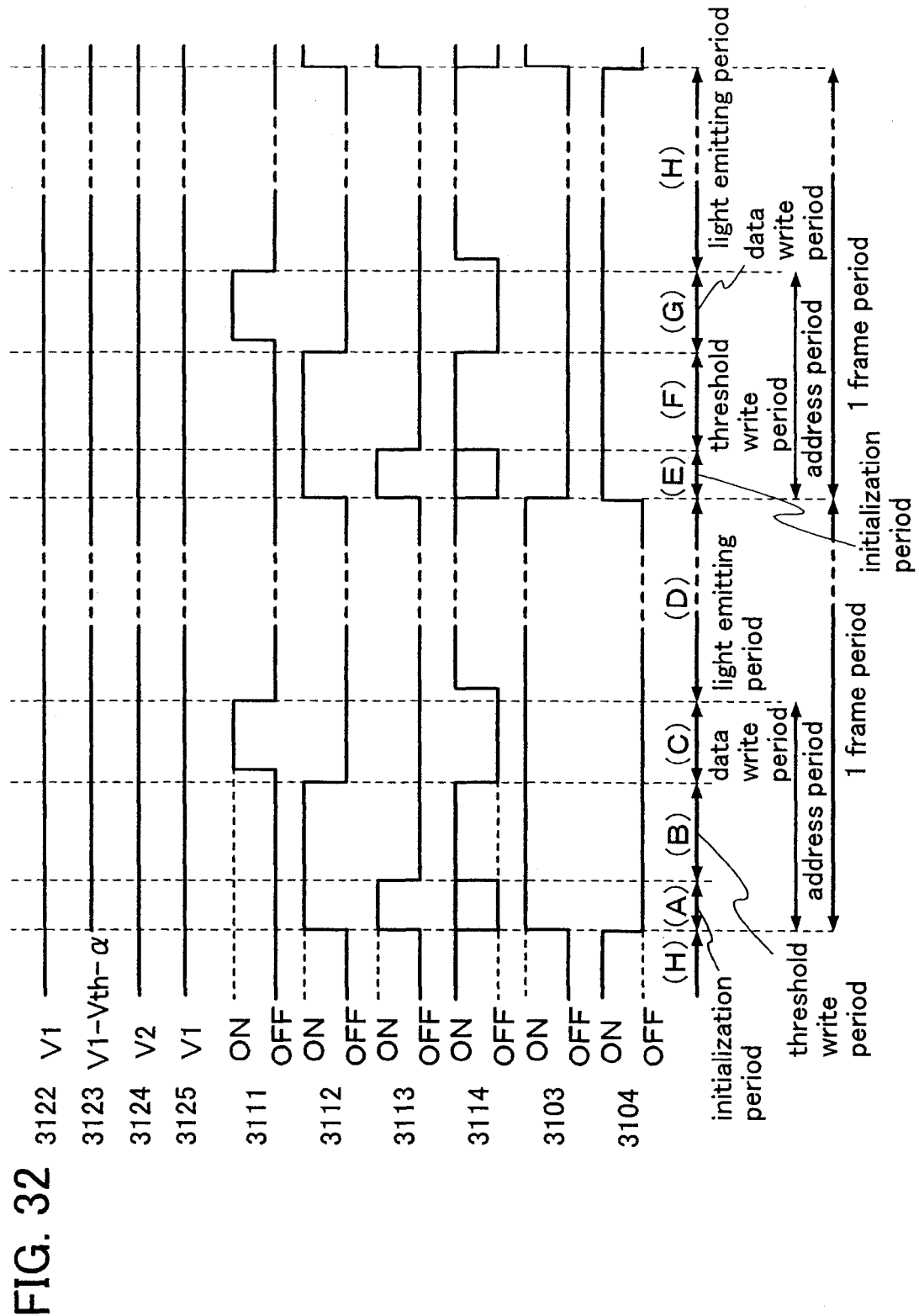
FIG. 32 is a timing chart illustrating the operation of the pixel shown in FIG. 31.

First, in the initialization period shown in (A) in FIG. 32, the first switch 3111 and the sixth switch 3104 are turned off, while the second switch 3112, the third switch 3113, the fourth switch 3114, and the fifth switch 3103 are turned on. At this time, the first electrode of the first transistor 3101 serves as a source electrode, and a potential thereof is V1−Vth−α which is equal to the potential of the second potential supply line 3123. On the other hand, a potential of the gate electrode of the first transistor 3101 is V1. Thus, a gate-source voltage Vgs of the first transistor 3101 is Vth+α and thus the first transistor 3101 is turned on. Then, Vth+α is held in the capacitor 1215 which is provided between the gate electrode and the first electrode of the first transistor 3101. Although the fourth switch 3114 shown herein is in an on state, it may be off state.

Next, the third switch 3113 is turned off in the threshold write period shown in (B) in FIG. 32. Therefore, the potential of the first electrode, i.e., the source electrode of the first transistor 3101 rises gradually and when it reaches V1−Vth1, in other words, when the gate-source voltage Vgs of the first transistor 3101 reaches the threshold voltage (Vth1), the first transistor 3101 is turned off. Thus, the voltage held in the capacitor 3115 becomes Vth1.

In the next data write period shown in (C) in FIG. 32, the second switch 3112 and the fourth switch 3114 are turned off, and then the first switch 3111 is turned on so that a potential (V1+Vdata) in accordance with luminance data is input from the signal line 3117. Note that the first transistor 3101 can be kept in an off state by turning off the fourth switch 3114. Therefore, potential fluctuations of the second electrode of the capacitor 3115, which result from a current supplied from the power supply line 3124 at data writing, can be suppressed. At this time, the voltage Vcs held in the capacitor 3115 can be represented by Vth1+Vdata. Note that when the light emitting element 3116 is controlled not to emit light in the next light-emitting period, a potential of Vdata≤0 is input.

Next, in the light emitting period shown in (D) in FIG. 32, the first switch 3111 is turned off and the fourth switch 3114 is turned on. At this time, the gate-source voltage Vgs of the first transistor 3101 is equal to Vth1+Vdata, and thus the first transistor 3101 is turned on. Then, a current in accordance with luminance data flows to the first transistor 3101 and the light emitting element 3116, so that the light emitting element 3116 emits light.

According to such operation, the current flowing to the light emitting element 3116 can be independent of the threshold voltage (Vth1) of the first transistor 3101 regardless of the operation region of the first transistor 3101, i.e., the saturation region or the linear region.

Furthermore, in an initialization period of a next frame period shown in (E) in FIG. 32, the fifth switch 3103 is turned off, and the second switch 3112, the third switch 3113, the fourth switch 3114, and the sixth switch 3104 are turned on. At this time, the first electrode of the second transistor 3102 serves as a source electrode, and a potential thereof is V1−Vth−α which is equal to the potential of the second potential supply line 3123. On the other hand, a potential of the gate electrode of the second transistor 3102 is V1. Thus, a gate-source voltage Vgs of the second transistor 3102 is Vth+α, and thus the second transistor 3102 is turned on. Then, Vth+α is held in the capacitor 3115 which is provided between the gate electrode and the first electrode of the second transistor 3102. Although the fourth switch 3114 shown herein is in an on state, it may be off state.

Next, in the threshold write period shown in (F) in FIG. 32, the third switch 3113 is turned off. Therefore, the potential of the first electrode, i.e., the source electrode of the second transistor 3102 rises gradually and when it reaches V1−Vth2, in other words, when the gate-source voltage Vgs of the second transistor 3102 reaches the threshold voltage (Vth2), the second transistor 3102 is turned off. Thus, a voltage held in the capacitor 3115 is Vth2.

In the next data write period shown in (G) in FIG. 32, the second switch 3112 and the fourth switch 3114 are turned off, and then the first switch 3111 is turned on so that a potential (V1+Vdata) in accordance with luminance data is input from the signal line 3117. Note that the second transistor 3102 can be kept in an off state by turning off the fourth switch 3114. Therefore, potential fluctuations of the second electrode of the capacitor 3115, which result from a current supplied from the power supply line 3124 at data writing, can be suppressed. At this time, the voltage Vcs held in the capacitor 3115 can be represented by Vth2+Vdata.

Next, in the light emitting period shown in (H) in FIG. 32, the first switch 3111 is turned off and the fourth switch 3114 is turned on. At this time, the gate-source voltage Vgs of the second transistor 3102 is equal to Vth2+Vdata, and thus the second transistor 3102 is turned on. Then, a current in accordance with luminance data flows to the second transistor 3102 and the light emitting element 3116, so that the light emitting element 3116 emits light.

According to such operation, the current flowing to the light emitting element 3116 can be independent of the threshold voltage (Vth2) regardless of the operation region of the second transistor 3102, i.e., the saturation region or the linear region.

Therefore, by controlling a current supplied to the light emitting element 3116 using either the first transistor 3101 or the second transistor 3102, variations in the current value caused by variations in the threshold voltage of the transistor can be suppressed and a current value in accordance with luminance data can be supplied to the light emitting element 3116. Note that by reducing a load on each transistor by switching between the first transistor 3101 and the second transistor 3102, changes in the threshold voltage of the transistor over time can be reduced.

Accordingly, variations in luminance caused by variations in the threshold voltage of the first transistor 3101 and the second transistor 3102 can be suppressed. In addition, since the potential of the opposite electrode is fixed, power consumption can be reduced.

Further, in the case of operating the first transistor 3101 and the second transistor 3102 in the saturation region, it is also possible to suppress variations in current flowing to each transistor caused by deterioration of the light emitting element 3116.

In the case of operating the first transistor 3101 and the second transistor 3102 in the saturation region, the channel lengths L of these transistors are preferably long.

In addition, since a reverse bias voltage is applied to the light emitting element 3116 in the initialization period, a shorted portion of the light emitting element can be insulated and deterioration of the light emitting element can be suppressed. Thus, the lifetime of the light emitting element can be extended.

Note that since variations in the current value caused by variations in the threshold voltage of the transistor can be suppressed, a supply destination of the current controlled by the transistor is not particularly limited. Therefore, the light emitting element 3116 shown in FIG. 31 can be an EL element (an organic EL element, an inorganic EL element, or an EL element containing an organic material and an inorganic material), an electron emitting element, a liquid crystal element, electronic ink, or the like.

In addition, it is acceptable as long as the first transistor 3101 and the second transistor 3102 have a function of controlling a current value supplied to the light emitting element 3116, and the kind of the transistors is not particularly limited. Therefore, a thin film transistor (TFT) using a crystalline semiconductor film, a thin film transistor using a non-single crystalline semiconductor film typified by an amorphous silicon film or a polycrystalline silicon film, a transistor formed using a semiconductor substrate or an SOI substrate, a MOS transistor, a junction transistor, a bipolar transistor, a transistor using an organic semiconductor or a carbon nanotube, or other transistors can be used.

The first switch 3111 is selected in the timing of inputting a signal in accordance with a gray scale level of the pixel to the capacitor. The second switch 3112 is selected in the timing of applying a predetermined potential to the gate electrode of the first transistor 3101 or the second transistor 3102. The third switch 3113 in selected in the timing of applying a predetermined potential for initializing a potential written in the capacitor 3115. The fourth switch 3114 cuts a connection between the gate electrode of the first transistor 3101 or the second transistor 3102 and the capacitor 3115. Therefore, the first switch 3111, the second switch 3112, the third switch 3113, and the fourth switch 3114 are not particularly limited as long as they have the above functions. For example, each of the switches may be a transistor, a diode, or a logic circuit combining them. The fifth switch 3103 and the sixth switch 3104 are not particularly limited either, and each of them may be a transistor, a diode, or a logic circuit combining them.

In the case of using n-channel transistors for the first switch 3111, the second switch 3112, the third switch 3113, the fourth switch 3114, the fifth switch 3103, and the sixth switch 3104, the pixel can be formed using only n-channel transistors; therefore, the manufacturing process can be simplified. In addition, a non-crystalline semiconductor such as an amorphous semiconductor or a semi-amorphous semiconductor (also referred to as a microcrystalline semiconductor) can be used for a semiconductor layer of each transistor included in the pixel. For example, amorphous silicon (a-Si:H) can be used as the amorphous semiconductor. By using such a non-crystalline semiconductor, the manufacturing process can further be simplified. Accordingly, a reduction in manufacturing cost and an improvement in yield can be achieved.

Note that in the case of using transistors for the first switch 3111, the second switch 3112, the third switch 3113, the fourth switch 3114, the fifth switch 3103, and the sixth transistor 3104, the polarity (conductivity type) of the transistors is not particularly limited. However, it is desirable to use a transistor having a characteristic of smaller off-current.

Figure 37:
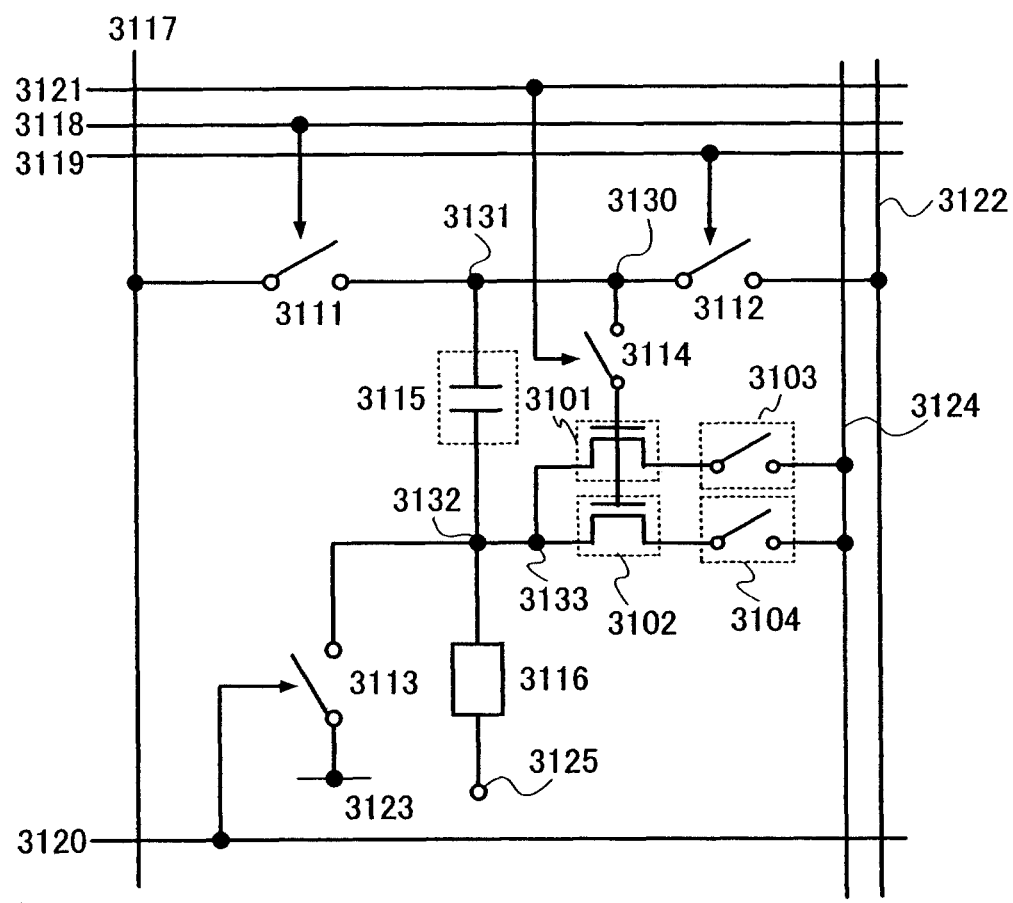
FIG. 37 illustrates a pixel configuration shown in Embodiment Mode 6.

It is also possible to switch the position of the first transistor 3101 and the fifth switch 3103 as well as the position of the second transistor 3102 and the sixth switch 3104 as shown in FIG. 37. That is, the first electrodes of the first transistor 3101 and the second transistor 3102 are connected to the gate electrodes of the first transistor 3101 and the second transistor 3102 through the capacitor 3115. The second electrode of the first transistor 3101 is connected to the power supply line 3124 through the fifth switch 3103, and the second electrode of the second transistor 3102 is connected to the power supply line 3124 through the sixth switch 3104.

FIGS. 31 and 37 show the examples where the number of elements arranged in parallel is two, using a transistor and a switch as one set, that is, using the first transistor 3101 and the fifth switch 3103 as a set, and the second transistor 3102 and the sixth switch 3104 as a set. However, the number of elements arranged in parallel is not particularly limited.

Note that the fourth switch 3114 is necessarily required to be provided between the node 3130 and the gate electrodes of the first transistor 3101 and the second transistor 3102. It may be connected between the node 3130 and the node 3131 or between the node 3133 and the node 3132.

Figure 38:
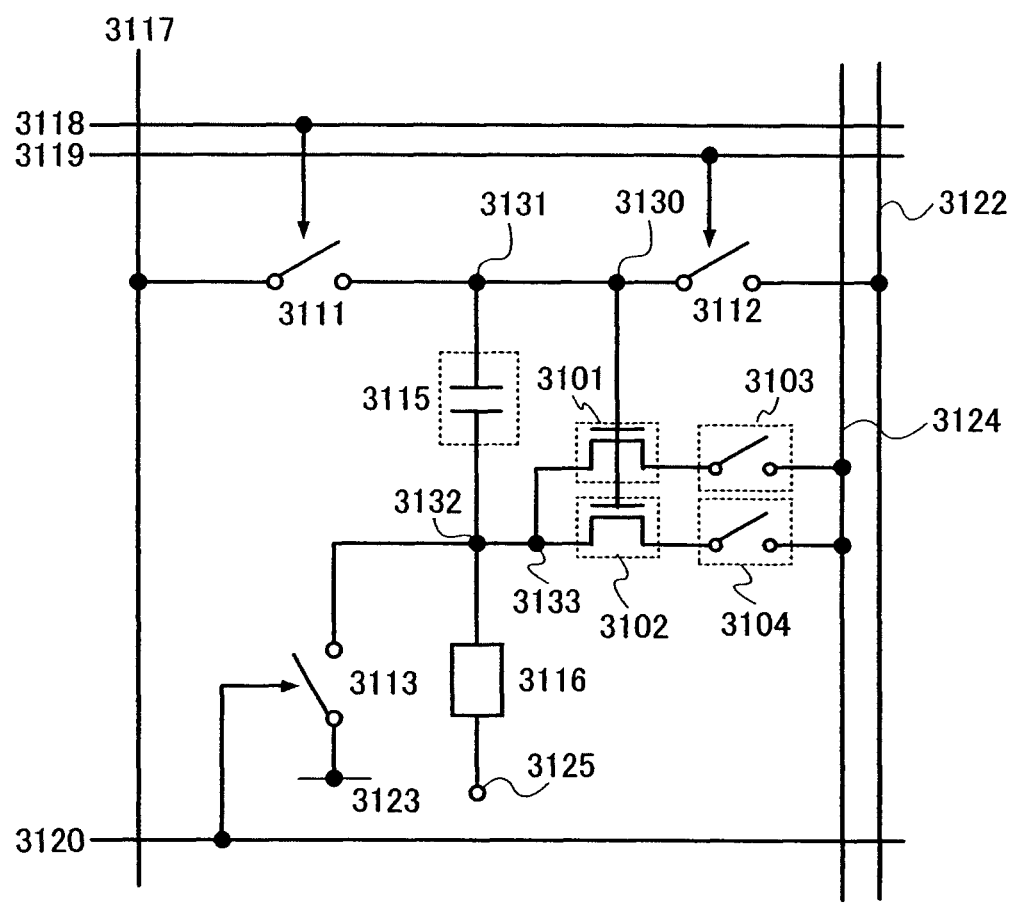
FIG. 38 illustrates a pixel configuration shown in Embodiment Mode 6.

Alternatively, the fourth switch 3114 may be omitted as shown in FIG. 38. In the pixel shown in this embodiment mode, a current supplied to the node 3133 from the power supply line 3124 can be stopped without using the fourth switch 3114 but, instead, by turning off the fifth switch 3103 and the sixth switch 3104 in the data write period. Therefore, potential fluctuations of the second electrode of the capacitor 3115 can be suppressed, and thus, a voltage of Vth1+Vdata or Vth2+Vdata can be held in the capacitor 3115 without providing the fourth switch 3114. Needless to say, the same can be said for a configuration shown in FIG. 31 where the fifth switch 3103 is connected between the first electrode of the first transistor 3101 and the node 3133 and the sixth switch 3104 is connected between the first electrode of the second transistor 3102 and the node 3133.

In addition, by turning off both the fifth switch 3103 and the sixth switch 3104 in the light emitting period, a non-light emitting state can be forcibly produced. Such operation makes it possible to freely set the light emitting period. In addition, by inserting black display, afterimages can be made less easily perceived and moving image characteristics can be increased.

Furthermore, the pixel shown in this embodiment mode can be applied to the display device of FIG. 9. In that case, start timing of the initialization period can be freely set in respective rows unless data write periods in the respective rows overlap, similarly to Embodiment Mode 1. In addition, since each pixel can emit light except in its address period, the ratio of a light emitting period to one frame period (i.e., duty ratio) can be significantly increased and can be approximately 100%. Therefore, a display device with few luminance variations and a high duty ratio can be provided.

In addition, since a threshold write period can be set long, the threshold voltage of the transistor which controls a current value flowing to the light emitting element can be written into the capacitor more accurately. Therefore, reliability as a display device is improved.

Note that it is possible to use a wiring of another row as the second potential supply line 3123 similarly to Embodiment Mode 4. In addition, each of the first transistor 3101 and the second transistor 3102 may be a multi-gate transistor where two transistors are connected in series or may have a configuration where transistors are connected in parallel. This embodiment mode can be applied not only to such cases but also to the pixel configurations shown in Embodiment Modes 1 to 5.

Embodiment Mode 7

In this embodiment mode, an example where a p-channel transistor is used as a transistor for controlling a current value supplied to a light emitting element is described with reference to FIG. 39.

Figure 39:
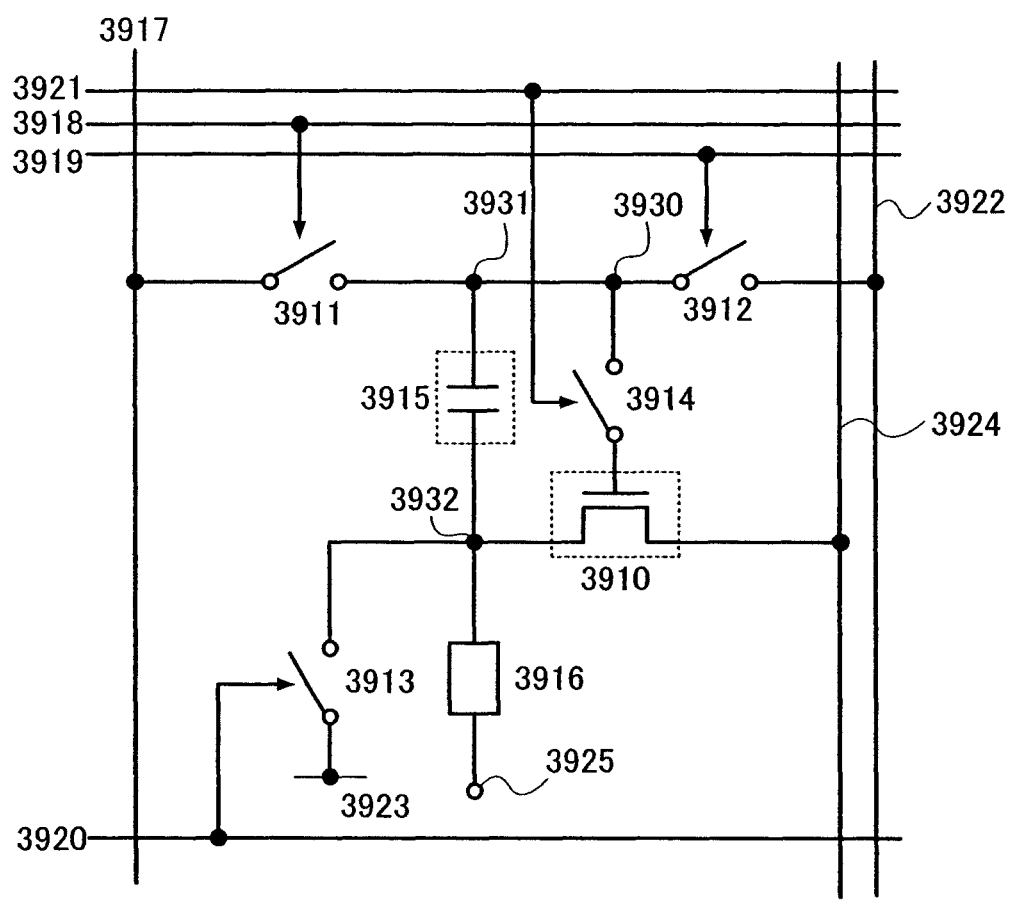
FIG. 39 illustrates a pixel configuration shown in Embodiment Mode 7.

The pixel shown in FIG. 39 includes a transistor 3910, a first switch 3911, a second switch 3912, a third switch 3913, a fourth switch 3914, a capacitor 3915, and a light emitting element 3916. The pixel is connected to a signal line 3917, a first scan line 3918, a second scan line 3919, a third scan line 3920, a fourth scan line 3921, a first potential supply line 3922, a second potential supply line 3923, and a power supply line 3924. In this embodiment mode, the transistor 3910 is a p-channel transistor which is turned on when the absolute value of the gate-source voltage (|Vgs|) thereof exceeds the absolute value of the threshold voltage (|Vth|) (when Vgs becomes lower than Vth). In addition, a pixel electrode of the light emitting element 3916 is a cathode and an opposite electrode 3925 thereof is an anode. Note that the absolute value of the gate-source voltage of the transistor is represented by |Vgs|, and the absolute value of the threshold voltage of the transistor is represented by |Vth|. In addition, the power supply line 3924, the first potential supply line 3922, the second potential supply line 3923, and the signal line 3917 are also referred to as a first wiring, a second wiring, a third wiring, and a fourth wiring, respectively.

A first electrode (one of a source electrode and a drain electrode) of the transistor 3910 is connected to the pixel electrode of the light emitting element 3916; a second electrode (the other of the source electrode and the drain electrode) thereof, to the power supply line 3924; and a gate electrode thereof, to the first potential supply line 3922 through the fourth switch 3914 and the second switch 3912. Note that the fourth switch 3914 is connected between the gate electrode of the transistor 3910 and the second switch 3912. When a connection point of the fourth switch 3914 and the second switch 3912 is denoted by a node 3930, the node 3930 is connected to the signal line 3917 through the first switch 3911. In addition, the first electrode of the transistor 3910 is also connected to the second potential supply line 3923 through the third switch 3913.

Further, the capacitor 3915 is connected between the node 3930 and the first electrode of the transistor 3910. That is, a first electrode of the capacitor 3915 is connected to the gate electrode of the transistor 3910 through the fourth switch 3914, while a second electrode of the capacitor 3915 is connected to the first electrode of the transistor 3910. The capacitor 3915 may be formed by sandwiching an insulating film between a wiring, a semiconductor layer, and an electrode or can be omitted by utilizing the gate capacitance of the transistor 3910. A connection point between the node 3930, the first switch 3911, and the first electrode of the capacitor 3931 is denoted by a node 3931, while a connection point between the first electrode of the transistor 3910, the second electrode of the capacitor 3915, and the pixel electrode of the light-emitting element 3916 is denoted by a node 3932.

Note that on/off of the first switch 3911, the second switch 3912, the third switch 3913, and the fourth switch 3914 is controlled by inputting signals to the first scan line 3918, the second scan line 3919, the third scan line 3920, and the fourth scan line 3921, respectively.

A signal in accordance with a gray scale level of the pixel which corresponds to a video signal, i.e., a potential in accordance with luminance data is input to the signal line 3917.

Next, operation of the pixel shown in FIG. 39 is described with reference to a timing chart in FIG. 40 and FIGS. 41A to 41D. Note that one frame period which corresponds to a period for displaying an image for one screen is divided into an initialization period, a threshold write period, a data write period, and a light emitting period in FIG. 40. The initialization period, the threshold write period, and the data write period are collectively referred to as an address period. The length of one frame period is not particularly limited, but is preferably 1/60 second or less so that an image viewer does not perceive flickers.

A potential V1 is input to the opposite electrode 3925 of the light emitting element 3916 and the first potential supply line 3922, while a potential V1+|Vth|+α (α: an arbitrary positive number) is input to the second potential supply line 3923. In addition, a potential V2 is input to the power supply line 3924.

Here, the potential of the opposite electrode 3925 of the light emitting element 3916 is set equal to the potential of the first potential supply line 3922 for descriptive purposes. However, given that the minimum potential difference which is necessary for the light emitting element 3916 to emit light is represented by $V_{EL}$, it is acceptable as long as the potential of the opposite electrode 3925 is lower than a potential V1+|Vth|+α+$V_{EL}$. In addition, it is acceptable as long as the potential V2 of the power supply line 3924 is lower than a potential which is obtained by subtracting the minimum potential difference ($V_{EL}$) which is necessary for the light emitting element 3916 to emit light from the potential of the opposite electrode 3925. However, since the potential of the opposite electrode 3925 is set at V1 here for descriptive purposes, it is acceptable as long as V2 is lower than V1−$V_{EL}$.

Figure 40:
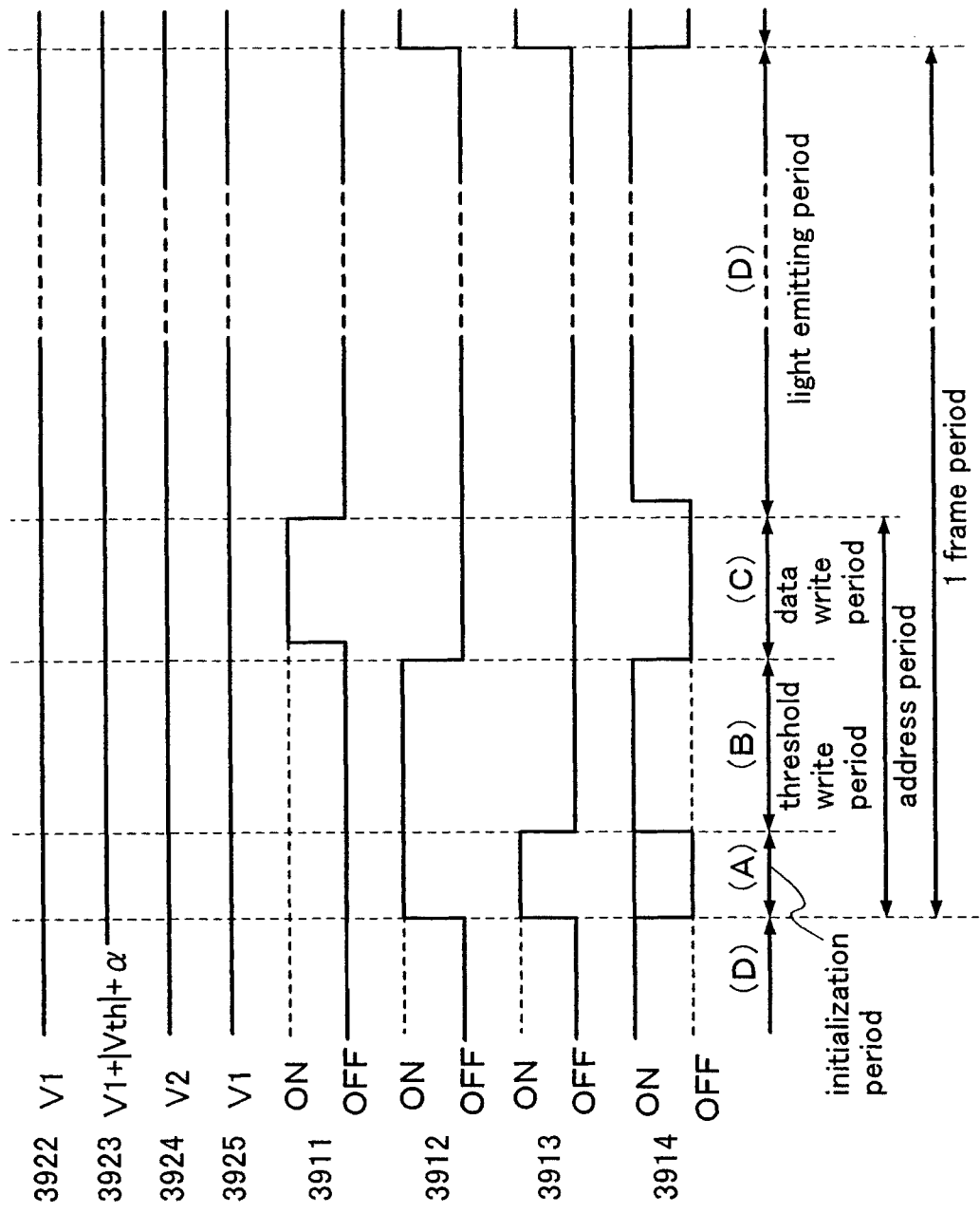
FIG. 40 is a timing chart illustrating the operation of the pixel shown in FIG. 39.
Figure 41A:
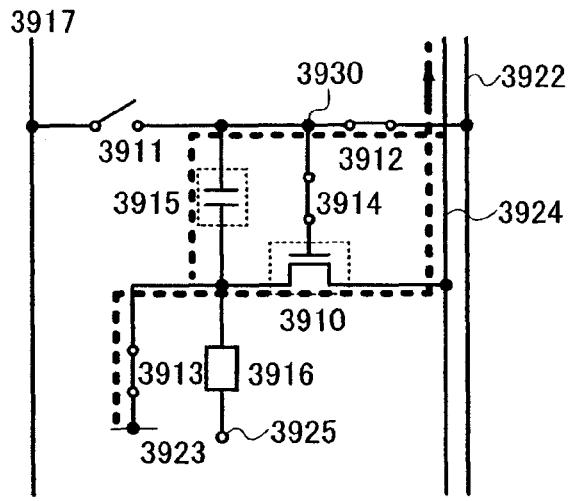
FIGS. 41A to 41D illustrate the operation of the pixel shown in FIG. 39.

First, the first switch 3911 is turned off while the second switch 3912, the third switch 3913, and the fourth switch 3914 are turned on in the initialization period as shown in (A) in FIG. 40 and FIG. 41A. At this time, the first electrode of the transistor 3910 serves as a source electrode, and a potential thereof is V1+|Vth|+α which is equal to the potential of the second potential supply line 3923. On the other hand, a potential of the gate electrode of the transistor 3910 is V1. Thus, the absolute value of the gate-source voltage |Vgs| of the transistor 3910 is |Vth|+α, and thus the transistor 3910 is turned on. Then, |Vth|+α is held in the capacitor 3915 which is provided between the gate electrode and the first electrode of the transistor 3910. Although the fourth switch 3914 shown herein is in an on state, it may be turned off.

Figure 41B:
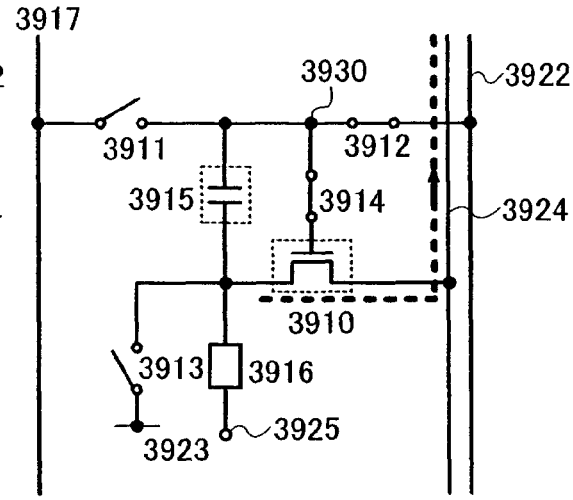

Next, the third switch 3913 is turned off in the threshold write period shown in (B) in FIG. 40 and FIG. 41B. Therefore, the potential of the first electrode, i.e., the source electrode of the transistor 3910 rises gradually and when it reaches V1+|Vth|, the transistor 3910 is turned off. Thus, the voltage held in the capacitor 3915 becomes |Vth|.

Figure 41C:
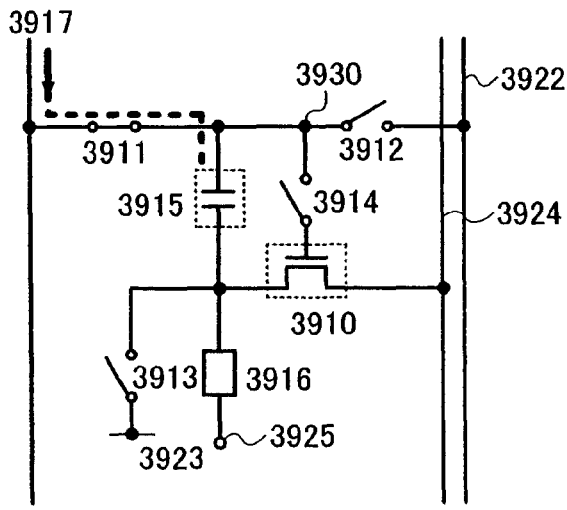

In the next data write period shown in (C) in FIG. 40 and FIG. 41C, the second switch 3912 and the fourth switch 3914 are turned off, and then the first switch 3911 is turned on so that a potential (V1−Vdata) in accordance with luminance data is input from the signal line 3917. Note that the transistor 3910 can be kept in an off state by turning off the fourth switch 3914. Therefore, potential fluctuations of the second electrode of the capacitor 3915, which result from a current supplied from the power supply line 3924 at data writing, can be suppressed. At this time, the voltage Vcs held in the capacitor 3915 can be represented by Formula (5) where capacitances of the capacitor 3915 and the light emitting element 3916 are C1 and C2, respectively.

$$Vcs = \left| -|Vth| - Vdata \times \frac{C2}{C1+C2} \right| \quad (5)$$

Note that C2>>C1 because the light emitting element 3916 is thinner and has a larger electrode area than the capacitor 3915. Thus, from C2/(C1+C2)≈1, the voltage Vcs held in the capacitor 3915 is represented by Formula (6). Note that when the light emitting element 3916 is controlled not to emit light in the next light-emitting period, a potential of Vdata≤0 is input.

$$Vcs = |-|Vth|-Vdata| \quad (6)$$

Figure 41D:
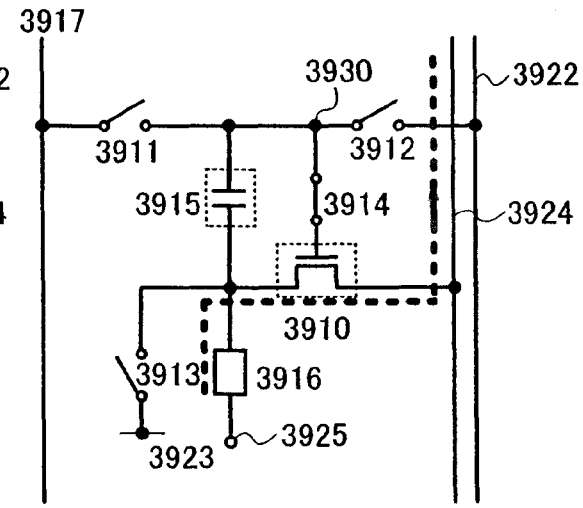

Next, in the light emitting period shown in (D) in FIG. 40 and FIG. 41D, the first switch 3911 is turned off and the fourth switch 3914 is turned on. At this time, the gate-source voltage Vgs of the transistor 3910 is equal to −Vdata−|Vth|, and thus the transistor 3901 is turned on. Then, a current in accordance with luminance data flows to the transistor 3910 and the light emitting element 3916, so that the light emitting element 3916 emits light.

Note that a current I flowing to the light emitting element is represented by Formula (7) when the transistor 3910 is operated in the saturation region.

$$I = \frac{1}{2}\left(\frac{W}{L}\right)\mu C_{ox}(Vgs - Vth)^2 \quad (7)$$
$$= \frac{1}{2}\left(\frac{W}{L}\right)\mu C_{ox}(-Vdata - |Vth| - Vth)^2$$

Since the transistor 3910 is a p-channel transistor, Vth<0. Therefore, Formula (7) can be transformed to Formula (8).

$$I = \frac{1}{2}\left(\frac{W}{L}\right)\mu C_{ox}(-Vdata)^2 \quad (8)$$

In addition, a current I flowing to the light emitting element is represented by Formula (9) when the transistor 3910 is operated in the linear region.

$$I = \left(\frac{W}{L}\right)\mu C_{ox}\left[(Vgs - Vth)Vds - \frac{1}{2}Vds^2\right] \quad (9)$$
$$= \left(\frac{W}{L}\right)\mu C_{ox}\left[(-Vdata - |Vth| - Vth)Vds - \frac{1}{2}Vds^2\right]$$

Since Vth<0, Formula (9) can be transformed to Formula (10).

$$I = \left(\frac{W}{L}\right)\mu C_{ox}\left[(-Vdata)Vds - \frac{1}{2}Vds^2\right] \quad (10)$$

In the formulas, W is the channel width of the transistor 3910; L, the channel length; μ, mobility; and Cox, accumulated capacitance.

According to Formulas (8) and (10), the current flowing to the light emitting element 3916 does not depend on the threshold voltage (Vth) of the transistor 3910 regardless of the operation region of the transistor 3910, i.e., the saturation region or the linear region. Therefore, variations in the current value caused by variations in the threshold voltage of the transistor 3910 can be suppressed and a current value in accordance with luminance data can be supplied to the light emitting element 3916.

Accordingly, variations in luminance caused by variations in the threshold voltage of the transistor 3910 can be suppressed. In addition, power consumption can be reduced because the operation is performed with the opposite electrode fixed at a constant potential.

Furthermore, when the transistor 3910 is operated in the saturation region, it is also possible to suppress variations in luminance caused by deterioration of the light emitting element 3916. When the light emitting element 3916 deteriorates, $V_{EL}$ of the light emitting element 3916 increases and the potential of the first electrode, i.e., the source electrode of the transistor 3910 decreases. At this time, the source electrode of the transistor 3910 is connected to the second electrode of the capacitor 3915; the gate electrode of the transistor 3910 is connected to the first electrode of the capacitor 3915; and the gate electrode side is in a floating state. Therefore, in accordance with a decrease in the source potential, the gate potential of the transistor 3910 also decreases by the same amount. Thus, Vgs of the transistor 3910 does not change. Therefore, the current flowing to the transistor 3910 and the light emitting element 3916 is not affected even if the light emitting element deteriorates. Note that it can also be seen in Formula (8) that the current I flowing to the light emitting element does not depend on the source potential or the drain potential.

Therefore, when the transistor 3910 is operated in the saturation region, it is possible to suppress variations in the current value flowing to the transistor 3910 caused by variations in the threshold voltage of the transistor 3910 and deterioration of the light emitting element 3916.

Note that when the transistor 3910 is operated in the saturation region, the channel length L is of the transistor 3910 is preferably long in order to suppress an increase in the current amount due to avalanche breakdown or a channel length modulation.

In addition, since a reverse bias voltage is applied to the light emitting element 3916 in the initialization period, a shorted portion of the light emitting element can be insulated and deterioration of the light emitting element can be suppressed. Thus, the lifetime of the light emitting element can be extended.

Note that since variations in the current value caused by variations in the threshold voltage of the transistor can be suppressed, a supply destination of the current controlled by the transistor is not particularly limited. Therefore, the light emitting element 3916 shown in FIG. 39 can be an EL element (an organic EL element, an inorganic EL element, or an EL element containing an organic material and an inorganic material), an electron emitting element, a liquid crystal element, electronic ink, or the like.

In addition, it is acceptable as long as the transistor 3910 has a function of controlling a current value supplied to the light emitting element 3916, and the kind of the transistor is not particularly limited. Therefore, a thin film transistor (TFT) using a crystalline semiconductor film, a thin film transistor using a non-single crystalline semiconductor film typified by an amorphous silicon film or a polycrystalline silicon film, a transistor formed using a semiconductor substrate or an SOI substrate, a MOS transistor, a junction transistor, a bipolar transistor, a transistor using an organic semiconductor or a carbon nanotube, or other transistors can be used.

The first switch 3911 is selected in the timing of inputting a signal in accordance with a gray scale level of the pixel to the capacitor, and controls a signal supplied to the gate electrode of the transistor 3910. The second switch 3912 is selected in the timing of applying a predetermined potential to the gate electrode of the transistor 3910, and controls whether or not to supply the predetermined potential to the gate electrode of the transistor 3910. The third switch 3913 is selected in the timing of applying a predetermined potential for initializing a potential written in the capacitor 3915, and sets a potential of the first electrode of the transistor 3910 at a high level. The fourth switch 3914 controls whether or not to connect the gate electrode of the transistor 3910 and the capacitor 3915. Therefore, the first switch 3911, the second switch 3912, the third switch 3913, and the fourth switch 3914 are not particularly limited as long as they have the above functions. For example, each of the switches may be a transistor, a diode, or a logic circuit combining them.

Note that in the case of using a transistor, a polarity (conductivity type) thereof is not particularly limited. However, it is desirable to use a transistor having a characteristic of smaller off-current. As examples of a transistor with small off-current, there are a transistor provided with an LDD region, a transistor having a multi-gate structure, and the like. Alternatively, the switch may be a CMOS circuit which uses both an n-channel transistor and a p-channel transistor.

For example, when p-channel transistors are used as the first switch 3911, the second switch 3912, the third switch 3913, and the fourth switch 3914, an L-level signal is input to the scan lines which control on/off of the respective switches in order to turn on the switches, while an H-level signal is input in order to turn off the switches.

Since the pixel can be formed using only p-channel transistors in the above case, the manufacturing process can be simplified.

Furthermore, the pixel shown in this embodiment mode can be applied to the display device of FIG. 9. In that case, start timing of the initialization period can be freely set in respective rows unless data write periods in the respective rows overlap, similarly to Embodiment Mode 1. In addition, since each pixel can emit light except in its address period, the ratio of a light emitting period to one frame period (i.e., duty ratio) can be significantly increased and can be approximately 100%. Therefore, a display device with few luminance variations and a high duty ratio can be provided.

In addition, since a threshold write period can be set long, the threshold voltage of the transistor which controls a current value flowing to the light emitting element can be written into the capacitor more accurately. Therefore, reliability as a display device is improved.

Note that this embodiment mode can be freely combined with the pixel configurations shown in the other embodiment modes. For example, the fourth switch 3914 may be connected between the node 3930 and the node 3931 or between the first electrode of the transistor 3910 and the node 3932. Further, the second electrode of the transistor 3910 may be connected to the power supply line 3924 through the fourth switch 3914. Alternatively, the fourth switch can be omitted as shown in Embodiment Mode 2. This embodiment mode is not limited to the aforementioned description, and can also be applied to any of the pixel configurations shown in the other embodiment modes.

Embodiment Mode 8

In this embodiment mode, one mode of a fragmentary sectional view of a pixel of the invention is described with reference to FIG. 17. Note that a transistor shown in the fragmentary sectional view in this embodiment mode is a transistor which has a function of controlling a current value supplied to a light emitting element.

First, a base film 1712 is formed over a substrate 1711 having an insulating surface. As the substrate 1711 having an insulating surface, an insulating substrate such as a glass substrate, a quartz substrate, a plastic substrate (e.g., polyimide, acrylic, polyethylene terephthalate, polycarbonate, polyarylate, polyethersulfone, or the like) or a ceramic substrate; or a metal substrate (e.g., tantalum, tungsten, molybdenum, or the like), a semiconductor substrate, or the like which has an insulating film formed on its surface can be used. Note that it is necessary to use a substrate which can withstand at least the heat generated during a process.

The base film 1712 is formed using a single layer or a plurality of layers (two or more layers) of an insulating film such as a silicon oxide film, a silicon nitride film, or a silicon oxynitride ($SiO_XN_Y$) film. Note that the base film 1712 may be formed by a sputtering method, a CVD method, or the like. Although the base film 1712 has a single layer in this embodiment mode, it may have a plurality of layers (two or more layers).

Next, a transistor 1713 is formed over the base film 1712. The transistor 1713 includes at least a semiconductor layer 1714, a gate insulating film 1715 formed over the semiconductor layer 1714, and a gate electrode 1716 formed over the semiconductor layer 1714 with the gate insulating film 1715 interposed therebetween. The semiconductor layer 1714 has a source region and a drain region.

The semiconductor layer 1714 can be formed using a film having a non-crystalline state (i.e., a non-crystalline semiconductor film) selected from an amorphous semiconductor containing amorphous silicon (a-Si:H), silicon, silicon germanium (SiGe), or the like as its main component; a semi-amorphous semiconductor in which an amorphous state and a crystalline state are mixed; or a microcrystalline semiconductor in which crystal grains of 0.5 to 20 nm can be observed in an amorphous semiconductor. Alternatively, the semiconductor layer 1714 can also be formed using a crystalline semiconductor film made of polysilicon (p-Si:H) or the like. Note that the microcrystalline state in which crystal grains of 0.5 to 20 nm can be observed is called microcrystal. Note that when using a non-crystalline semiconductor film, the semiconductor layer 1714 may be formed by a sputtering method, a CVD method, or the like, and when using a crystalline semiconductor film, the semiconductor layer 1714 may be formed by, for example, forming a non-crystalline semiconductor film and then crystallizing it. If necessary, a slight amount of impurity elements (such as phosphorus, arsenic, or boron) may be contained in the semiconductor layer 1714 in addition to the above main component in order to control the threshold voltage of the transistor.

Next, a gate insulating film 1715 is formed to cover the semiconductor layer 1714. The gate insulating film 1715 is formed to have either a single layer or a plurality of stacked layers by using, for example, silicon oxide, silicon nitride, silicon nitride oxide, or the like. Note that a CVD method, a sputtering method, or the like can be used as a film deposition method.

Then, a gate electrode 1716 is formed over the semiconductor layer 1714 with the gate insulating film 1715 interposed therebetween. The gate electrode 1716 may be formed to have either a single layer or a plurality of stacked metal films. Note that the gate electrode can be formed using a metal element selected from tantalum (Ta), tungsten (W), titanium (Ti), molybdenum (Mo), aluminum (Al), copper (Cu), or chromium (Cr), or an alloy or compound material containing such an element as a main component. For example, the gate electrode may be formed of a first conductive film and a second conductive film, using tantalum nitride (TaN) as a first conductive layer and tungsten (W) as a second conductive layer.

Next, impurities which impart n-type or p-type conductivity are selectively added into the semiconductor layer 1714 using as a mask the gate electrode 1716 or a resist which is formed into a desired shape. In this manner, a channel formation region and impurity regions (including a source region, a drain region, a GOLD region, and an LDD region) are formed in the semiconductor layer 1714. The transistor 1713 can be formed as either an n-channel transistor or a p-channel transistor depending on the conductivity type of the impurity elements that are added into the semiconductor layer 1714.

Figure 17:
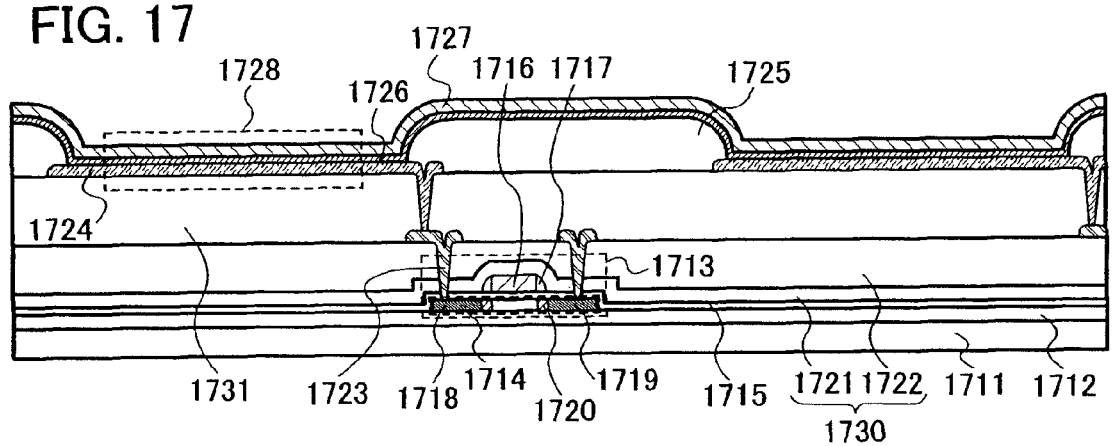
FIG. 17 is a fragmentary sectional view of a pixel shown in Embodiment Mode 8.

Note that in order to form an LDD region 1720 in a self-aligned manner in FIG. 17, a silicon compound such as a silicon oxide film, a silicon nitride film, or a silicon oxynitride film is formed to cover the gate electrode 1716 and then etched back to form a sidewall 1717. After that, a source region 1718, a drain region 1719, and an LDD region 1720 can be formed by adding impurities which impart conductivity into the semiconductor layer 1714. Therefore, the LDD region 1720 is located below the sidewall 1717. Note that the sidewall 1717 is not necessarily required to be provided because it is only provided to form the LDD region 1720 in a self-aligned manner. Note that phosphorus, arsenic, boron, or the like is used as the impurities which impart conductivity.

Next, a first interlayer insulating film 1730 is formed by stacking a first insulating film 1721 and a second insulating film 1722, so as to cover the gate electrode 1716. As the first insulating film 1721 and the second insulating film 1722, an inorganic insulating film such as a silicon oxide film, a silicon nitride film, or a silicon oxynitride ($SiO_XN_Y$) film or an organic resin film (a photosensitive or non-photosensitive organic resin film) with a low dielectric constant can be used. Alternatively, a film containing siloxane may be used. Note that siloxane is a material having a skeletal structure with the bond of silicon (Si) and oxygen (O). As a substituent of siloxane, an organic group (e.g., an alkyl group or aromatic hydrocarbon) is used. A fluoro group may be contained as a substituent as well.

Note that insulating films made of the same material may be used as the first insulating film 1721 and the second insulating film 1722. In this embodiment mode, the first interlayer insulating film 1730 has a stacked structure of two layers; however, it may have a single layer or a stacked structure of three or more layers.

Note that the first insulating film 1721 and the second insulating film 1722 may be formed by a sputtering method, a CVD method, a spin coating method, or the like. In the case of using an organic resin film or a film containing siloxane, a coating method may be employed.

After that, source and drain electrodes 1723 are formed over the first interlayer insulating film 1730. The source and drain electrodes 1723 are connected to the source region 1718 and the drain region 1719 through contact holes, respectively.

Note that the source and drain electrodes 1723 can be formed using a metal such as silver (Ag), gold (Au), copper (Cu), nickel (Ni), platinum (Pt), palladium (Pd), iridium (Ir), rhodium (Rh), tungsten (W), aluminum (Al), tantalum (Ta), molybdenum (Mo), cadmium (Cd), zinc (Zn), iron (Fe), titanium (Ti), silicon (Si), germanium (Ge), zirconium (Zr), or barium (Ba), an alloy thereof, metal nitride thereof, or stacked films thereof.

Next, a second interlayer insulating film 1731 is formed to cover the source and drain electrodes 1723. As the second interlayer insulating film 1731, an inorganic insulating film, a resin film, or a stacked layer of such films can be used. As the inorganic insulating film, a silicon nitride film, a silicon oxide film, a silicon oxynitride film, or a stacked layer of such films can be used. For the resin film, polyimide, polyamide, acrylic, polyimide amide, epoxy, or the like can be used.

A pixel electrode 1724 is formed over the second interlayer insulating film 1731. Next, an insulator 1725 is formed to cover the edge of the pixel electrode 1724. The insulator 1725 is preferably formed to have a curved surface with curvature at an upper end or a lower end thereof in order to easily deposit a layer 1726 containing a light emitting substance later. For example, in the case of using positive photosensitive acrylic as a material of the insulator 1725, the insulator 1725 is preferably formed to have a curved surface with a curvature radius (0.2 to 3 μm) only at an upper end. Either a negative resist which becomes insoluble in an etchant by light irradiation or a positive resist which becomes soluble in an etchant by light irradiation can be used as the insulator 1725. Further, not only an organic material but also an inorganic material such as silicon oxide or silicon oxynitride can be used as a material of the insulator 1725.

Next, a layer 1726 containing a light emitting substance and an opposite electrode 1727 are formed over the pixel electrode 1724 and the insulator 1725.

Note that a light emitting element 1728 is formed in a region where the layer 1726 containing a light emitting substance is sandwiched between the pixel electrode 1724 and the opposite electrode 1727.

Figure 18A:
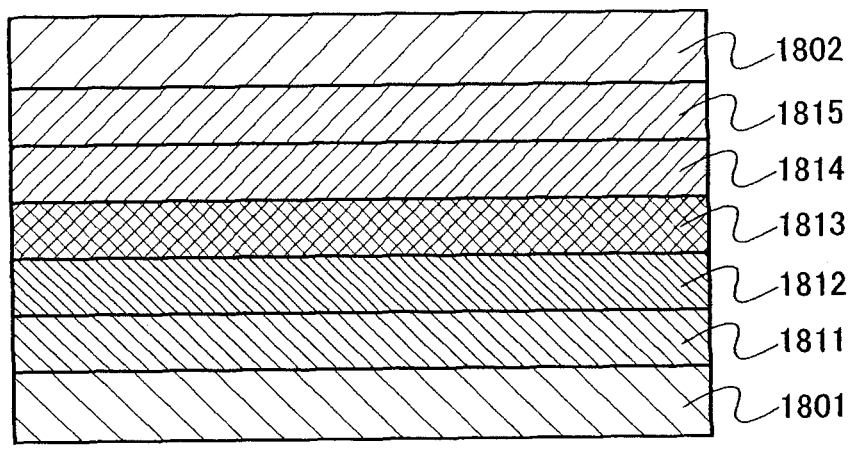
FIGS. 18A and 18B illustrate light-emitting elements shown in Embodiment Mode 8.

Next, the light emitting element 1728 is described in detail with reference to FIGS. 18A and 18B. Note that the pixel electrode 1724 and the opposite electrode 1727 in FIG. 17 correspond to a pixel electrode 1801 and an opposite electrode 1802 in FIGS. 18A and 18B, respectively. In FIG. 18A, the pixel electrode is an anode and the opposite electrode is a cathode.

As shown in FIG. 18A, a light emitting layer 1813 as well as a hole injection layer 1811, a hole transport layer 1812, an electron transport layer 1814, an electron injection layer 1815, and the like are provided between the pixel electrode 1801 and the opposite electrode 1802. These layers are stacked so that holes are injected from the pixel electrode 1801 side and electrons are injected from the opposite electrode 1802 side upon application of a voltage for setting the potential of the pixel electrode 1801 to be higher than the potential of the opposite electrode 1802.

In such a light emitting element, the holes injected from the pixel electrode 1801 and the electrons injected from the opposite electrode 1802 are recombined in the light emitting layer 1813 so that a light emitting substance is excited. Then, the excited light emitting substance emits light when returning to a ground state. The light emitting substance is not specifically limited as long as it can provide luminescence (electro luminescence).

There is no particular limitation on the substance for forming the light emitting layer 1813 and, therefore, the light emitting layer 1813 may contain only a light emitting substance. However, when there is a possibility that concentration quenching may occur, the light emitting layer 1813 is preferably a layer in which a light emitting substance is dispersed in a substance (host) which has a larger energy gap than the energy gap of the light emitting substance. This can prevent concentration quenching of the light emitting substance. Note that the energy gap refers to an energy difference between the lowest unoccupied molecular orbital (LUMO) level and the highest occupied molecular orbital (HOMO) level.

In addition, there is no particular limitation on the light emitting substance, and a substance which can emit light with a desired emission wavelength may be used. For example, in order to obtain red light emission, a substance which exhibits light having a peak of an emission spectrum at 600 to 680 nm can be used, such as 4-dicyanomethylene-2-isopropyl-6-[2-(1,1,7,7-tetramethyljulolidine-9-yl)ethenyl]-4H-pyran (abbr.: DCJTI), 4-dicyanomethylene-2-methyl-6-[2-(1,1,7,7-tetramethyljulolidine-9-yl)ethenyl]-4H-pyran (abbr.: DCJT), 4-dicyanomethylene-2-tert-butyl-6-[2-(1,1,7,7-tetramethyljulolidine-9-yl)ethenyl]-4H-pyran (abbr.: DCJTB), periflanthene, or 2,5-dicyano-1,4-bis[2-(10-methoxy-1,1,7,7-tetramethyljulolidine-9-yl)ethenyl]benzene. In order to obtain green light emission, a substance which exhibits light having a peak of an emission spectrum at 500 to 550 nm can be used, such as N,N'-dimethylquinacridon (abbr.: DMQd), coumarin 6, coumarin 545T, tris(8-quinolinolato)aluminum (abbr.: Alq), or N,N'-diphenylquinacridon (DPQd). In order to obtain blue light emission, a substance which exhibits light having a peak of an emission spectrum at 420 to 500 nm can be used, such as 9,10-bis(2-naphthyl)-tert-butylanthracene (abbr.: t-BuDNA), 9,9'-bianthryl, 9,10-diphenylanthracene (abbr.: DPA), 9,10-bis(2-naphthyl)anthracene (abbr.: DNA), bis(2-methyl-8-quinolinolato)-4-phenylphenolato-gallium (abbr.: BGaq), or bis(2-methyl-8-quinolinolato)-4-phenylphenolato-aluminum (abbr.: BAlq).

There is no particular limitation on the substance which is used for dispersing the light emitting substance and, for example, an anthracene derivative such as 9,10-di(2-naphthyl)-2-tert-butylanthracene (abbr.: t-BuDNA), a carbazole derivative such as 4,4'-bis(N-carbazolyl)biphenyl (abbr.: CBP), a metal complex such as bis[2-(2-hydroxyphenyl)pyridinato]zinc (abbr.: Znpp$_2$) or bis[2-(2-hydroxyphenyl)benzoxazolato]zinc (abbr.: ZnBOX), or the like can be used.

Although the anode material for forming the pixel electrode 1801 is not particularly limited, a metal, an alloy, an electrically conductive compound, a mixture thereof, or the like which has a high work function (4.0 eV or higher) is preferably used. Specific examples of such an anode material include oxide of a metal material such as indium tin oxide (abbr.: ITO), ITO containing silicon oxide, or indium zinc oxide (abbr.: IZO) which is formed using a target in which indium oxide is mixed with zinc oxide (ZnO) of 2 to 20 wt %. Further, gold (Au), platinum (Pt), nickel (Ni), tungsten (W), chromium (Cr), molybdenum (Mo), iron (Fe), cobalt (Co), copper (Cu), palladium (Pd), nitride of a metal material (for example, TiN), or the like can be given.

On the other hand, as a substance for forming the opposite electrode 1802, a metal, an alloy, an electrically conductive compound, a mixture thereof, or the like which has a low work function (3.8 eV or lower) can be used. Specific examples of such a cathode material include an element belonging to Group 1 or 2 of the Periodic Table, that is, an alkali metal such as lithium (Li) or cesium (Cs), an alkaline earth metal such as magnesium (Mg), calcium (Ca), or strontium (Sr), or an alloy containing these (MgAg or AlLi). In addition, when a layer having an excellent electron injection property is provided between the opposite electrode 1802 and the light emitting layer 1813 such that the layer having an excellent electron injection property is in contact with the opposite electrode 1802, the opposite electrode 1802 can be formed by using various conductive materials including the materials described as the material for the pixel electrode 1801 such as Al, Ag, ITO, or ITO containing silicon oxide, regardless of the magnitude of the work function. Alternatively, a similar effect can be obtained by using a material having a particularly excellent electron injecting function for forming the electron injection layer 1815 which is described later.

Note that in order to extract light emission to outside, it is preferable that one or both of the pixel electrode 1801 and the opposite electrode 1802 be a transparent electrode made of ITO or the like or be formed with a thickness of several to several tens of nm so that it/they can transmit visible light.

The hole transport layer 1812 is provided between the pixel electrode 1801 and the light emitting layer 1813 as shown in FIG. 18A. The hole transport layer is a layer having a function of transporting holes injected from the pixel electrode 1801 to the light emitting layer 1813. By providing the hole transport layer 1812 to separate the pixel electrode 1801 and the light emitting layer 1813 from each other, light emission can be prevented from being quenched due to metal.

Note that the hole transport layer 1812 is preferably formed using a substance having an excellent hole transport property, and in particular, a substance having a hole mobility of $1\times10^{-6}$ cm$^2$/Vs or higher is preferably used. Note that the substance having an excellent hole transport property refers to a substance having a higher mobility of holes than that of electrons. As specific examples of a substance which can be used for forming the hole transport layer 1812, there are 4,4'-bis[N-(1-naphthyl)-N-phenylamino]biphenyl (abbr.: NPB), 4,4'-bis[N-(3-methylphenyl)-N-phenylamino]biphenyl (abbr.: TPD), 4,4',4"-tris(N,N-diphenylamino)triphenylamine (abbr.: TDATA), 4,4',4"-tris[N-(3-methylphenyl)-N-phenylamino]triphenylamine (abbr.: MTDATA), 4,4'-bis{N-[4-(N,N-di-m-tolylamino)phenyl]-N-phenylamino}biphenyl (abbr.: DNTPD), 1,3,5-tris[N,N-di(m-tolyl)amino]benzene (abbr.: m-MTDAB), 4,4',4"-tris(N-carbazolyl)tripheylamine (abbr.: TCTA), phthalocyanine (abbr.: H$_2$Pc), copper phthalocyanine (abbr.: CuPc), vanadyl phthalocyanine (abbr.: VOPc), and the like. In addition, the hole transport layer 1812 may be a layer having a multilayer structure which is formed by combining two or more layers formed of the aforementioned substances.

Further, the electron transport layer 1814 may be provided between the opposite electrode 1802 and the light emitting layer 1813 as shown in FIG. 18A. Here, the electron transport layer is a layer having a function of transporting electrons injected from the opposite electrode 1802 to the light emitting layer 1813. By providing the electron transport layer 1814 to separate the opposite electrode 1802 and the light emitting layer 1813 from each other, light emission can be prevented from being quenched due to metal.

There is no particular limitation on the material of the electron transport layer 1814, and the electron transport layer 1814 can be formed using a metal complex having a quinoline skeleton or a benzoquinoline skeleton such as tris(8-quinolinolato)aluminum (abbr.: Alq), tris(5-methyl-8-quinolinolato) aluminum (abbr.: Almq$_3$), bis(10-hydroxybenzo[h]-quinolinato)beryllium (abbr.: BeBq$_2$), or bis(2-methyl-8-quinolinolato)-4-phenylphenolato-aluminum (abbr.: BAlq), or the like. Alternatively, the electron transport layer 1814 may be formed using a metal complex having an oxazole ligand or a thiazole ligand such as bis[2-(2-hydroxyphenyl) benzoxazolato]zinc (abbr.: Zn(BOX)$_2$) Or bis[2-(2-hydroxyphenyl)-benzothiazolato]zinc (abbr.: Zn(BTZ)$_2$), or the like. Further, the electron transport layer 1814 may be formed using 2-(4-biphenylyl)-5-(4-tert-butylphenyl)-1,3,4-oxadiazole (abbr.: PBD), 1,3-bis[5-(p-tert-butylphenyl)-1,3,4-oxadiazol-2-yl]benzene (abbr.: OXD-7), 3-(4-tert-butylphenyl)-4-phenyl-5-(4-biphenylyl)-1,2,4-triazole (abbr.: TAZ), 3-(4-tert-butylphenyl)-4-(4-ethylphenyl)-5-(4-biphenylyl)-1,2,4-triazole (abbr.: p-EtTAZ), bathophenanthroline (abbr.:

BPhen), bathocuproin (abbr.: BCP), or the like. The electron transport layer 1814 is preferably formed using a substance having a higher mobility of electrons than that of holes as described above. In addition, the electron transport layer 1814 is preferably formed using a substance having an electron mobility of $1\times10^{-6}$ cm$^2$/Vs or higher. Note that the electron transport layer 1814 may be a layer having a multilayer structure which is formed by combining two or more layers formed of the aforementioned substances.

Moreover, the hole injection layer 1811 may be provided between the pixel electrode 1801 and the hole transport layer 1812 as shown in FIG. 18A. Here, the hole injection layer refers to a layer having a function of promoting hole injection from an electrode functioning as an anode to the hole transport layer 1812.

There is no particular limitation on the material of the hole injection layer 1811, and the hole injection layer 1811 can be formed using metal oxide such as molybdenum oxide (MoO$_x$), vanadium oxide (VO$_x$), ruthenium oxide (RuO$_x$), tungsten oxide (WO$_x$), or manganese oxide (MnO$_x$). Alternatively, the hole injection layer 1811 can be formed using a phthalocyanine-based compound such as phthalocyanine (abbr.: H$_2$Pc) or copper phthalocyanine (CuPc), an aromatic amine-based compound such as 4,4-bis{N-[4-(N,N-di-m-tolylamino)phenyl]-N-phenylamino}biphenyl (abbr.: DNTPD), a high molecular compound such as a poly(ethylene dioxythiophene)/poly(styrenesulfonic acid) aqueous solution (PEDOT/PSS), or the like.

In addition, a mixture of the aforementioned metal oxide and a substance having an excellent hole transport property may be provided between the pixel electrode 1801 and the hole transport layer 1812. Such a layer does not cause a rise in drive voltage even when thickened; therefore, optical design using a microcavity effect or a light interference effect can be conducted by adjusting the thickness of the layer. Therefore, a high-quality light emitting element with excellent color purity and few changes in color that are dependent on viewing angles can be manufactured. In addition, the film thickness of such a layer can be controlled so as to prevent short circuit between the pixel electrode 1801 and the opposite electrode 1802 that would occur due to irregularities generated at the film deposition on the surface of the pixel electrode 1801 or due to minute residues remaining on the surface of the electrode.

In addition, the electron injection layer 1815 may be provided between the opposite electrode 1802 and the electron transport layer 1814 as shown in FIG. 18A. Here, the electron injection layer is a layer having a function of promoting electron injection from an electrode functioning as a cathode to the electron transport layer 1814. When the electron transport layer is not particularly provided, electron injection to the light emitting layer may be helped by providing the electron injection layer between the electrode functioning as a cathode and the light emitting layer.

There is no particular limitation on the material of the electron injection layer 1815, and the electron injection layer 1815 can be formed using a compound of alkali metal or alkaline earth metal, such as lithium fluoride (LiF), cesium fluoride (CsF), or calcium fluoride (CaF$_2$). Alternatively, the electron injection layer 1815 can be formed using a mixture of a substance having an excellent electron transport property such as Alq or 4,4-bis(5-methylbenzoxazol-2-yl)stilbene (BzOs), and alkali metal or alkaline earth metal such as magnesium or lithium.

Note that each of the hole injection layer 1811, the hole transport layer 1812, the light emitting layer 1813, the electron transport layer 1814, and the electron injection layer 1815 may be formed by using any of an evaporation method, an ink-jet method, a coating method, or the like. In addition, the pixel electrode 1801 or the opposite electrode 1802 may also be formed by using any of a sputtering method, an evaporation method, or the like.

Figure 18B:
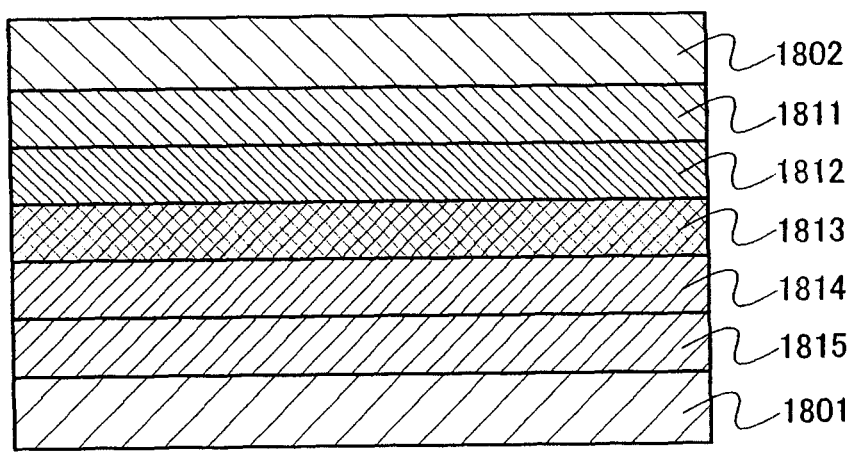

In addition, the layer structure of the light emitting element is not limited to the one shown in FIG. 18A and, therefore, the light emitting element may be formed by sequentially forming an electrode functioning as a cathode and forming upper layers thereover as shown in FIG. 18B. That is, the pixel electrode 1801 may be formed as a cathode, and then the electron injection layer 1815, the electron transport layer 1814, the light emitting layer 1813, the hole transport layer 1812, the hole injection layer 1811, and the opposite electrode 1802 may be sequentially stacked over the pixel electrode 1801. Note that the opposite electrode 1802 functions as an anode.

Although the light emitting element having a single light emitting layer is shown here, the light emitting element may include a plurality of light emitting layers. When a plurality of light emitting layers are formed and light emissions from the respective light emitting layers are mixed, white light can be obtained. For example, in the case of forming a light emitting element including two light emitting layers, it is preferable to provide a spacing layer, a layer which generates holes, and a layer which generates electrons between a first light emitting layer and a second light emitting layer. This structure enables the light emitted from the respective light emitting layers to outside to be visually mixed and perceived as white light. Thus, white light can be obtained.

Light emission is extracted to outside through one or both of the pixel electrode 1724 and the opposite electrode 1727 in FIG. 17. Accordingly, one or both of the pixel electrode 1724 and the opposite electrode 1727 is/are formed of a light-transmitting substance.

Figure 19A:
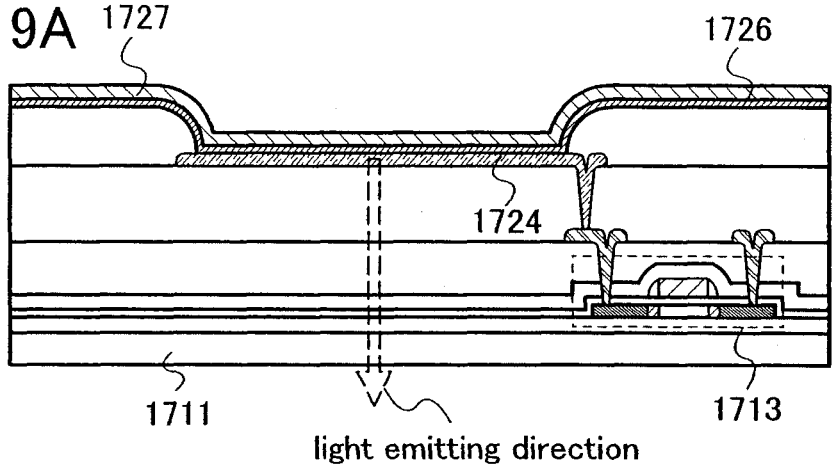
FIGS. 19A to 19C illustrate directions of light emission shown in Embodiment Mode 8.
Figure 19B:
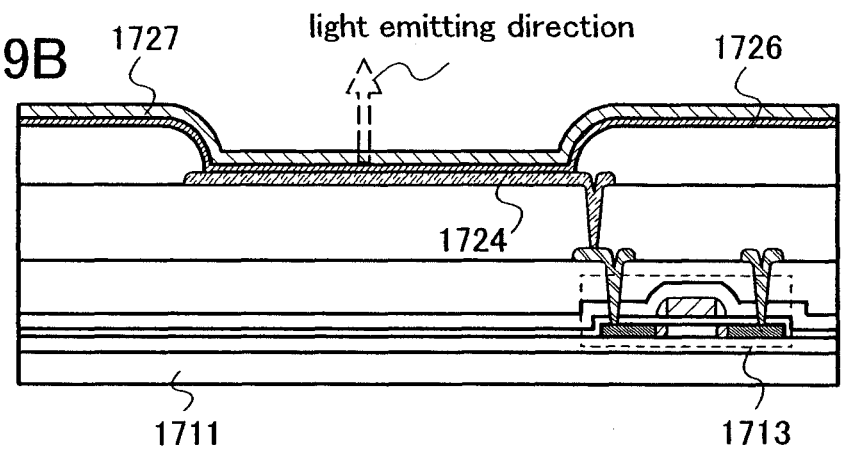
Figure 19C:
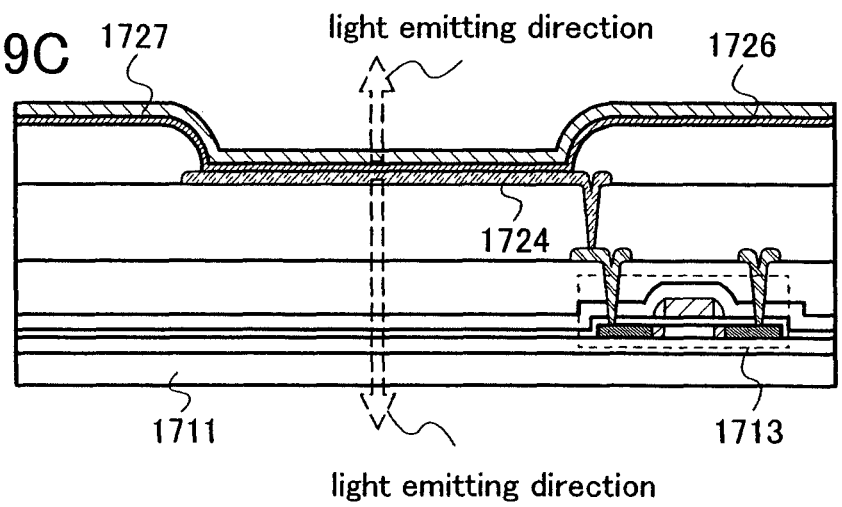

When only the opposite electrode 1727 is formed of a light-transmitting substance, light emission is extracted from a side opposite to the substrate through the opposite electrode 1727 as shown in FIG. 19A. When only the pixel electrode 1724 is formed of a light-transmitting substance, light emission is extracted from the substrate side through the pixel electrode 1724 as shown in FIG. 19B. When both of the pixel electrode 1724 and the opposite electrode 1727 are formed of a light-transmitting substance, light emission is extracted from both of the substrate side and the opposite side thereof through the pixel electrode 1724 and the opposite electrode 1727 as shown in FIG. 19C.

Next, a transistor having a staggered structure which is formed by using a non-crystalline semiconductor film for the semiconductor layer of the transistor 1713 is described. FIGS. 20A and 20B show fragmentary sectional views of pixels. Note that in each of FIGS. 20A and 20B, a transistor having a staggered structure is shown and a capacitor included in the pixel is also described in conjunction.

As shown in FIG. 20A, a base film 2012 is formed over a substrate 2011. Further, a pixel electrode 2013 is formed over the base film 2012. In addition, a first electrode 2014 is formed of the same material and in the same layer as the pixel electrode 2013.

Further, a wiring 2015 and a wiring 2016 are formed over the base film 2012, and the edge of the pixel electrode 2013 is covered with the wiring 2015. An n-type semiconductor layer 2017 and an n-type semiconductor layer 2018 each having n-type conductivity are formed over the wiring 2015 and the wiring 2016, respectively. In addition, a semiconductor layer 2019 is formed over the base film 2012 and between the wiring 2015 and the wiring 2016. A part of the semiconductor layer 2019 is extended so as to overlap with the n-type semiconductor layer 2017 and the n-type semiconductor layer 2018. Note that this semiconductor layer is formed of a non-crystalline semiconductor film made of an amorphous semiconductor such as amorphous silicon (a-Si:H), a semi-amorphous semiconductor, or a microcrystalline semiconductor. In addition, a gate insulating film 2020 is formed over the semiconductor layer 2019. An insulating film 2021 made of the same material and in the same layer as the gate insulating film 2020 is also formed over the first electrode 2014.

Furthermore, a gate electrode 2022 is formed over the gate insulating film 2020, and thus, a transistor 2025 is formed. In addition, a second electrode 2023 made of the same material and in the same layer as the gate electrode 2022 is formed over the first electrode 2014 with the insulating film 2021 interposed therebetween, and a capacitor 2024 is formed to have a structure where the insulating film 2021 is sandwiched between the first electrode 2014 and the second electrode 2023. An interlayer insulating film 2026 is formed to cover the edge of the pixel electrode 2013, the transistor 2025, and the capacitor 2024.

A layer 2027 containing a light emitting substance and an opposite electrode 2028 are formed over the interlayer insulating film 2026 and the pixel electrode 2013 located in an opening of the interlayer insulating film 2026, and a light emitting element 2029 is formed in a region where the layer 2027 containing a light emitting substance is sandwiched between the pixel electrode 2013 and the opposite electrode 2028.

The first electrode 2014 shown in FIG. 20A may be formed of the same material and in the same layer as the wirings 2015 and 2016 as shown in FIG. 20B, and a capacitor 2031 may be formed to have a structure where the insulating film 2021 is sandwiched between the first electrode 2030 and the second electrode 2023. Although an n-channel transistor is used as the transistor 2025 in FIGS. 20A and 20B, a p-channel transistor may also be used.

Materials of the substrate 2011, the base film 2012, the pixel electrode 2013, the gate insulating film 2020, the gate electrode 2022, the interlayer insulating film 2026, the layer 2027 containing a light emitting substance, and the opposite electrode 2028 may be similar to those of the substrate 1711, the base film 1712, the pixel electrode 1724, the gate insulating film 1715, the gate electrode 1716, the interlayer insulating films 1730 and 1731, the layer 1726 containing a light emitting substance, and the opposite electrode 1727 shown in FIG. 17. In addition, the wiring 2015 and the wiring 2016 may be formed by using similar materials to those of the source and drain electrodes 1723 in FIG. 17.

Figure 21A:
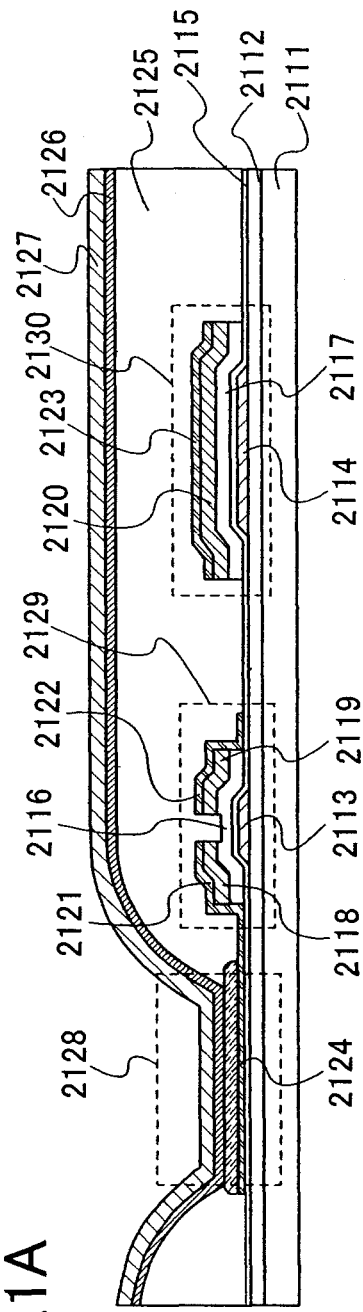
FIGS. 21A and 21B are fragmentary sectional views of a pixel shown in Embodiment Mode 8.
Figure 21B:
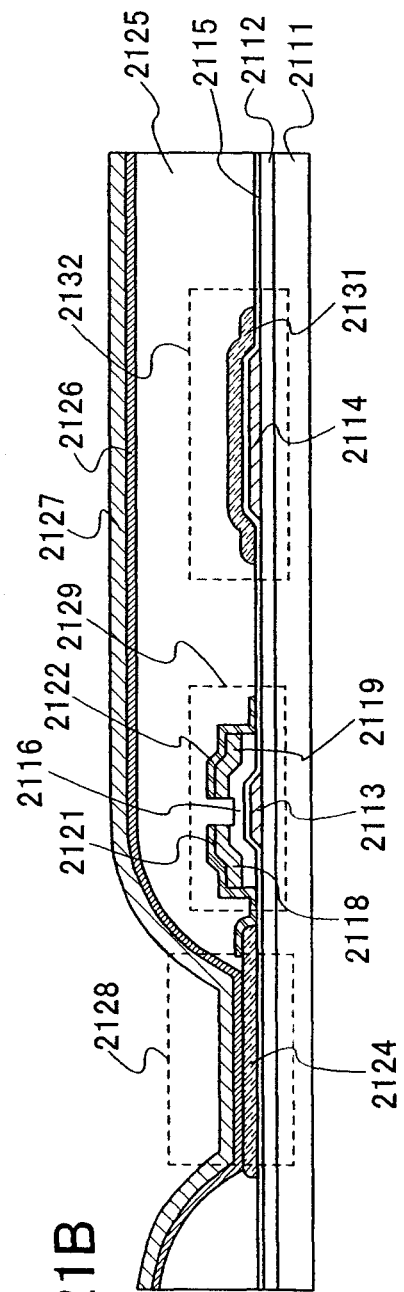

As another exemplary structure of a transistor which has a non-crystalline semiconductor film as a semiconductor layer, FIGS. 21A and 21B show fragmentary sectional views of a pixel which includes a transistor with a structure where a gate electrode is sandwiched between a substrate and a semiconductor layer, i.e., a bottom-gate transistor in which a gate electrode is located below a semiconductor layer.

A base film 2112 is formed over a substrate 2111. A gate electrode 2113 is formed over the base film 2112. In addition, a first electrode 2114 is formed of the same material and in the same layer as the gate electrode 2113. The gate electrode 2113 may be formed using the same material as the gate electrode 1716 shown in FIG. 17, polycrystalline silicon doped with phosphorus, or silicide that is a compound of metal and silicon.

A gate insulating film 2115 is formed to cover the gate electrode 2113 and the first electrode 2114.

A semiconductor layer 2116 is formed over the gate insulating film 2115. A semiconductor layer 2117 made of the same material and in the same layer as the semiconductor layer 2116 is formed over the first electrode 2114. Note that this semiconductor layer is formed of a non-crystalline semiconductor film made of an amorphous semiconductor such as amorphous silicon (a-Si:H), a semi-amorphous semiconductor, or a microcrystalline semiconductor.

An n-type semiconductor layer 2118 and an n-type semiconductor layer 2119 each having n-type conductivity are formed over the semiconductor layer 2116, and an n-type semiconductor layer 2120 is formed over the semiconductor layer 2117.

A wiring 2121 and a wiring 2122 are formed over the n-type semiconductor layer 2118 and the n-type semiconductor layer 2119, respectively, and thus a transistor 2129 is formed. A conductive layer 2123 made of the same material and in the same layer as the wiring 2121 and the wiring 2122 is formed over the n-type semiconductor layer 2120. This conductive layer 2123, the n-type semiconductor layer 2120, and the semiconductor layer 2117 form a second electrode. Note that a capacitor 2130 is formed with a structure where the gate insulating film 2115 is sandwiched between this second electrode and the first electrode 2114.

One end of the wiring 2121 is extended, and a pixel electrode 2124 is formed on the extended portion of the wiring 2121.

An insulator 2125 is formed to cover an end of the pixel electrode 2124, the transistor 2129, and the capacitor 2130.

A layer 2126 containing a light emitting substance and an opposite electrode 2127 are formed over the pixel electrode 2124 and the insulator 2125, and a light emitting element 2128 is formed in a region where the layer 2126 containing a light emitting substance is sandwiched between the pixel electrode 2124 and the opposite electrode 2127.

The semiconductor layer 2117 and the n-type semiconductor layer 2120 which serve as a part of the second electrode of the capacitor 2130 are not particularly required to be provided. That is, a capacitor may be formed to have a structure where the conductive layer 2123 is used as the second electrode and the gate insulating film 2115 is sandwiched between the first electrode 2114 and the conductive layer 2123.

Although an n-channel transistor is used as the transistor 2129, a p-channel transistor may also be used.

Note that when the pixel electrode 2124 is formed before forming the wiring 2121 in FIG. 21A, a capacitor 2132 shown in FIG. 21B can be formed, which has a structure where the gate insulating film 2115 is sandwiched between the first electrode 2114 and a second electrode 2131 made of the same material and in the same layer as the pixel electrode 2124.

Although an inversely staggered transistor with a channel etch structure is described, a transistor with a channel protective structure may be used as well. Next, an example of transistor with a channel protective structure is described with reference to FIGS. 22A and 22B. Note that portions common to FIGS. 21A and 21B and FIGS. 22A and 22B are denoted by common reference numerals.

A transistor 2201 with a channel protective structure shown in FIG. 22A differs from the transistor 2129 with a channel etch structure shown in FIG. 21A in that an insulator 2202 serving as an etching mask is provided over a region of the semiconductor layer 2116 in which a channel is formed.

Similarly, a transistor 2201 with a channel protective structure shown in FIG. 22B differs from the transistor 2129 with a channel etch structure shown in FIG. 21B in that an insulator 2202 serving as an etching mask is provided over a region of the semiconductor layer 2116 in which a channel is formed.

Manufacturing cost can be reduced by using a non-crystalline semiconductor film for the semiconductor layer of the transistor included in the pixel of the invention. Note that the materials described with reference to FIG. 17 can be used as respective materials.

Structures of the transistor and the capacitor are not limited to those described above, and transistors and capacitors with various structures can be used.

In addition, a crystalline semiconductor film made of polysilicon (p-Si:H) or the like as well as a non-crystalline semiconductor film made of an amorphous semiconductor such as amorphous silicon (a-Si:H), a semi-amorphous semiconductor, or a microcrystalline semiconductor may be used for the semiconductor layer of the transistor.

Figure 23:
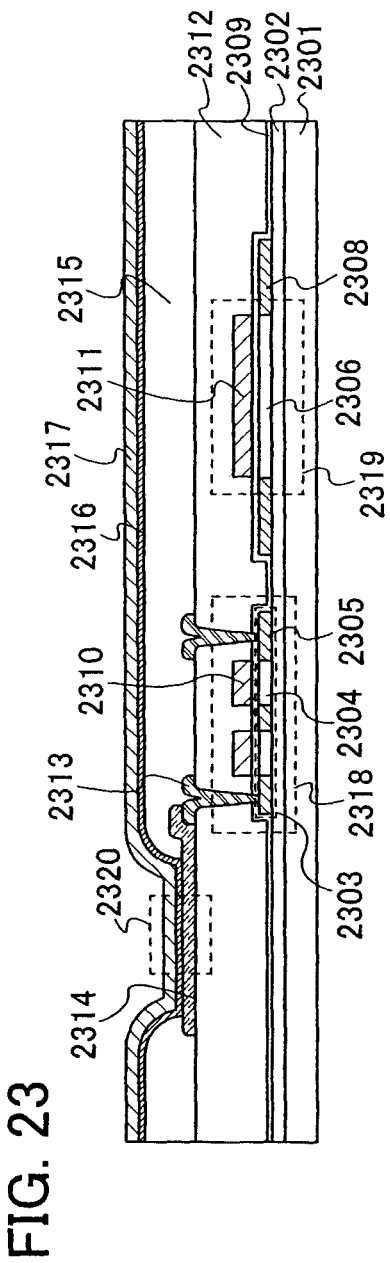
FIG. 23 is a fragmentary sectional view of a pixel shown in Embodiment Mode 8.

Referring now to FIG. 23, a fragmentary sectional view of a pixel which includes a transistor having a crystalline semiconductor film as a semiconductor layer is described. Note that a transistor 2318 shown in FIG. 23 is the multi-gate transistor shown in FIG. 29.

As shown in FIG. 23, a base film 2302 is formed over a substrate 2301, and a semiconductor layer 2303 is formed thereover. Note that the semiconductor layer 2303 is formed by patterning a crystalline semiconductor film into a desired shape.

An exemplary method of forming the crystalline semiconductor film is described below. First, an amorphous silicon film is deposited over the substrate 2301 by a sputtering method, a CVD method, or the like. The deposited material is not limited to an amorphous silicon film, and a non-crystalline semiconductor film made of an amorphous semiconductor, a semi-amorphous semiconductor, or a microcrystalline semiconductor may be used. In addition, a compound semiconductor film having an amorphous structure such as an amorphous silicon germanium film may also be used.

Then, the deposited amorphous silicon film is crystallized using a thermal crystallization method, a laser crystallization method, a thermal crystallization method using a catalytic element such as nickel, or the like. Thus, a crystalline semiconductor film is obtained. It is also possible to conduct crystallization by a combining such crystallization methods.

In the case of forming a crystalline semiconductor film by a thermal crystallization method, a heating furnace, laser irradiation, RTA (Rapid Thermal Annealing), or a method combining them can be used.

When the crystalline semiconductor film is formed by a laser crystallization method, a continuous wave laser beam (CW laser beam) or a pulsed laser beam can be used. As a laser beam that can be used here, a laser beam emitted from one or more kinds of a gas laser such as an Ar laser, a Kr laser, or an excimer laser; a laser using, as a medium, single-crystal YAG, $YVO_4$, forsterite ($Mg_2SiO_4$), $YAlO_3$, or $GdVO_4$, or polycrystalline (ceramic) YAG, $Y_2O_3$, $YVO_4$, $YAlO_3$, or $GdVO_4$ doped with one or more of Nd, Yb, Cr, Ti, Ho, Er, Tm, and Ta as a dopant; a glass laser; a ruby laser; an alexandrite laser; a Ti:sapphire laser; a copper vapor laser; and a gold vapor laser can be used. A crystal having a large grain diameter can be obtained by irradiating the semiconductor film with the fundamental wave of the above laser beam or a second harmonic to a fourth harmonic of the laser beam. For example, the second harmonic (532 nm) or the third harmonic (355 nm) of a $Nd:YVO_4$ laser (the fundamental wave: 1064 nm) can be used. At this time, the energy density of the laser is required to be about 0.01 to 100 $MW/cm^2$ (preferably, 0.1 to 10 $MW/cm^2$). The scanning rate is set to about 10 to 2000 cm/sec for irradiation.

Note that a laser using, as a medium, single-crystal YAG, $YVO_4$, forsterite ($Mg_2SiO_4$), $YAlO_3$, or $GdVO_4$, or polycrystalline (ceramic) YAG, $Y_2O_3$, $YVO_4$, $YAlO_3$, or $GdVO_4$ which is doped with one or more of Nd, Yb, Cr, Ti, Ho, Er, Tm, and Ta as a dopant; an Ar ion laser; or a Ti: sapphire laser can be a CW laser. Alternatively, such a laser can be pulsed at a repetition rate of 10 MHz or higher by conducting Q-switch operation, mode locking, or the like. When a laser beam is pulsed at a repetition rate of 10 MHz or higher, the semiconductor film is irradiated with the following pulsed laser after being melted by a previous laser and before being solidified. Therefore, unlike the case of using a pulsed laser having a low repetition rate, the interface between the solid phase and the liquid phase can be moved continuously in the semiconductor film, so that crystal grains that have grown continuously in the scanning direction can be obtained.

In the case of forming a crystalline semiconductor film by a thermal crystallization method using a catalytic element such as nickel, it is preferable to perform gettering treatment after crystallization in order to remove the catalytic element such as nickel.

By the aforementioned crystallization, a crystallized region is formed in a part of the amorphous semiconductor film. This partly crystallized crystalline semiconductor film is patterned into a desired shape, thereby forming an island-shaped semiconductor film. This semiconductor film is used for the semiconductor layer 2303 of the transistor.

The crystalline semiconductor layer is used for a channel formation region 2304 and an impurity region 2305 serving as a source region or a drain region of the transistor 2318 as well as a semiconductor layer 2306 and an impurity region 2308 serving as a bottom electrode of a capacitor 2319. Note that the impurity region 2308 is not particularly required to be provided. In addition, channel doping may be performed to the channel formation region 2304 and the semiconductor layer 2306.

Next, a gate insulating film 2309 is formed over the semiconductor layer 2303 and the bottom electrode of the capacitor 2319. Further, a gate electrode 2310 is formed over the semiconductor layer 2303 with the gate insulating film 2309 interposed therebetween, and a top electrode 2311 made of the same material and in the same layer as the gate electrode 2310 is formed over the semiconductor layer 2306 of the capacitor 2319 with the gate insulating film 2309 interposed therebetween. In this manner, the transistor 2318 and the capacitor 2319 are manufactured.

Next, an interlayer insulating film 2312 is formed to cover the transistor 2318 and the capacitor 2319, and a wiring 2313 is formed over the interlayer insulating film 2312 so as to be in contact with the impurity region 2305 through a contact hole. Then, a pixel electrode 2314 is formed over the interlayer insulating film 2312 to be in contact with the wiring 2313, and an insulator 2315 is formed to cover an end of the pixel electrode 2314 and the wiring 2313. Further, a layer 2316 containing a light emitting substance and an opposite electrode 2317 are formed over the pixel electrode 2314. Thus, a light emitting element 2320 is formed in a region where the layer 2316 containing a light emitting substance is sandwiched between the pixel electrode 2314 and the opposite electrode 2317.

Figure 24:
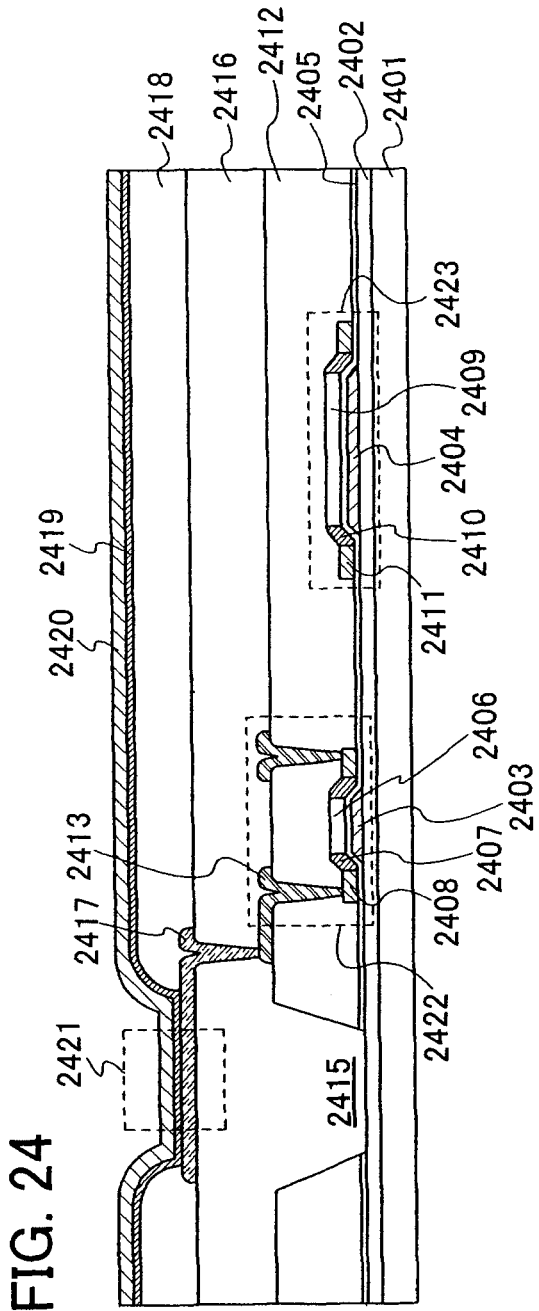
FIG. 24 is a fragmentary sectional view of a pixel shown in Embodiment Mode 8.

FIG. 24 shows a fragmentary cross section of a pixel including a bottom-gate transistor which uses a crystalline semiconductor film made of polysilicon (p-Si:H) or the like for a semiconductor layer.

A base film 2402 is formed over a substrate 2401, and a gate electrode 2403 is formed thereover. In addition, a first electrode 2404 of a capacitor 2423 is formed of the same material and in the same layer as the gate electrode 2403.

A gate insulating film 2405 is formed to cover the gate electrode 2403 and the first electrode 2404.

A semiconductor layer is formed over the gate insulating film 2405. Note that the semiconductor layer is formed by crystallizing a non-crystalline semiconductor film made of an amorphous semiconductor, a semi-amorphous semiconductor, a microcrystalline semiconductor, or the like using a thermal crystallization method, a laser crystallization method, a thermal crystallization method using a catalytic element such as nickel, or the like, and then patterning the crystallized semiconductor film into a desired shape.

Note that the semiconductor layer is used for forming a channel formation region 2406, an LDD region 2407, and an impurity region 2408 serving as a source region or a drain region of a transistor 2422, as well as a region 2409 serving as a second electrode, and impurity regions 2410 and 2411 of the capacitor 2423. Note that the impurity regions 2410 and 2411 are not necessarily required to be provided. In addition, the channel formation region 2406 and the region 2409 may be doped with impurities.

Note that the capacitor 2423 has a structure where the gate insulating film 2405 is sandwiched between the first electrode 2404 and the second electrode which includes the region 2409 formed of the semiconductor layer and the like.

Next, a first interlayer insulating film 2412 is formed to cover the semiconductor layer, and a wiring 2413 is formed over the first interlayer insulating film 2412 so as to be in contact with the impurity region 2408 through a contact hole.

An opening 2415 is formed in the first interlayer insulating film 2412. A second interlayer insulating film 2416 is formed to cover the transistor 2422, the capacitor 2423, and the opening 2415, and a pixel electrode 2417 is formed over the second interlayer insulating film 2416 so as to be connected to the wiring 2413 through a contact hole. In addition, an insulator 2418 is formed to cover an end of the pixel electrode 2417. Then, a layer 2419 containing a light emitting substance and an opposite electrode 2420 are formed over the pixel electrode 2417. Thus, a light emitting element 2421 is formed in a region where the layer 2419 containing a light emitting substance is sandwiched between the pixel electrode 2417 and the opposite electrode 2420. Note that the opening 2415 is located below the light emitting element 2421. That is, since the first interlayer insulating film 2412 has the opening 2415, transmittance can be increased when light emission from the light emitting element 2421 is extracted from the substrate side.

By using a crystalline semiconductor film for the semiconductor layer of the transistor included in the pixel of the invention, it becomes easier to form, for example, the scan line driver circuit 912 and the signal line driver circuit 911 in FIG. 9 over the same substrate as the pixel portion 913.

Note that the structure of a transistor which uses a crystalline semiconductor film for a semiconductor layer is not limited to the aforementioned one, and thus the transistor can have various structures. The same can be said for a capacitor. In this embodiment mode, the materials used in FIG. 17 can be appropriately used unless otherwise mentioned.

The transistor shown in this embodiment mode can be used as the transistor included in the pixel described in any of Embodiment Modes 1 to 7, which controls a current value supplied to a light emitting element. Therefore, variations in the current value caused by variations in the threshold voltage of the transistor can be suppressed by operating the pixel similarly to Embodiment Modes 1 to 7. Accordingly, a current in accordance with luminance data can be supplied to a light emitting element, and thus variations in luminance can be suppressed. In addition, power consumption can be reduced because operation is performed with an opposite electrode fixed at a constant potential.

In addition, when such a pixel is applied to the display device of FIG. 6, each pixel can emit light except in its address period. Therefore, the ratio of a light emitting period to one frame period (i.e., duty ratio) can be significantly increased and can be approximately 100%. Thus, a display device with few luminance variations and a high duty ratio can be provided.

In addition, since a threshold write period can be set long, the threshold voltage of the transistor which controls a current value flowing to the light emitting element can be written into the capacitor more accurately. Therefore, reliability as a display device is improved.

Embodiment Mode 9

In this embodiment mode, one mode of a display device of the invention is described with reference to FIGS. 25A and 25B.

Figure 25A:
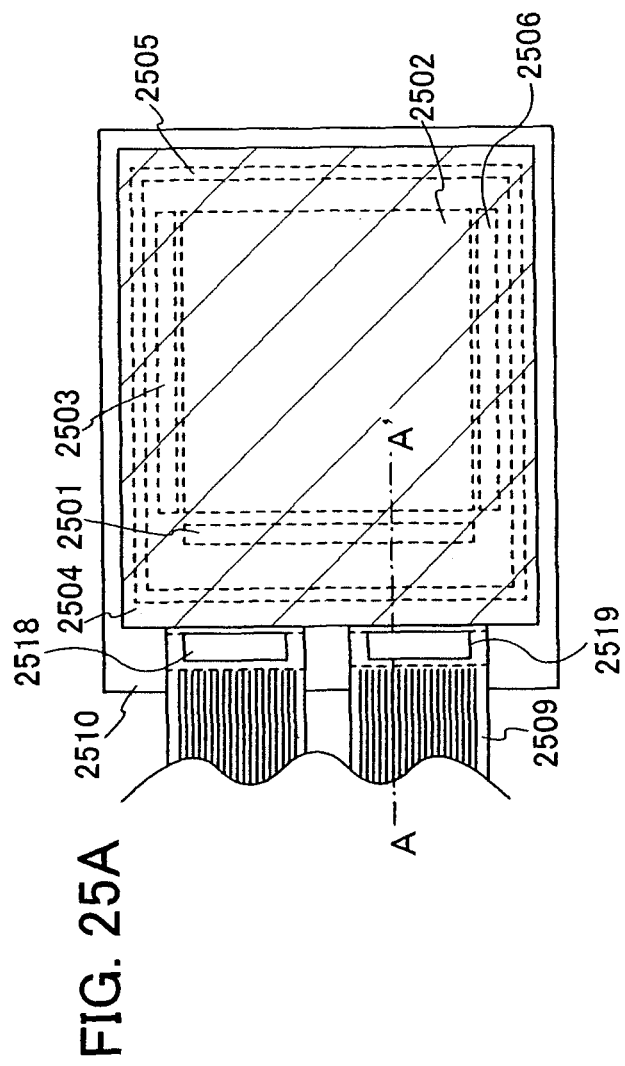
FIGS. 25A and 25B each illustrate a display device shown in Embodiment Mode 9.
Figure 25B:
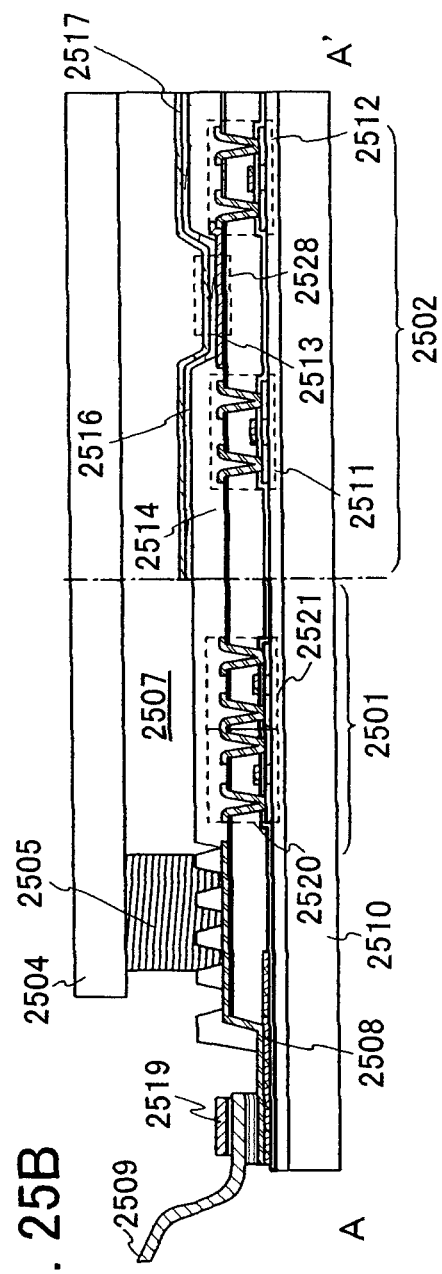

FIG. 25A is a top view showing a display device, and FIG. 25B is an A-A' line cross sectional view (cross sectional view taken along a line A-A') of FIG. 25A. The display device includes a signal line driver circuit 2501, a pixel portion 2502, a first scan line driver circuit 2503, and a second scan line driver circuit 2506 over a substrate 2510, which are indicated by dotted lines in the drawing. The display device also includes a sealing substrate 2504 and a sealant 2505, and a portion of the display device surrounded by them is a space 2507.

Note that a wiring 2508 is a wiring for transmitting signals to be input to the first scan line driver circuit 2503, the second scan line driver circuit 2506, and the signal line driver circuit 2501 and receives video signals, clock signals, start signals, and the like through an FPC (Flexible Printed Circuit) 2509 which serves as an external input terminal. IC chips (semiconductor chips provided with a memory circuit, a buffer circuit, and the like) 2518 and 2519 are mounted by COG (Chip On Glass) or the like on a connection portion of the FPC 2509 and the display device. Although only the FPC is shown here, a printed wiring board (PWB) may be attached to the FPC. The display device of the invention includes not only the main body of a display device but also a display device with an FPC or a PWB attached thereto. In addition, it also includes a display device mounting an IC chip or the like.

A cross-sectional structure is described with reference to FIG. 25B. Although the pixel portion 2502 and its peripheral driver circuits (the first scan line driver circuit 2503, the second scan line driver circuit 2506, and the signal line driver circuit 2501) are actually formed over the substrate 2510, only the signal line driver circuit 2501 and the pixel portion 2502 are shown in the drawing.

Note that the signal line driver circuit 2501 includes transistors with single polarity such as n-channel transistors 2520 and 2521. Needless to say, p-channel transistors may be used or a CMOS circuit may be formed by using not only an n-channel transistor but also a p-channel transistor. In this embodiment mode, the display panel in which the peripheral driver circuits are formed over the same substrate as the pixel portion is described; however, the invention is not limited to this. All or part of the peripheral driver circuits may be formed on an IC chip or the like and mounted on the display panel by COG or the like.

The pixel described in any of Embodiment Modes 1 to 7 is used for the pixel portion 2502. Note that FIG. 25B shows a transistor 2511 which functions as a switch, a transistor 2512 which controls a current value supplied to a light emitting element, and a light emitting element 2528. Note that a first electrode of the transistor 2512 is connected to a pixel electrode 2513 of the light emitting element 2528. In addition, an insulator 2514 is formed to cover an end of the pixel electrode 2513. Here, the insulator 2514 is formed using a positive photosensitive acrylic resin film.

The insulator 2514 is formed to have a curved surface with a curvature at an upper end or a lower end thereof in order to obtain favorable coverage. For example, in the case of using positive photosensitive acrylic as a material of the insulator 2514, the insulator 2514 is preferably formed to have a curved surface with a curvature radius (0.2 to 3 μm) only at the upper end. Either a negative resist which becomes insoluble in an etchant by light irradiation or a positive resist which becomes soluble in an etchant by light irradiation can be used as the insulator 2514.

A layer 2516 containing a light emitting substance and an opposite electrode 2517 are formed over the pixel electrode 2513. As long as the layer 2516 containing a light emitting substance is provided with at least a light emitting layer, there is no particular limitation on layers other than the light emitting layer, and thus they can be appropriately selected.

By attaching the sealing substrate 2504 to the substrate 2510 using the sealant 2505, a structure is obtained in which the light emitting element 2528 is provided in the space 2507 surrounded by the substrate 2510, the sealing substrate 2504, and the sealant 2505. Note that the space 2507 may be filled with either an inert gas (e.g., nitrogen, argon, or the like) or the sealant 2505

Note that an epoxy-based resin is preferably used as the sealant 2505. It is preferable that the material allow as little moisture and oxygen as possible to penetrate therethrough. As a material of the sealing substrate 2504, a plastic substrate formed of FRP (Fiberglass-Reinforced Plastics), PVF (polyvinyl fluoride), Mylar, polyester, acrylic, or the like can be used other than a glass substrate or a quartz substrate.

By using any of the pixels described in Embodiment Modes 1 to 7 for the pixel portion 2502, variations in luminance among pixels or fluctuations in luminance of a pixel over time can be suppressed. As a result, a display device with a higher duty ratio and higher quality can be obtained. In addition, power consumption can be reduced because the operation in the invention is performed with the opposite electrode fixed at a constant potential.

By forming all of the signal line driver circuit 2501, the pixel portion 2502, the first scan line driver circuit 2503, and the second scan line driver circuit 2506 over the same substrate as shown in FIGS. 25A and 25B, cost of the display device can be reduced. Further, in that case, by using transistors with single polarity for the signal line driver circuit 2501, the pixel portion 2502, the first scan line driver circuit 2503, and the second scan line driver circuit 2506, a manufacturing process can be simplified. Accordingly, further cost reduction can be achieved.

The display device of the invention can be obtained in the aforementioned manner. Note that the aforementioned structure is only exemplary and the structure of the display device of the invention is not limited to this.

Figure 26A:
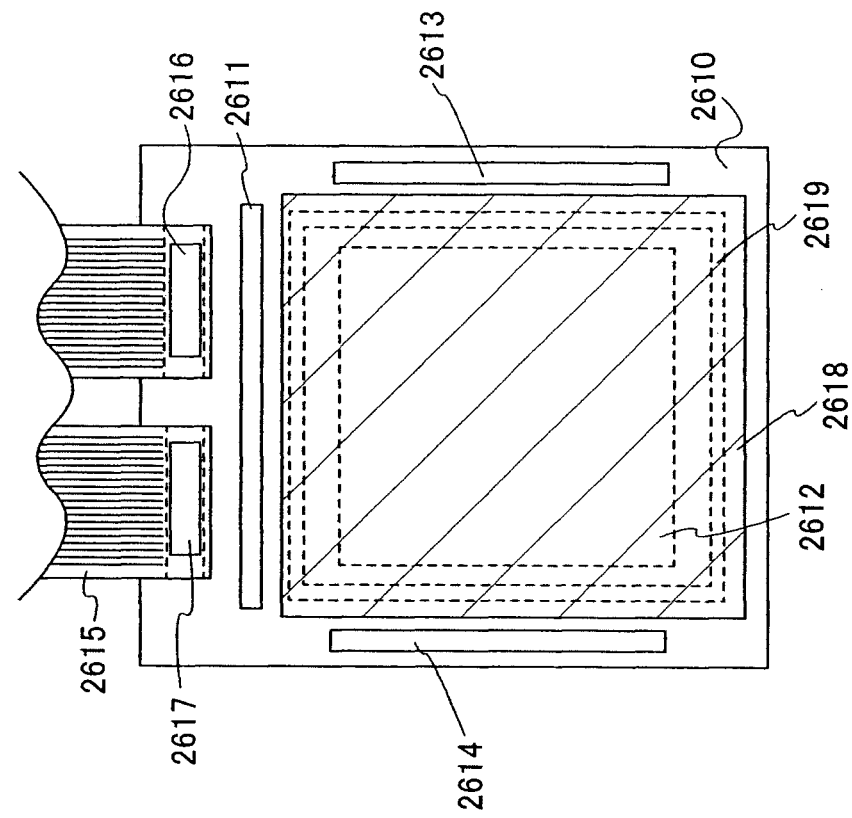
FIGS. 26A and 26B each illustrate a display device shown in Embodiment Mode 9.

The display device may also have a structure shown in FIG. 26A where a signal line driver circuit 2601 is formed on an IC chip and the IC chip is mounted on a display device by COG or the like. Note that a substrate 2600, a pixel portion 2602, a first scan line driver circuit 2603, a second scan line driver circuit 2604, an FPC 2605, an IC chip 2606, an IC chip 2607, a sealing substrate 2608, and a sealant 2609 of FIG. 26A correspond to the substrate 2510, the pixel portion 2502, the first scan line driver circuit 2503, the second scan line driver circuit 2506, the FPC 2509, the IC chip 2518, the IC chip 2519, the sealing substrate 2504, and the sealant 2505 in FIG. 25A, respectively.

That is, only a signal line driver circuit which requires a high speed operation is formed on an IC chip using a CMOS or the like to reduce power consumption. In addition, higher-speed operation and lower power consumption can be achieved by using a semiconductor chip made of a silicon wafer or the like as the IC chip.

Note that by forming the first scan line driver circuit 2603 and the second scan line driver circuit 2604 over the same substrate as the pixel portion 2602, cost reduction can be achieved. Moreover, by forming the first scan line driver circuit 2603, the second scan line driver circuit 2604, and the pixel portion 2602 using transistors with single polarity, further cost reduction can be achieved. At the time, drops in output potentials can be prevented by using boot trap circuits for the first scan line driver circuit 2603 and the second scan line driver circuit 2604. In addition, in the case of using amorphous silicon for semiconductor layers of transistors included in the first scan line driver circuit 2603 and the second scan line driver circuit 2604, the threshold voltage of each transistor varies due to deterioration. Therefore, it is preferable to provide a function of correcting the variations.

By using any of the pixels described in Embodiment Modes 1 to 7 for the pixel portion 2602, variations in luminance among pixels or fluctuations in luminance of a pixel over time can be suppressed. As a result, a display device with a higher duty ratio and higher quality can be obtained. In addition, power consumption can be reduced because the operation in the invention is performed with the opposite electrode fixed at a constant potential. In addition, a substrate area can be efficiently utilized by mounting an IC chip which is provided with a functional circuit (a memory or a buffer) on a connection portion of the FPC 2605 and the substrate 2600.

Figure 26B:
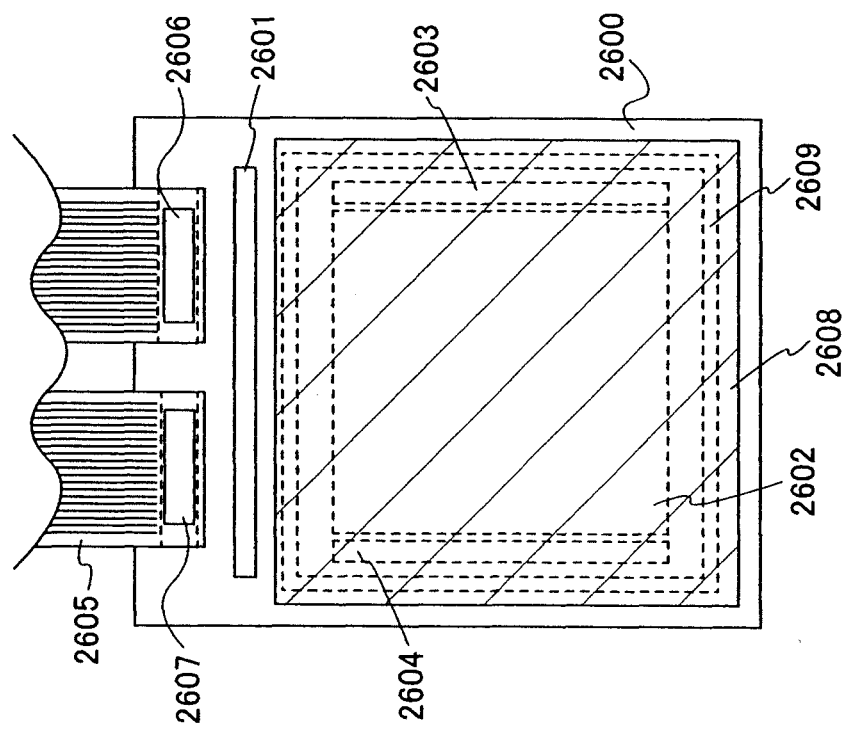

In addition, a structure shown in FIG. 26B may also be employed in which a signal line driver circuit 2611, a first scan line driver circuit 2613, and a second scan line driver circuit 2614 which correspond to the signal line driver circuit 2501, the first scan line driver circuit 2503, and the second scan line driver circuit 2506 of FIG. 25A are formed on IC chips and the IC chips are mounted on a display device by COG or the like. Note that a substrate 2610, a pixel portion 2612, an FPC 2615, an IC chip 2616, an IC chip 2617, a sealing substrate 2618, and a sealant 2619 of FIG. 26B correspond to the substrate 2510, the pixel portion 2502, the FPC 2509, the IC chip 2518, the IC chip 2519, the sealing substrate 2504, and the sealant 2505 of FIG. 25A, respectively.

In addition, by using a non-crystalline semiconductor film such as an amorphous silicon (a-Si:H) film for the semiconductor layer of the transistor in the pixel portion 2612, cost reduction can be achieved. Further, it becomes possible to form a large-sized display panel.

Figure 27A:
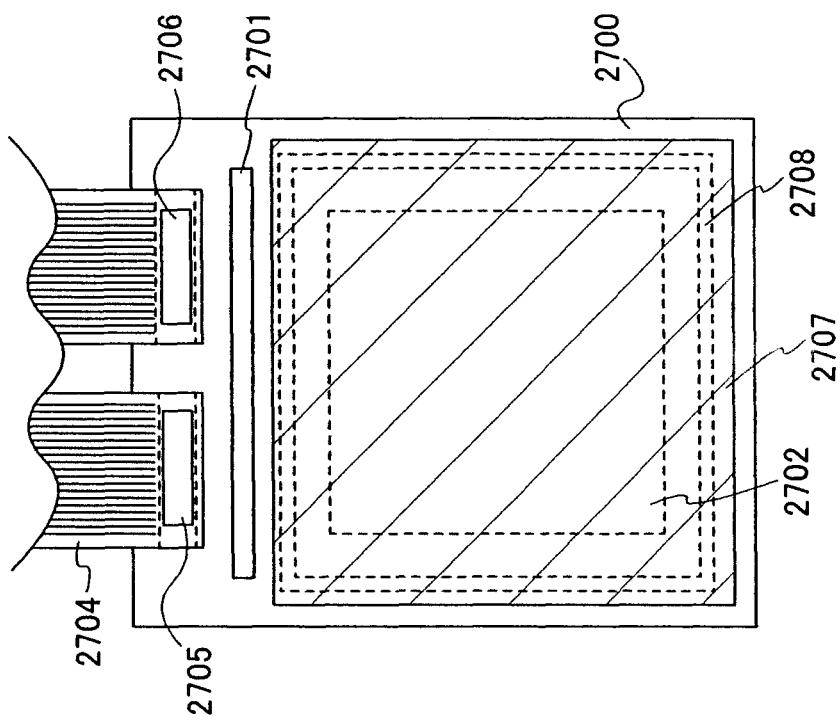
FIGS. 27A and 27B each illustrate a display device shown in Embodiment Mode 9.

Further, the first scan line driver circuit, the second scan line driver circuit, and the signal line driver circuit are not necessarily required to be provided in a row direction and a column direction of the pixels. For example, a peripheral driver circuit 2701 formed on an IC chip as shown in FIG. 27A may incorporate the functions of the first scan line driver circuit 2613, the second scan line driver circuit 2614, and the signal line driver circuit 2611 shown in FIG. 26B. Note that a substrate 2700, a pixel portion 2702, an FPC 2704, an IC chip 2705, an IC chip 2706, a sealing substrate 2707, and a sealant 2708 of FIG. 27A correspond to the substrate 2510, the pixel portion 2502, the FPC 2509, the IC chip 2518, the IC chip 2519, the sealing substrate 2504, and the sealant 2505 of FIG. 25A, respectively.

Figure 27B:
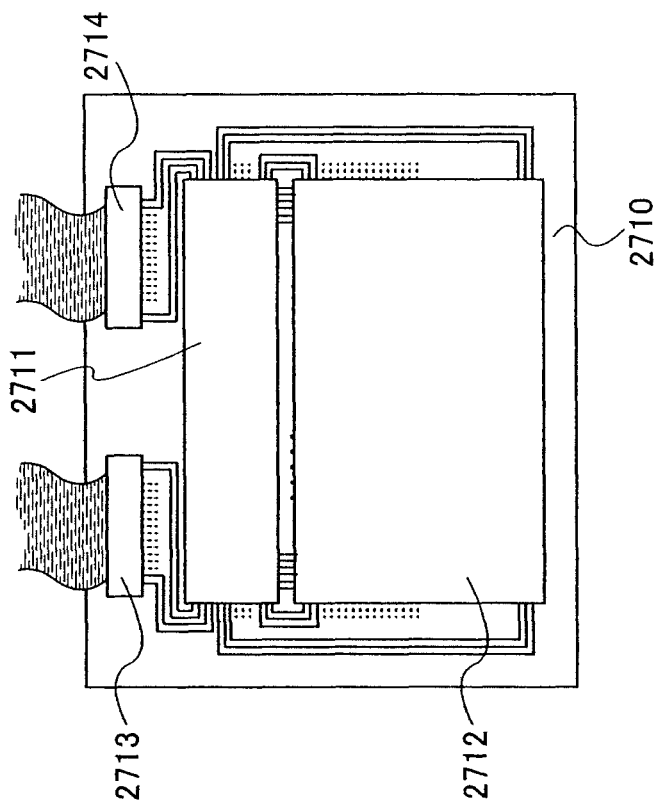

FIG. 27B shows a schematic diagram illustrating the connection of wirings in the display device of FIG. 27A. FIG. 27B shows a substrate 2710, a peripheral driver circuit 2711, a pixel portion 2712, an FPC 2713, and an FPC 2714.

The FPC 2713 and the FPC 2714 input signals and power supply potentials from outside to the peripheral driver circuit 2711. Then, an output of the peripheral driver circuit 2711 is input to wirings in a row direction and a column direction that are connected to pixels included in the pixel portion 2712.

In the case of using a white light emitting element as a light emitting element, full-color display can be realized by providing the sealing substrate with color filters. The invention can also be applied to such a display device. FIG. 28 shows an example of a fragmentary sectional view of a pixel portion.

As shown in FIG. 28, a base film 2802 is formed over a substrate 2800; a transistor 2801 which controls a current value supplied to a light emitting element is formed thereover; and a pixel electrode 2803 is formed in contact with a first electrode of the transistor 2801. A layer 2804 containing a light emitting substance and an opposite electrode 2805 are formed thereover.

Note that a portion where the layer 2804 containing a light emitting substance is sandwiched between the pixel electrode 2803 and the opposite electrode 2805 serves as the light emitting element. Note that white light is emitted in FIG. 28. A red color filter 2806R, a green color filter 2806G, and a blue color filter 2806B are provided above the light emitting elements in order to achieve full-color display. In addition, a black matrix (also referred to as a "BM") 2807 is provided to separate these color filters.

The display device of this embodiment mode can be appropriately combined with the structure shown in Embodiment Mode 8 as well as the structures shown in Embodiment Modes 1 to 7. In addition, the structure of the display device of the invention is not limited to the aforementioned ones, and thus can be applied to a display device having a different structure.

Embodiment Mode 10

The display device of the invention can be applied to various electronic devices. Specifically, it can be applied to display portions of electronic devices. Electronic devices include a camera (e.g., a video camera, a digital camera, or the like), a goggle display, a navigation system, an audio-reproducing device (e.g., car audio, an audio component set, or the like), a computer, a game machine, a portable information terminal (e.g., a mobile computer, a mobile phone, a portable game machine, an electronic book, or the like), an image-reproducing device having a recording medium (specifically, a device for reproducing a recording medium such as a digital versatile disc (DVD) and having a display for displaying the reproduced image), and the like.

Figure 33A:
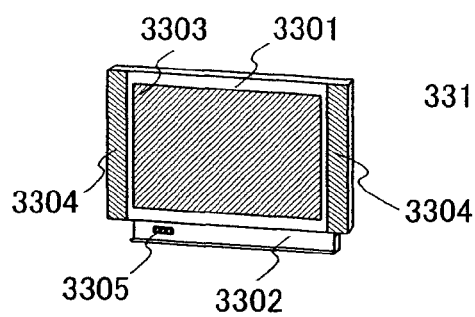
FIGS. 33A to 33H are views of electronic devices to which the invention can be applied.

FIG. 33A shows a display which includes a chassis 3301, a support 3302, a display portion 3303, a speaker portion 3304, a video input terminal 3305, and the like.

Note that the pixel shown in any of Embodiment Modes 1 to 7 can be used for the display portion 3303. According to the invention, variations in luminance among pixels or fluctuations in luminance of a pixel over time can be suppressed. As a result, a display having a display portion with a higher duty ratio and higher quality can be obtained. In addition, power consumption can be reduced because the operation in the invention is performed with an opposite electrode fixed at a constant potential. Note that the display includes in its category all display devices that are used for displaying information, for example, for a personal computer, for TV broadcast reception, for advertisement display, and the like.

While needs for larger-size displays have been increasing in recent years, cost increase associated with the increase in display size has become an issue. Therefore, it is an essential task to reduce the manufacturing cost and suppress the price of a high-quality product as low as possible.

Since the pixel of the invention can be manufactured using transistors with single polarity, the number of manufacturing steps can be reduced and the manufacturing cost can be reduced. Further, by using a non-crystalline semiconductor film such as an amorphous silicon (a-Si:H) film for a semiconductor layer of each transistor included in the pixel, a process can be simplified and further cost reduction can be achieved. In that case, it is preferable to form a peripheral driver circuit of a pixel portion on an IC chip and mount the IC chip on the display panel by COG (Chip On Glass) or the like. Note that it is also possible to form a signal line driver circuit with high speed operation on an IC chip, and form a scan line driver circuit with relatively low speed operation over the same substrate as the pixel portion, using a circuit including transistors with single polarity.

Figure 33B:
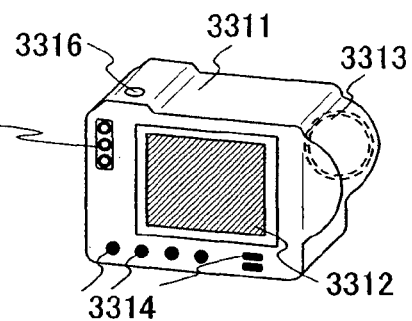

FIG. 33B shows a camera which includes a main body 3311, a display portion 3312, an image receiving portion 3313, operation keys 3314, an external connection port 3315, a shutter 3316, and the like.

Note that the pixel shown in any of Embodiment Modes 1 to 7 can be used for the display portion 3312. According to the invention, variations in luminance among pixels or fluctuations in luminance of a pixel over time can be suppressed. Thus, a camera having a display portion with a higher duty ratio and higher quality can be obtained. In addition, power consumption can be reduced because the operation in the invention is performed with an opposite electrode fixed at a constant potential.

In recent years, competitive manufacturing of digital cameras or the like has been intensified with an improvement in performance. Therefore, it is vital to suppress the price of high-performance products as low as possible.

Since the pixel of the invention can be manufactured using transistors with single polarity, the number of manufacturing steps can be reduced and the manufacturing cost can be reduced. Further, by using a non-crystalline semiconductor film such as an amorphous silicon (a-Si:H) film for a semiconductor layer of each transistor included in the pixel, a process can be simplified and further cost reduction can be achieved. In that case, it is preferable to form a peripheral driver circuit of a pixel portion on an IC chip and mount the IC chip on the display panel by COG (Chip On Glass) or the like. Note that it is also possible to form a signal line driver circuit with high speed operation on an IC chip, and form a scan line driver circuit with relatively low speed operation over the same substrate as the pixel portion, using a circuit including transistors with single polarity.

Figure 33C:
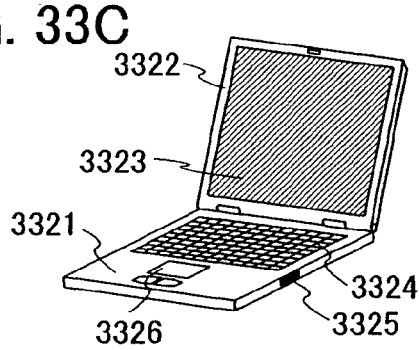

FIG. 33C shows a computer which includes a main body 3321, a chassis 3322, a display portion 3323, a keyboard 3324, an external connection port 3325, a pointing device 3326, and the like. Note that the pixel shown in any of Embodiment Modes 1 to 7 can be used for the display portion 3323. According to the invention, variations in luminance among pixels or fluctuations in luminance of a pixel over time can be suppressed. Thus, a computer having a display portion with a higher duty ratio and higher quality can be obtained. In addition, power consumption can be reduced because the operation in the invention is performed with an opposite electrode fixed at a constant potential. Further, cost reduction can be achieved by using transistors with single polarity as the transistors included in the pixel portion and using a non-crystalline semiconductor film for semiconductor layers of the transistors.

Figure 33D:
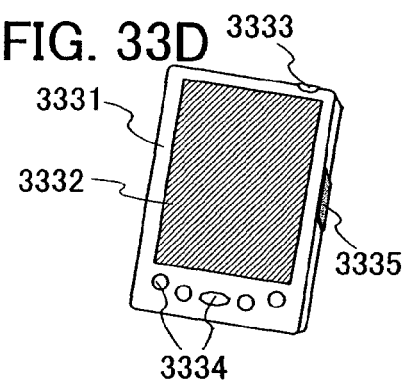

FIG. 33D shows a mobile computer which includes a main body 3331, a display portion 3332, a switch 3333, operation keys 3334, an infrared port 3335, and the like. Note that the pixel shown in any of Embodiment Modes 1 to 7 can be used for the display portion 3332. According to the invention, variations in luminance among pixels or fluctuations in luminance of a pixel over time can be suppressed. Thus, a mobile computer having a display portion with a higher duty ratio and higher quality can be obtained. In addition, power consumption can be reduced because the operation in the invention is performed with an opposite electrode fixed at a constant potential. Further, cost reduction can be achieved by using transistors with single polarity as the transistors included in the pixel portion and using a non-crystalline semiconductor film for semiconductor layers of the transistors.

Figure 33E:
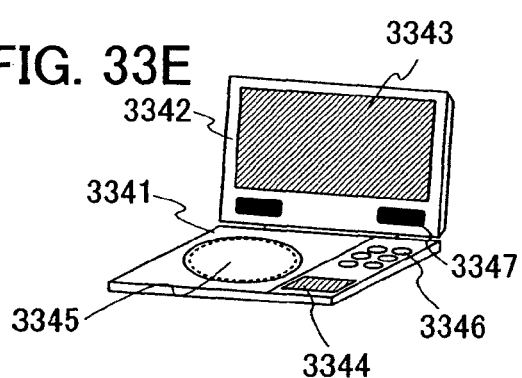

FIG. 33E shows a portable image reproducing device provided with a recording medium (specifically, a DVD player), which includes a main body 3341, a chassis 3342, a display portion A 3343, a display portion B 3344, a recording medium (DVD or the like) reading portion 3345, operation keys 3346, a speaker portion 3347, and the like. The display portion A 3343 mainly displays image data, while the display portion B 3344 mainly displays text data. Note that the pixel shown in any of Embodiment Modes 1 to 7 can be used for the display portion A 3343 and the display portion B 3344. According to the invention, variations in luminance among pixels or fluctuations in luminance of a pixel over time can be suppressed. Thus, an image reproducing device having a display portion with a higher duty ratio and higher quality can be obtained. In addition, power consumption can be reduced because the operation in the invention is performed with an opposite electrode fixed at a constant potential. Further, cost reduction can be achieved by using transistors with single polarity as the transistors included in the pixel portion and using a non-crystalline semiconductor film for semiconductor layers of the transistors.

Figure 33F:
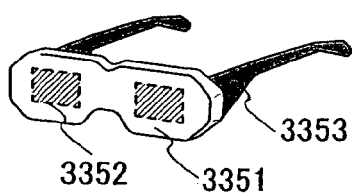

FIG. 33F shows a goggle display which includes a main body 3351, a display portion 3352, an arm portion 3353, and the like. Note that the pixel shown in any of Embodiment Modes 1 to 7 can be used for the display portion 3352. According to the invention, variations in luminance among pixels or fluctuations in luminance of a pixel over time can be suppressed. Thus, a goggle display having a display portion with a higher duty ratio and higher quality can be obtained. In addition, power consumption can be reduced because the operation in the invention is performed with an opposite electrode fixed at a constant potential. Further, cost reduction can be achieved by using transistors with single polarity as the transistors included in the pixel portion and using a non-crystalline semiconductor film for semiconductor layers of the transistors.

Figure 33G:
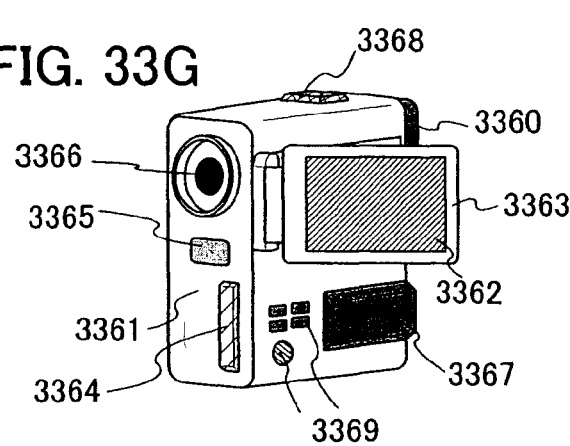

FIG. 33G shows a video camera which includes a main body 3361, a display portion 3362, a chassis 3363, an external connection port 3364, a remote control receiving portion 3365, an image receiving portion 3366, a battery 3367, an audio input portion 3368, operation keys 3369, an eyepiece portion 3360, and the like. Note that the pixel shown in any of Embodiment Modes 1 to 7 can be used for the display portion 3362. According to the invention, variations in luminance among pixels or fluctuations in luminance of a pixel over time can be suppressed. Thus, a video camera having a display portion with a higher duty ratio and higher quality can be obtained. In addition, power consumption can be reduced because the operation in the invention is performed with an opposite electrode fixed at a constant potential. Further, cost reduction can be achieved by using transistors with single polarity as the transistors included in the pixel portion and using a non-crystalline semiconductor film for semiconductor layers of the transistors.

Figure 33H:
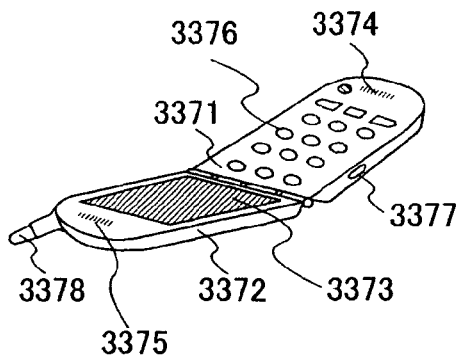

FIG. 33H shows a mobile phone, which includes a main body 3371, a chassis 3372, a display portion 3373, an audio input portion 3374, an audio output portion 3375, operation keys 3376, an external connection port 3377, an antenna 3378, and the like. Note that the pixel shown in any of Embodiment Modes 1 to 7 can be used for the display portion 3373. According to the invention, variations in luminance among pixels or fluctuations in luminance of a pixel over time can be suppressed. Thus, a mobile phone having a display portion with a higher duty ratio and higher quality can be obtained. In addition, power consumption can be reduced because the operation in the invention is performed with an opposite electrode fixed at a constant potential. Further, cost reduction can be achieved by using transistors with single polarity as the transistors included in the pixel portion and using a non-crystalline semiconductor film for semiconductor layers of the transistors.

As described above, the invention can be applied to various electronic devices.

Embodiment Mode 11

In this embodiment mode, an exemplary structure of a mobile phone which includes the display device of the invention in a display portion is described with reference to FIG. 34.

A display panel 3410 is incorporated in a housing 3400 in a freely detachable manner. The shape and size of the housing 3400 can be changed as appropriate in accordance with the size of the display panel 3410. The housing 3400 to which the display panel 3410 is fixed is fitted in a printed circuit board 3401 and assembled as a module.

The display panel 3410 is connected to the printed circuit board 3401 through an FPC 3411. The printed circuit board 3401 is provided with a speaker 3402, a microphone 3403, a transmission/reception circuit 3404, and a signal processing circuit 3405 which includes a CPU, a controller, and the like. Such a module, an input means 3406, and a buttery 3407 are combined and incorporated in a chassis 3409 and a chassis 3412. Note that a pixel portion of the display panel 3410 is disposed so that it can be seen from a window formed in the chassis 3412.

In the display panel 3410, the pixel portion and a part of peripheral driver circuits (a driver circuit having a low operation frequency among a plurality of driver circuits) may be formed over the same substrate using transistors, and another part of the peripheral driver circuits (a driver circuit having a high operation frequency among the plurality of driver circuits) may be formed on an IC chip. Then, the IC chip may be mounted on the display panel 3410 by COG (Chip On Glass). Alternatively, the IC chip may be connected to a glass substrate using TAB (Tape Automated Bonding) or a printed circuit board. Further, all of the peripheral driver circuits may be formed on an IC chip and the IC chip may be mounted on the display panel by COG or the like.

Note that the pixel shown in any of Embodiment Modes 1 to 7 can be used for the pixel portion. According to the invention, variations in luminance among pixels or fluctuations in luminance of a pixel over time can be suppressed. Thus, the display panel 3410 having a display portion with a higher duty ratio and higher quality can be obtained. In addition, power consumption can be reduced because the operation in the invention is performed with an opposite electrode fixed at a constant potential. Further, cost reduction can be achieved by using transistors with single polarity as the transistors included in the pixel portion and using a non-crystalline semiconductor film for semiconductor layers of the transistors.

The structure of a mobile phone shown in this embodiment mode is only exemplary, and the display device of the invention can be applied not only to the mobile phone having the aforementioned structure but also to mobile phones having various kinds of structures.

Embodiment Mode 12

In this embodiment mode, an EL module obtained by combining a display panel and a circuit board is described with reference to FIGS. 35 and 36.

Figure 35:
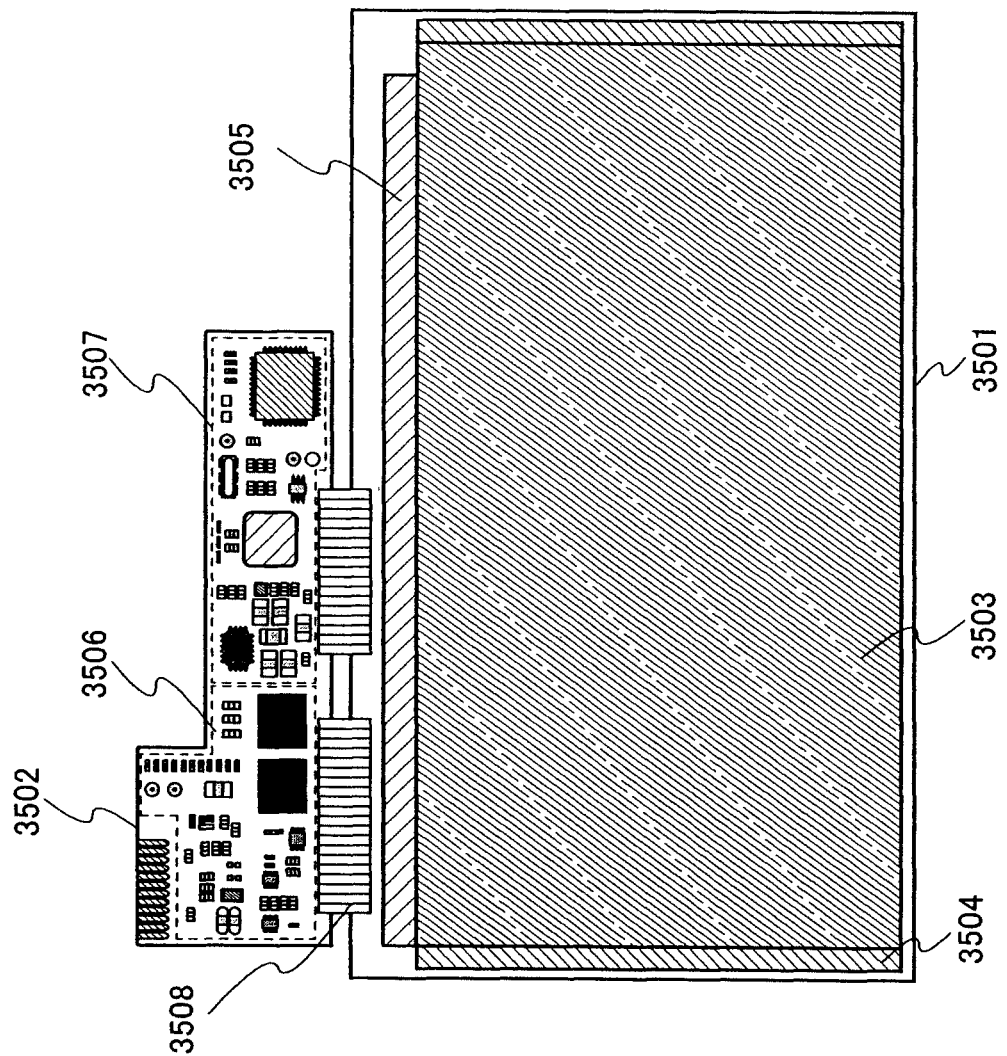
FIG. 35 shows an example of an EL module.
Figure 36:
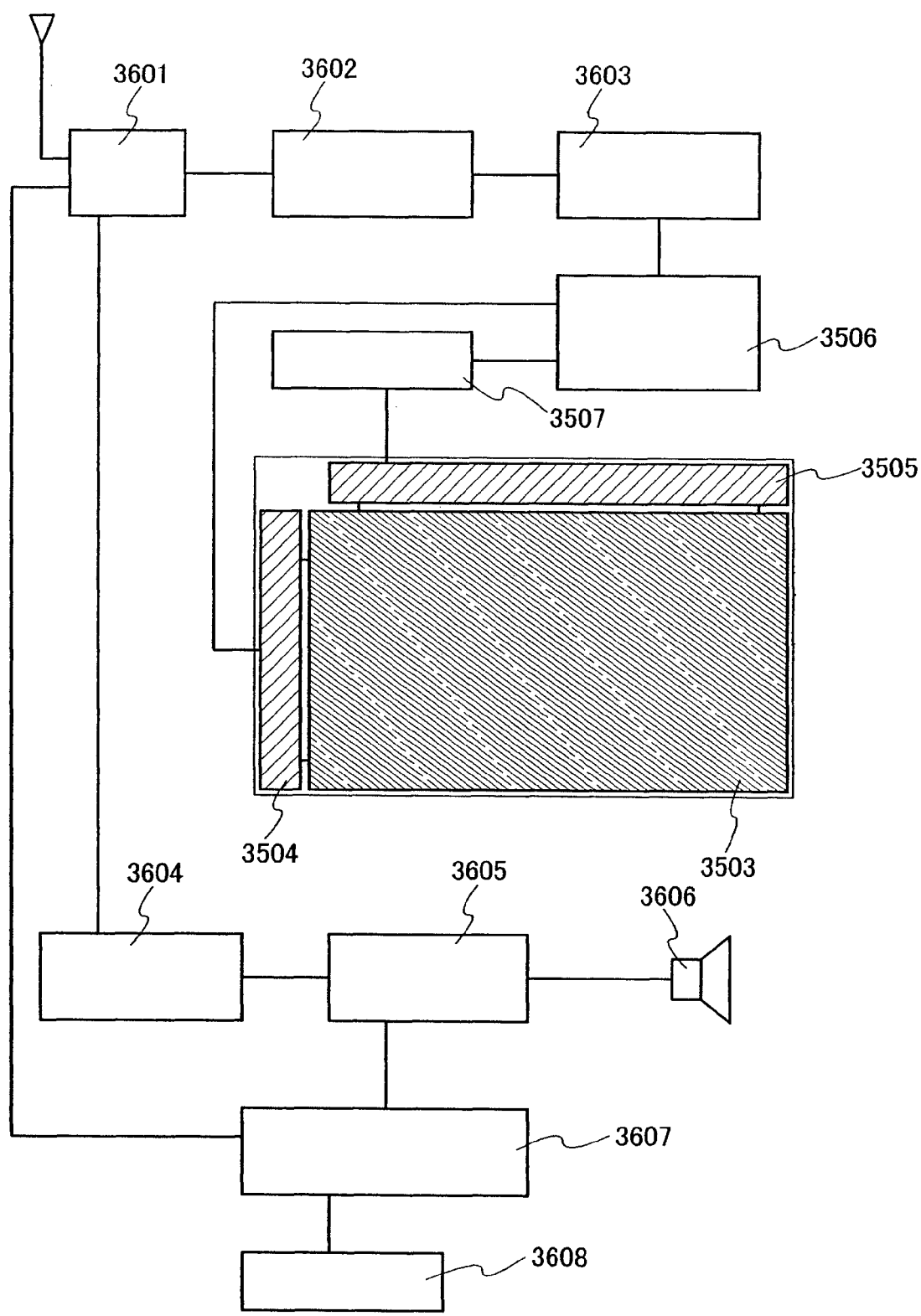
FIG. 36 is a block diagram showing the main configuration of an EL television receiver.

Referring to FIG. 35, a display panel 3501 includes a pixel portion 3503, a scan line driver circuit 3504, and a signal line driver circuit 3505. Over a circuit board 3502, a control circuit 3506, a signal dividing circuit 3507, and the like are formed, for example. Note that the display panel 3501 and the circuit board 3502 are connected to each other by a connection wiring 3508. As the connection wiring 3508, an FPC or the like can be used.

In the display panel 3501, the pixel portion and a part of peripheral driver circuits (a driver circuit having a low operation frequency among a plurality of driver circuits) may be formed using transistors over the same substrate, and another part of the peripheral driver circuits (a driver circuit having a high operation frequency among the plurality of driver circuits) may be formed on an IC chip. Then, the IC chip may be mounted on the display panel 3501 by COG (Chip On Glass). Alternatively, the IC chip may be connected to a glass substrate using TAB (Tape Automated Bonding) or a printed circuit board. Further, all of the peripheral driver circuits may be formed on an IC chip and the IC chip may be mounted on the display panel by COG or the like.

Note that the pixel shown in any of Embodiment Modes 1 to 7 can be used for the pixel portion. According to the invention, variations in luminance among pixels or fluctuations in luminance of a pixel over time can be suppressed. Thus, the display panel 3501 having a display portion with a higher duty ratio and higher quality can be obtained. In addition, power consumption can be reduced because the operation in the invention is performed with an opposite electrode fixed at a constant potential. Further, cost reduction can be achieved by using transistors with single polarity as the transistors included in the pixel portion and using a non-crystalline semiconductor film for semiconductor layers of the transistors.

An EL TV receiver can be completed with such an EL module. FIG. 36 is a block diagram showing the main configuration of an EL TV receiver. A tuner 3601 receives video signals and audio signals. A video signal is processed by a video signal amplifier circuit 3602, a video signal processing circuit 3603 which converts a signal output from the video signal amplifier circuit 3602 into a color signal corresponding to each color of red, green and blue, and a control circuit 3506 which converts the video signal into a signal which meets the input specification of a driver circuit. The control circuit 3506 outputs signals to each of the scan line side and the signal line side. In the case of performing a digital drive, it is possible to adopt a structure in which the signal dividing circuit 3507 is provided on the signal line side so that an input digital signal is divided into m pieces before being supplied to the pixel portion.

Among the signals received by the tuner 3601, audio signals are transmitted to an audio signal amplifier circuit 3604, and an output thereof is supplied to a speaker 3606 through an audio signal processing circuit 3605. A control circuit 3607 receives control data on a receiving station (reception frequency) or sound volume from an input portion 3608 and transmits signals to the tuner 3601 and the audio signal processing circuit 3605.

By incorporating the EL module in FIG. 35 into the chassis 3301 of FIG. 33A which is described in Embodiment Mode 9, a TV receiver can be completed.

Needless to say, the invention is not limited to the TV receiver, and can be applied to various uses particularly as a large-sized display medium such as an information display board at a train station, an airport, or the like, or an advertisement display board on the street, as well as a monitor of a personal computer.

This application is based on Japanese Patent Application serial no. 2005-349780 filed in Japan Patent Office on Dec. 2, 2005, the entire contents of which are hereby incorporated by reference.

EXPLANATION OF REFERENCE

110: transistor, 111: a first switch, 112: a second switch, 113: a third switch, 114: a fourth switch, 115: capacitor, 116: light emitting element, 117: signal line, 118: first scan line, 119: second scan line, 120: third scan line, 121: fourth scan line, 122: first potential supply line, 123: second potential supply line, 124: power supply line, 125: opposite electrode, 511: first switching transistor, 512: second switching transistor, 513: third switching transistor, 514: fourth switching transistor, 614: fourth switch, 714: fourth switch, 814: fourth switch, 911: signal line driver circuit, 912: scan line driver circuit, 913: pixel portion, 914: pixel, 1200: pixel, 1218: first scan line, 1300: pixel, 1319: second scan line, 1400: pixel, 1420: third scan line, 1500: pixel, 1521: fourth scan line, 1613: rectifier element, 1620: third scan line, 1651: Schottky-barrier diode, 1652: PIN diode, 1653: PN diode, 1654: transistor, 1655: transistor, 2910: transistor, 3010: transistor, 3101: transistor, 3102: transistor, 3103: fifth switch, 3104: sixth switch, 3111: first switch, 3112: second switch, 3113: third switch, 3114: fourth switch, 3115: capacitor, 3116: light emitting element, 3117: signal line, 3118: first scan line, 3119: second scan line, 3120: third scan line, 3121: fourth scan line, 3122: first potential supply line, 3123: second potential supply line, 3123: opposite electrode, 3124: power supply line, 3125: opposite electrode, 3910: transistor, 3911: first switch, 3912: second switch, 3913: third switch, 3914: fourth switch, 3915: capacitor, 3916: light emitting element, 3917: signal line, 3918: first scan line, 3919: second scan line, 3920: third scan line, 3921: fourth scan line, 3922: first potential supply line, 3923: second potential supply line, 3924: power supply line, 3925: opposite electrode, 4215: gate capacitance, 4240: pixel electrode, 4301: first switching transistor, 4302: second switching transistor, 4303: third switching transistor; 4310: conductive layer; 4311: conductive layer; 4312: conductive layer; 4313: conductive layer; 4314: wiring; 4315: conductive layer; 4316: conductive layer; 4317: wiring; 4318: conductive layer; 4319: conductive layer; 4320: conductive layer; 4321: conductive layer; 4322: conductive layer; 4323: wiring; 4324: wiring; 4333: semiconductor layer; 4334: semiconductor layer; 4335: semiconductor layer; 4336: semiconductor layer; 4344: pixel electrode; 4401: conductive layer; 4402: wiring; and 4422: first potential supply line.

The invention claimed is:

1. A semiconductor device comprising:
a transistor;
a first switch, wherein a gate of the transistor is electrically connected to a first terminal of the first switch;
a second switch, wherein the gate of the transistor is electrically connected to a first terminal of the second switch;
an electrode electrically connected to one of a source and a drain of the transistor;
a capacitor wherein a first terminal of the capacitor is electrically connected to the electrode and the one of the source and the drain of the transistor;
a third switch; and
a power supply line, wherein the other of the source and the drain of the transistor is electrically connected to the power supply line through the third switch,
wherein a second terminal of the capacitor is electrically connected to the gate of the transistor.

2. The semiconductor device according to claim 1 wherein the first switch is a second transistor and the first terminal of the first switch is one of a source and a drain of the second transistor, and wherein the second switch is a third transistor and the first terminal of the second switch is one of a source and a drain of the third transistor.

3. The semiconductor device according to claim 1, wherein the gate of the transistor is electrically connected to the second terminal of the capacitor.

4. The semiconductor device according to claim 1, wherein each of the first switch, the second switch, and the transistor is an N-channel transistor.

5. The semiconductor device according to claim 1, further comprising a fourth switch, wherein a first terminal of the fourth switch is electrically connected to the first terminal of the capacitor, the electrode, and the one of the source and the drain of the transistor, and wherein a second terminal of the fourth switch is electrically connected to a second wiring.

6. The semiconductor device according to claim 1, wherein the transistor has a multi-gate structure in which at least two transistors are connected in series.

7. The semiconductor device according to claim 1, wherein the electrode is an electrode of an EL element.

8. A semiconductor device comprising:
a first transistor;
a second transistor wherein a gate of the first transistor is electrically connected to a first terminal of the second transistor;
a third transistor wherein the gate of the first transistor is electrically connected to a first terminal of the third transistor;
a fourth transistor;
a fifth transistor;
a signal line electrically connected to a second terminal of the second transistor;
a first potential supply line electrically connected to a second terminal of the third transistor;
a second potential supply line;
a power supply line electrically connected to a first terminal of the fifth transistor;
an anode electrically connected to one of a source and a drain of the first transistor;
a cathode opposed to the anode with a light emitting layer therebetween; and
a capacitor,
wherein a first terminal of the capacitor is electrically connected to the anode and the one of the source and the drain of the first transistor,
wherein a second terminal of the capacitor is electrically connected to the gate of the first transistor,
wherein a second terminal of the fifth transistor is electrically connected to the other of the source and the drain of the first transistor,
wherein a first terminal of the fourth transistor is electrically connected to the first terminal of the capacitor, and
wherein a second terminal of the fourth transistor is electrically connected to the second potential supply line.

9. The semiconductor device according to claim 8, wherein each of the first to fifth transistors has a gate electrode formed over a channel formation region.

10. The semiconductor device according to claim 8, further comprising a sealing substrate over the cathode, wherein the semiconductor device is configured to emit light from the light emitting layer through the sealing substrate.

11. The semiconductor device according to claim 10, wherein the sealing substrate is provided with a color filter and the light emitting layer is capable of emitting white light.

12. The semiconductor device according to claim 8, wherein the first transistor has a multi-gate structure in which at least two transistors are connected in series.

13. The semiconductor device according to claim 8, wherein each of the first to fourth transistors is an N-channel transistor.

14. A display module comprising:
a display panel;
a circuit board; and
a flexible printed circuit,
wherein the display panel comprises:
a transistor;
a first switch, wherein a gate of the transistor is electrically connected to a first terminal of the first switch;
a second switch, wherein the gate of the transistor is electrically connected to a first terminal of the second switch;
an electrode electrically connected to one of a source and a drain of the transistor;
a capacitor wherein a first terminal of the capacitor is electrically connected to the electrode and the one of the source and the drain of the transistor;
a third switch; and
a power supply line, wherein the other of the source and the drain of the transistor is electrically connected to the power supply line through the third switch,
wherein a second terminal of the capacitor is electrically connected to the gate of the transistor.

15. The display module according to claim 14, wherein the first switch is a second transistor and the first terminal of the first switch is one of a source and a drain of the second transistor, and wherein the second switch is a third transistor and the first terminal of the second switch is one of a source and a drain of the third transistor.

16. The display module according to claim 14, wherein the gate of the transistor is electrically connected to the second terminal of the capacitor.

17. The display module according to claim 14, wherein each of the first switch, the second switch, and the transistor is an N-channel transistor.

18. The display module according to claim 14, further comprising a fourth switch, wherein a first terminal of the fourth switch is electrically connected to the first terminal of the capacitor, the electrode, and the one of the source and the drain of the transistor, and wherein a second terminal of the fourth switch is electrically connected to a second wiring.

19. The display module according to claim 14, wherein the transistor has a multi-gate structure in which at least two transistors are connected in series.

20. The display module according to claim 14, wherein the electrode is an electrode of an EL element.

21. A display module comprising:
a display panel;
a circuit board; and
a flexible printed circuit,
wherein the display panel comprises:
  a first transistor;
  a second transistor wherein a gate of the first transistor is electrically connected to a first terminal of the second transistor;
  a third transistor wherein the gate of the first transistor is electrically connected to a first terminal of the third transistor;
  a fourth transistor;
  a fifth transistor;
  a signal line electrically connected to a second terminal of the second transistor;
  a first potential supply line electrically connected to a second terminal of the third transistor;
  a second potential supply line;
  a power supply line electrically connected to a first terminal of the fifth transistor;
  an anode electrically connected to one of a source and a drain of the first transistor;
  a cathode opposed to the anode with a light emitting layer therebetween; and
  a capacitor,
wherein a first terminal of the capacitor is electrically connected to the anode and the one of the source and the drain of the first transistor,
wherein a second terminal of the capacitor is electrically connected to the gate of the first transistor,
wherein a second terminal of the fifth transistor is electrically connected to the other of the source and the drain of the first transistor,
wherein a first terminal of the fourth transistor is electrically connected to the first terminal of the capacitor, and
wherein a second terminal of the fourth transistor is electrically connected to the second potential supply line.

22. The display module according to claim 21, wherein each of the first to fifth transistors has a gate electrode formed over a channel formation region.

23. The display module according to claim 21, further comprising a sealing substrate over the cathode, wherein the display module is configured to emit light from the light emitting layer through the sealing substrate.

24. The display module according to claim 23, wherein the sealing substrate is provided with a color filter and the light emitting layer is capable of emitting white light.

25. The display module according to claim 21, wherein the first transistor has a multi-gate structure in which at least two transistors are connected in series.

26. The display module according to claim 21, wherein each of the first to fourth transistors is an N-channel transistor.

27. An electronic device comprising:
a housing;
a display panel;
a circuit board;
a flexible printed circuit; and
a battery,
wherein the display panel comprises:
  a transistor;
  a first switch, wherein a gate of the transistor is electrically connected to a first terminal of the first switch;
  a second switch, wherein the gate of the transistor is electrically connected to a first terminal of the second switch;
  an electrode electrically connected to one of a source and a drain of the transistor;
  a capacitor wherein a first terminal of the capacitor is electrically connected to the electrode and the one of the source and the drain of the transistor;
  a third switch; and
  a power supply line, wherein the other of the source and the drain of the transistor is electrically connected to the power supply line through the third switch,
wherein a second terminal of the capacitor is electrically connected to the gate of the transistor.

28. The electronic device according to claim 27, wherein the first switch is a second transistor and the first terminal of the first switch is one of a source and a drain of the second transistor, and wherein the second switch is a third transistor and the first terminal of the second switch is one of a source and a drain of the third transistor.

29. The electronic device according to claim 27, wherein the gate of the transistor is electrically connected to the second terminal of the capacitor.

30. The electronic device according to claim 27, wherein each of the first switch, the second switch, and the transistor is an N-channel transistor.

31. The electronic device according to claim 27, further comprising a fourth switch, wherein a first terminal of the fourth switch is electrically connected to the first terminal of the capacitor, the electrode, and the one of the source and the drain of the transistor, and wherein a second terminal of the fourth switch is electrically connected to a second wiring.

32. The electronic device according to claim 27, wherein the transistor has a multi-gate structure in which at least two transistors are connected in series.

33. The electronic device according to claim 27, wherein the electrode is an electrode of an EL element.

34. The electronic device according to claim 27, wherein the electronic device is selected from the group consisting of a video camera, a digital camera, a goggle display, a navigation system, an audio-reproducing device, a computer, a game machine, a portable information terminal, a mobile computer, a mobile phone, a portable game machine, an electronic book, and an image-reproducing device having a recording medium.

35. An electronic device comprising:
a housing;
a display panel;
a circuit board;
a flexible printed circuit; and
a battery,
wherein the display panel comprises:
  a first transistor;
  a second transistor wherein a gate of the first transistor is electrically connected to a first terminal of the second transistor;
  a third transistor wherein the gate of the first transistor is electrically connected to a first terminal of the third transistor;
  a fourth transistor;
  a fifth transistor;
  a signal line electrically connected to a second terminal of the second transistor;

a first potential supply line electrically connected to a second terminal of the third transistor;
a second potential supply line;
a power supply line electrically connected to a first terminal of the fifth transistor;
an anode electrically connected to one of a source and a drain of the first transistor;
a cathode opposed to the anode with a light emitting layer therebetween; and
a capacitor,
wherein a first terminal of the capacitor is electrically connected to the anode and the one of the source and the drain of the first transistor,
wherein a second terminal of the capacitor is electrically connected to the gate of the first transistor,
wherein a second terminal of the fifth transistor is electrically connected to the other of the source and the drain of the first transistor,
wherein a first terminal of the fourth transistor is electrically connected to the first terminal of the capacitor, and
wherein a second terminal of the fourth transistor is electrically connected to the second potential supply line.

36. The electronic device according to claim 35, wherein each of the first to fifth transistors has a gate electrode formed over a channel formation region.

37. The electronic device according to claim 35, further comprising a sealing substrate over the cathode, wherein the electronic device is configured to emit light from the light emitting layer through the sealing substrate.

38. The electronic device according to claim 37, wherein the sealing substrate is provided with a color filter and the light emitting layer is capable of emitting white light.

39. The electronic device according to claim 35, wherein the first transistor has a multi-gate structure in which at least two transistors are connected in series.

40. The electronic device according to claim 35, wherein each of the first to fourth transistors is an N-channel transistor.

41. The electronic device according to claim 35, wherein the electronic device is selected from the group consisting of a video camera, a digital camera, a goggle display, a navigation system, an audio-reproducing device, a computer, a game machine, a portable information terminal, a mobile computer, a mobile phone, a portable game machine, an electronic book, and an image-reproducing device having a recording medium.

* * * * *